US009286949B2

(12) United States Patent
Takahashi

(10) Patent No.: US 9,286,949 B2
(45) Date of Patent: Mar. 15, 2016

(54) SEMICONDUCTOR MEMORY

(71) Applicant: Renesas Electronics Corporation, Kawasaki-shi (JP)

(72) Inventor: Hiroyuki Takahashi, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/303,462

(22) Filed: Jun. 12, 2014

(65) Prior Publication Data

US 2015/0023087 A1 Jan. 22, 2015

(30) Foreign Application Priority Data

Jul. 18, 2013 (JP) .................................. 2013-149324

(51) Int. Cl.
| G11C 7/00 | (2006.01) |
| G11C 5/06 | (2006.01) |
| G11C 11/4091 | (2006.01) |
| G11C 11/419 | (2006.01) |
| G11C 11/4094 | (2006.01) |
| G11C 7/12 | (2006.01) |
| G11C 11/4097 | (2006.01) |

(52) U.S. Cl.
CPC .............. *G11C 5/06* (2013.01); *G11C 11/4091* (2013.01); *G11C 11/4094* (2013.01); *G11C 11/419* (2013.01); *G11C 7/12* (2013.01); *G11C 11/4097* (2013.01); *G11C 2207/005* (2013.01)

(58) Field of Classification Search
CPC .............. G11C 5/06; G11C 7/06; G11C 7/12; G11C 11/419; G11C 11/4094; G11C 11/4097; G11C 2207/005
USPC ............... 365/72, 189.15, 190, 203, 205, 207
See application file for complete search history.

(56) References Cited

U.S. PATENT DOCUMENTS

| 5,636,158 A | 6/1997 | Kato et al. |
| 5,754,478 A * | 5/1998 | Morgan et al. ............ 365/189.16 |
| 6,094,390 A * | 7/2000 | Inaba et al. .................... 365/203 |
| 6,687,175 B1 * | 2/2004 | Mizuno et al. ................. 365/203 |
| 7,558,134 B2 * | 7/2009 | Kitagawa .................. G11C 7/12 365/149 |
| 2014/0104971 A1* | 4/2014 | Takahashi et al. ............ 365/203 |

FOREIGN PATENT DOCUMENTS

JP 8-279602 A 10/1996

* cited by examiner

*Primary Examiner* — Tan T. Nguyen
(74) *Attorney, Agent, or Firm* — McGinn IP Law Group, PLLC

(57) ABSTRACT

A semiconductor memory includes a memory cell array having a plurality of memory cells, a plurality of bit line pairs which are disposed corresponding to respective columns of the memory cell array, and a sense amplifiers which are disposed in plurality corresponding to the plurality of bit line pairs for amplifying a potential difference between the bit line pair, in which the sense amplifier has precharging transistors each having a diffusion layer and precharging the bit line pair, and switching transistors having a diffusion layer formed integrally with the diffusion layer of the precharging transistors for selectively connecting the plurality of bit line pairs to a common bus line.

16 Claims, 33 Drawing Sheets

SEMICONDUCTOR MEMORY

CROSS-REFERENCE TO RELATED APPLICATIONS

The disclosure of Japanese Patent Application No. 2013-149324 filed on Jul. 18, 2013 including the specification, drawings, and abstract is incorporated herein by reference in its entirety.

BACKGROUND

The present invention relates to a semiconductor memory.

Japanese Unexamined Patent Application Publication No. Hei8(1996)-279602 discloses a semiconductor memory device. The semiconductor memory device in the publication has memory cells, but line pairs, sense amplifiers, and column switches. The sense amplifiers and the column switches are laid out at a pitch less than twice the pitch of the bit line pair.

SUMMARY

In a semiconductor memory, further area reduction is demanded.

Other subjects and novel features will become apparent by the description of the present specification and the appended drawings.

In a preferred embodiment of a semiconductor memory, a diffusion layer is in common with a switching transistor and a precharging transistor, or a pitch of a sense amplifier and a pitch of a precharge portion and a Y switch portion are different.

According to the preferred embodiment, a circuit area can be reduced.

DETAILED DESCRIPTION

Figure 1:
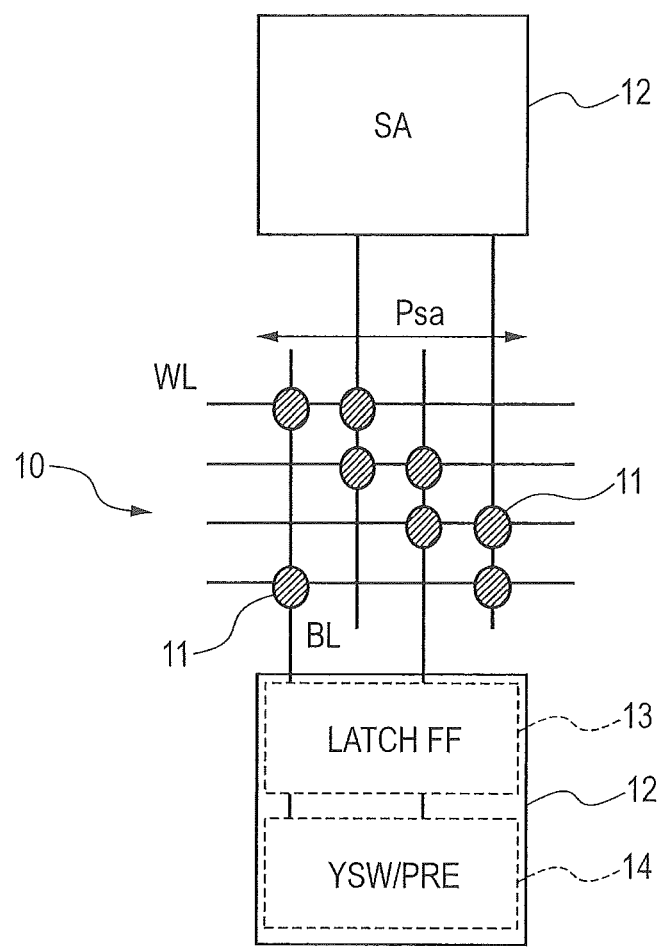
FIG. 1 is a view schematically illustrating a configuration of a semiconductor memory.

For the sake of clarifying explanations, the following descriptions and the drawings are optionally omitted and simplified. In each of the drawings, identical elements carry same reference numerals, and duplicate description is optionally omitted.

A sense amplifier (hereinafter also referred to as SA) of dynamic random access memory (DRAM) is a region having a large area ratio next to a memory cell and area reduction is strongly desired for the portion in order to reduce the cost. However, along with area reduction of the memory cell in recent years, since the pitch of arranging SA has been narrowed, it has become difficult to reduce the height of SA. Further, it has been developed memories coping with requirement intending to increase the operation speed of random access such as DRAM, low latency DRAM (LLDRAM), reduced latency DRAM (RLDRAM), etc. Bit lines are shortened in them for increasing the operation speed and the ratio of the SA region tends to increase further.

On the other hand, refinement of recent logic products such as microcontroller (MCU) and system large-scale integration (LSI) has been progressed. Refinement is mainly contemplated for area reduction and improvement of performance of MOS transistors as basic devices that constitute logic circuits. Reduction of area and improvement of performance include the following trend of techniques (1) to (4).

(1) A transistor structure is reduced in the size in a longitudinal direction of a gate, for example, between contacts, between diffusion layers, and between adjacent gates as viewed from the gate. (2) Resistance is lowered over the entire diffusion layer by a salicide technique of metallizing the surface of a diffusion layer of source and drain, thereby decreasing the number of contacts. (3) The transistor performance is enhanced by decreasing a gate length L and improving the device structure also in a trend of lowering a power source voltage thereby enabling to decrease the gate width W. (4) Refinement and improvement of performance of the transistor have been focused on a device of a linear gate shape as a standard shape.

As a method of forming a transistor, various techniques such as embedding in a substrate and three-dimensional steric shape have been developed and put to practical use. However, transistors of a memory cell have a condition of extremely avoiding leak current. On the other hand, since the condition of enhancement of the switching performance is the highest priority in logic transistors, different transistor techniques have tended to be combined. Then, the SA region in which the layout pitch is limited in view of the memory cell size is designed for layout on the device standard of the logic transistor.

In view of the trend of the device technique, the reduction ratio of the memory cell and SA does not sometimes show a constant trend on every generation. This is remarkable particularly in the logic-incorporated DRAM and such trend is generalized also in general-purpose DRAM. This embodiment can provide an optimum reduction technique for SA layout with a new view point taking such a situation into consideration.

(Configuration of Memory Cell Pitch and Sense Amplifier)

A semiconductor memory according to this embodiment has a memory cell array and a sense amplifier. A relation between a sense amplifier pitch (hereinafter referred to as SA pitch) of a sense amplifier and a memory cell is to be described with reference to FIG. 1. FIG. 1 is a view schematically illustrating a configuration of a semiconductor memory, which shows a folded type memory cell. While the semiconductor memory is described as DRAM, this is not always restricted to DRAM. For example, the semiconductor memory may also be static random access memory (SRAM).

As illustrated in FIG. 1, a semiconductor memory has a memory cell array 10 and a sense amplifier 12. The memory cell array 10 has a plurality of memory cells 11, a plurality of word lines WL, and a plurality of bit lines BL. A plurality of memory cells 11 are arranged in a matrix. The plurality of word lines WL are disposed corresponding to respective rows of the memory cell array 10. The word lines WL are formed along the lateral direction (right to left direction) of the drawing. The plurality of bit lines BL are provided corresponding to respective columns of the memory cell array 10. The bit lines BL are formed along vertical direction (longitudinal direction) of the drawing. The sense amplifier 12 detects information stored in the memory cell 11 by way of the bit line BL. The sense amplifier 12 detects information in accordance with a potential difference between a pair of bit lines BL.

In this embodiment, two sense amplifiers 12 are provided to four bit lines BL. The sense amplifiers 12 are arranged to upper and lower ends of the memory cell array 10. Accordingly, one sense amplifier 12 is disposed to a bit line pair having a pair of bit lines BL.

When one of the four word lines WL is selected, one of each of upper and lower bit line pairs is connected to the memory cell 11 and the other of them is at a reference potential. Then, the sense amplifier 12 amplifies the potential difference between the bit line pair.

The sense amplifier 12 has latch FF 13 and a YSW (Y switch portion)/PRE (precharge portion) portion 14. The latch FF 13 has latch type flip-flop transistors that amplify the voltage on the bit line BL to VDD (power source voltage) and GND (ground). The YSW/PRE portion 14 has a column selection switch YSW connected to an external data bus line and a precharge portion PRE for setting the bit line to a precharge voltage HVDD in an initial state. The precharge voltage HVDD is, for example, VDD/2.

The width of the sense amplifier 12 in the direction of the word line WL, that is, in the lateral direction of the drawing is defined as a SA pitch Psa. The SA pitch is a width corresponding to the four bit lines BL, that is, a width corresponding to four memory cells 11. Assuming the ratio of the number of the bit lines or the number of memory cells to the SA pitch Psa as n (n is an integer of 2 or greater), n=4 in FIG. 1. That is, the SA pitch Psa is n times as large as the pitch of the memory cell 11.

Figure 2:
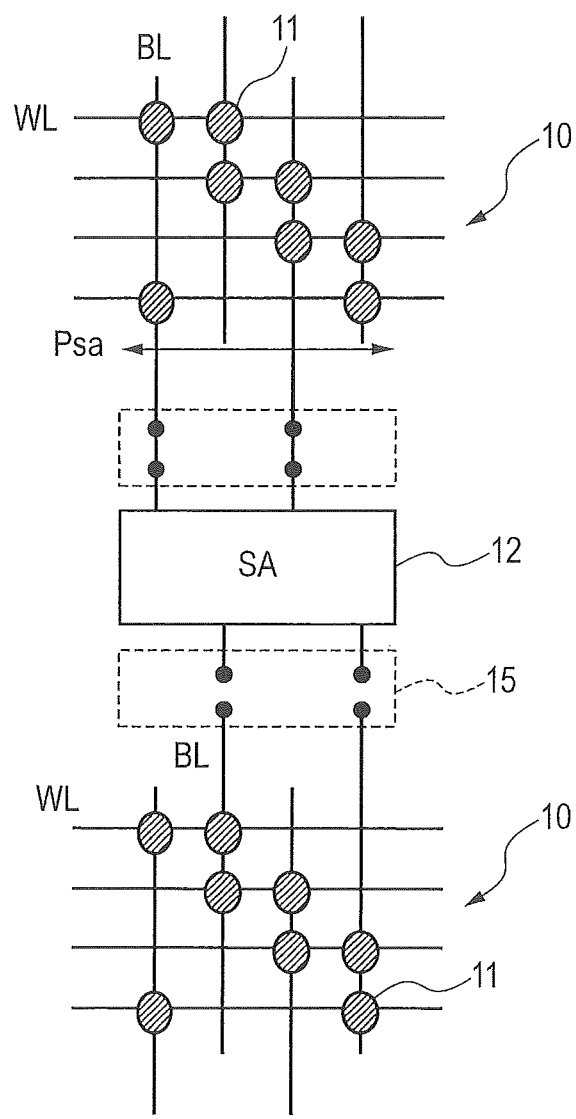
FIG. 2 is a view schematically illustrating a configuration of a semiconductor memory.
Figure 3:
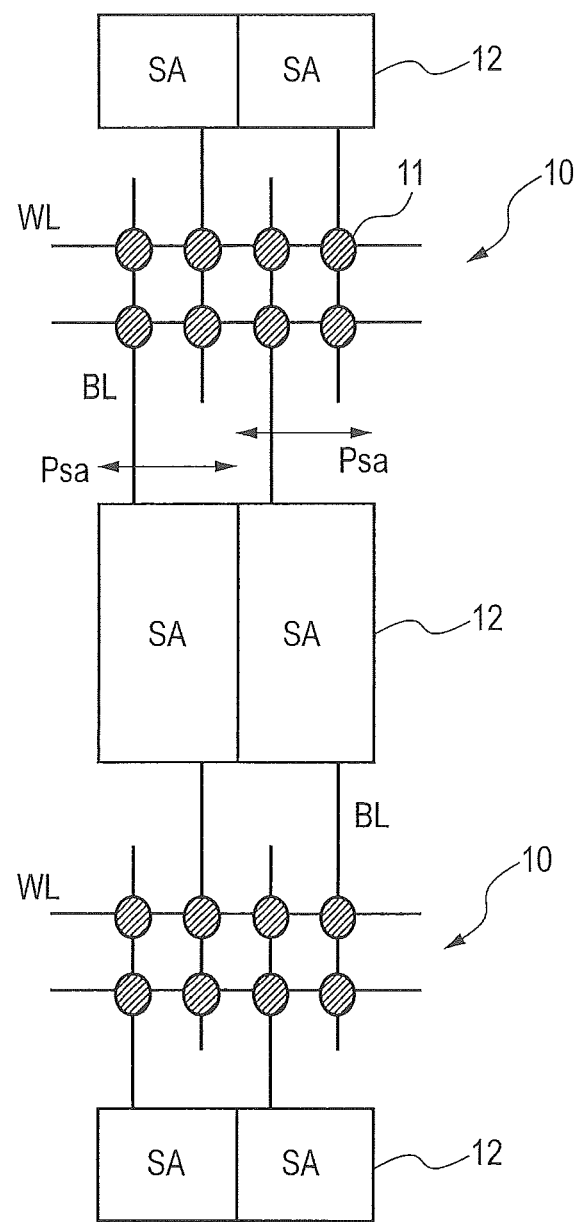
FIG. 3 is a view schematically illustrating a configuration of a semiconductor memory.
Figure 4:
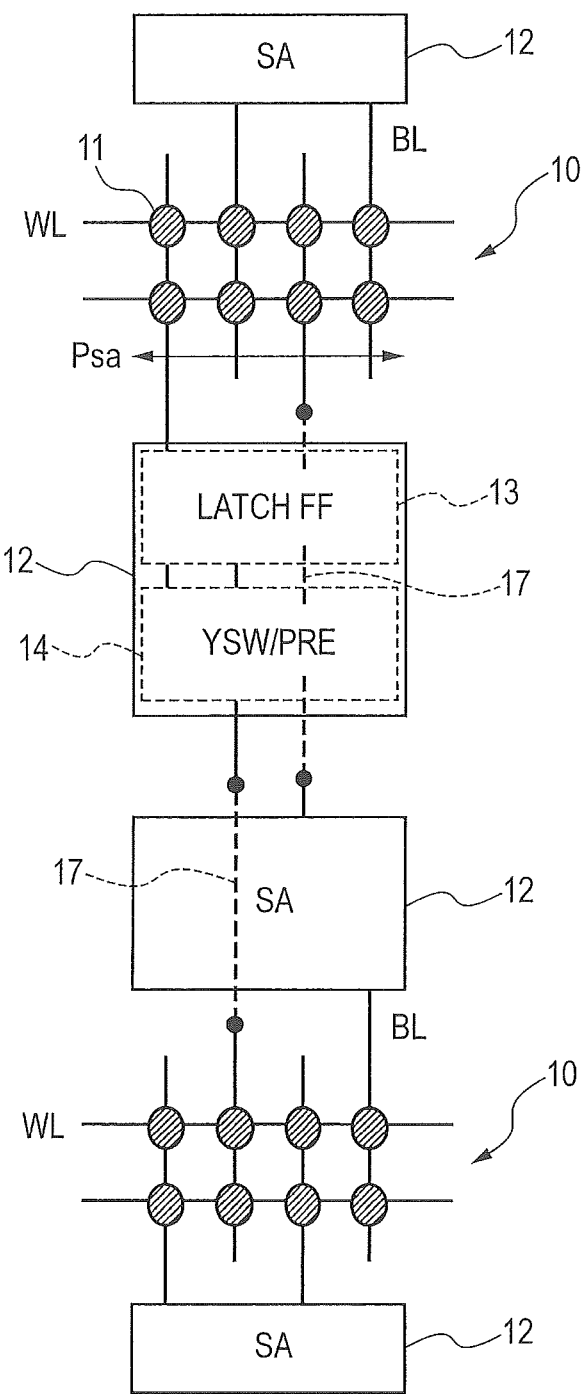
FIG. 4 is a view schematically illustrating a configuration of a semiconductor memory.

FIG. 2 to FIG. 4 illustrate other configurations of the memory cells. FIG. 2 is a view illustrating a configuration of a type in which the sense amplifier 12 is shared by disposing a transmission switch 15. Memory cell arrays 10 are provided above and below the sense amplifier 12. The transmission switch 15 is disposed between the sense amplifier 12 and the memory cell array 10. The transmission switches 15 disposed above and below the sense amplifier 12 are selectively turned to ON/OFF. Thus, one of the memory cell arrays 10 is connected to the sense amplifier 12.

FIG. 2 illustrates a state in which the upper memory cell 10 is connected to the sense amplifier 12. A precharge device PRE is sometimes disposed on the side of the bit line BL that is outside of the transmission switch 15. In FIG. 2, four bit lines BL correspond to one sense amplifier 12 and n=4. That is, the SA pitch Psa is n times as large as the pitch of the memory cell 11. Thus, the SA pitch Psa is defined as an integer multiple of the pitch of the memory cell 11.

FIG. 3 illustrates an open bit type memory cell configuration. Sense amplifiers 12 are disposed above and below the memory cell array 10. One sense amplifier 12 is connected to the upper memory cell 11 and the lower memory cell 11. Among the four bit lines BL of the memory cell array 10, two bit lines are connected to the upper sense amplifier 12 and other two bit lines are connected to the lower sense amplifiers 12. When the bit line BL of the memory cell array 10 disposed above the sense amplifier 12 is connected to the memory cell 11, the bit line BL of the memory cell array 10 disposed below the sense amplifier 12 is at a reference potential. Alternatively, when the bit line BL of the memory cell array 10 disposed below the sense amplifier 12 is connected to the memory cell 11 by the selection of the word line, the bit line BL of the memory cell array 10 disposed above the sense amplifier 12 is at the reference potential.

When the word line WL is selected, since the two bit lines BL are connected to the memory cell 11, the bit line BL from the memory cell 11 on the not-selected side serves as a reference potential. In FIG. 3, two bit lines BL correspond to one sense amplifier 12 and n=2. That is, the SA pitch Psa is defined as an integer multiple of the pitch of the memory cell 11.

FIG. 4 illustrates an open bit configuration used in a case where the sense amplifier 12 cannot be disposed to the pitch of two bit lines BL. The sense amplifiers are disposed in a two stage configuration to four bit lines BL. That is, two sense amplifiers 12 are disposed in upper and lower two stages between two memory cells 10 adjacent in a vertical direction. A pass interconnect 17 passes the sense amplifier 12 adjacent to the memory cell array 10. Then, the sense amplifier 12 at the second stage is connected by way of the pass interconnect 17 to the bit line BL. In this case, the sense amplifier can be in a state identical with that in FIG. 2. That is, in FIG. 4, four bit lines BL correspond to one sense amplifier 12 and n=4. The configuration illustrated in FIG. 4 is disclosed in Japanese Unexamined Patent Application Publication No. Hei7(1995)-254650. Further, other configuration is disclosed in Japanese Unexamined Patent Application Publication No. 2001-266569. In this Publication, a plurality of SA are disposed each being displaced slightly for intervening other circuit (device) in the SA column. However, the concept is identical in that the SA pitch Psa is n times as large as the pitch of the bit line.

As illustrated in FIG. 1 to FIG. 4, various layouts are present for the sense amplifier 12. However, a basic idea that the SA pitch Psa is an integer multiple of the memory cell 11 in view of the period of the bit line BL is unchanged. In an actual DRAM, the ratio is often n=4. Then, DRAM is configured by repeating identical layouts.

(Circuit Diagram of Sense Amplifier)

Figure 5:
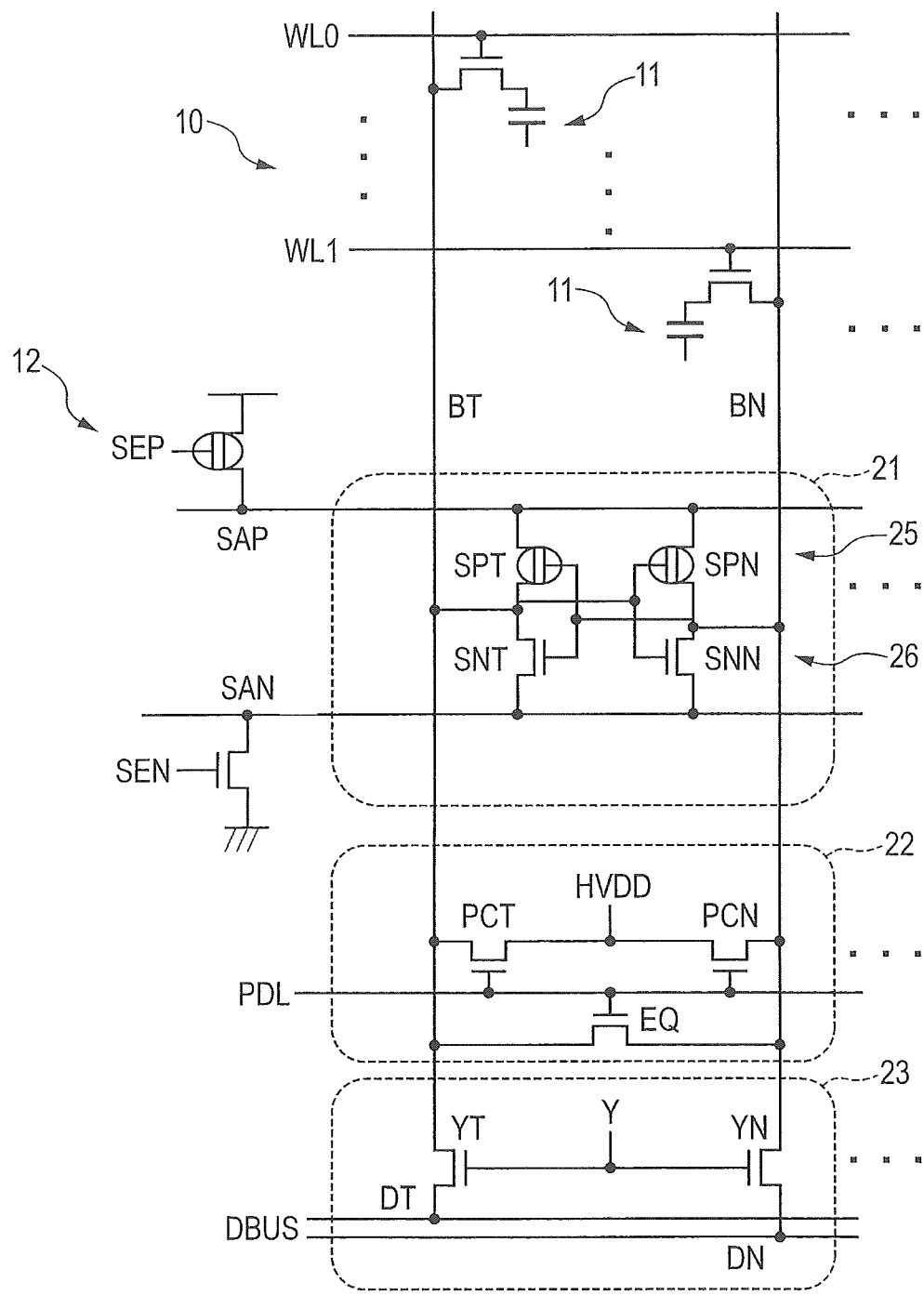
FIG. 5 is a view illustrating a circuit diagram of a sense amplifier.

Then, the circuit of the sense amplifier 12 is to be described with reference to FIG. 5. FIG. 5 is a circuit diagram illustrating a usual sense amplifier 12 and a memory cell array 10. FIG. 5 illustrates a circuitry of a sense amplifier 12 corresponding to a pair of bit lines. Accordingly, the memory cell array 10 and the sense amplifier 12 illustrated in FIG. 5 are arranged repeatedly in a DRAM. That is, a plurality of memory cell arrays 10 and a sense amplifier 12 are juxtaposed in a lateral direction.

As described above, the memory cell array 10 has a plurality of memory cells 11, and word lines WL and bit lines BT connected to the plurality of memory cells 11. FIG. 5 illustrates two memory cells 11, two word lines WL0 and WL1, and two bit lines BT and BN. The two bit lines BT and BN are a bit line pair for reading information of one memory cell 11. For example, when the word line WL0 is selected, the bit line BT is connected to the memory cell 11 and the bit line BN is a reference potential line for the sense amplifier 12. Thus, the bit lines BT and BN are paired to read out data.

The sense amplifier 12 has an amplifier portion 21, a precharge portion 22, and a Y switch portion 23. The amplifier portion 21 is a region provided with a circuit corresponding to the latch FF 13 illustrated in FIG. 1 to FIG. 4. The amplifier portion 21 has a PMOS pair 25 and an NMOS pair 26. The PMOS pair 25 has an amplifying PMOS transistor SPT and an amplifying PMOS transistor SPN. The NMOS pair 26 has an amplifying NMOS transistor SNT and an amplifying NMOS transistor SNN. Thus, the amplifier portion 21 comprises a flip-flop having two pairs i.e., the PMOS pair 25 and the NMOS pair 26.

Sources of the amplifying PMOS transistors SPT and SPN are connected to a common source line SAP. Sources of the amplifying NMOS transistors SNT and SNN are connected to a common source line SAN. The drain of the amplifying PMOS transistor SPT and the drain of the amplifying NMOS transistor SNT are connected to the bit line BT. The gate of the amplifying PMOS transistor SPT and the gate of the amplifying NMOS transistor SNT are connected to the bit line BN. The drain of the amplifying PMOS transistor SPN and the drain of the amplifying NMOS transistor SNN are connected to the bit line BN. The gate of the amplifying PMOS transistor SPN and the gate of the amplifying NMOS transistor SNN are connected to the bit line BT. The common source line SAP is connected by way of a transistor SEP to a power source voltage VDD. The common source line SAN is connected by way of a transistor SEN to the ground. When the transistors SEP and SEN drive each of the common source lines SAP and SAN, the amplifier portion 21 performs amplifying operation.

The precharge portion 22 performs precharging before amplifying operation. The precharge portion 22 corresponds to a region provided with the precharge portion PRE illustrated in FIG. 1 to FIG. 4. The precharge portion 22 has precharging transistors PCT and PCN which are NMOS transistors, and an equalizing transistor EQ. A precharge signal line PDL is connected to the gates of the precharging transistors PCT and PCN and the equalizing transistor EC. In the precharging state before the amplifying operation, a precharge signal is supplied to the precharge signal PDL. The precharging transistors PCT and PCN are potential fixed transistors for fixing a potential to a precharging potential. The equalizing transistor EQ is a transistor for equalizing the bit line pair.

When the precharge signal is supplied, the precharging transistors PCT and PCN and the equalizing transistor EQ are turned ON. When the precharging transistor PCT is turned ON, the bit line BL is set to a precharge voltage HVDD. When the precharging transistor is turned ON, the bit line BL is set to a precharge voltage HVDD. The precharge voltage HVDD is, for example, a voltage one-half of the power source voltage VDD. The equalizing transistor EQ is disposed between the bit line BT and the bit line BN. When the equalizing transistor EQ is tuned ON, the bit line BT and the bit lien BN are connected. That is, the equalizing transistor EQ equalizes the bit line pair BT and BN by the precharge signal. Thus, precharging operation is performed by three precharging transistors PCT and PCN and the equalizing transistor EQ.

The Y switch portion 23 selects a column. That is, the Y switch portion 23 corresponds to a region provided with the column selection switch YSW illustrated in FIG. 1 to FIG. 4. The Y switch portion 23 selects a sense amplifier 12 to be connected to a common bus line DBUS from the sense amplifiers 12 continuously disposed in plurality. The Y switch portion 23 selectively connects multiple bit line pairs to the common bus line DBUS.

The Y switch portion 23 has switching transistors YT and YN as an NMOS transistor pair. The common bus line DBUS has a common bus line DT and a common bus line DN. The switching transistor YT is interposed between the bit line BT and the common bus line DT. The switching transistor YN is interposed between the bit line BN and the common bus line DN. A column selection signal Y is inputted to the gates of the switching transistors YT and YN. The column selection signal is supplied by way of the column selection signal line Y to the gates of the switching transistors YT and YN.

The switching transistors YT and YN are turned ON by the column selection signal on the column selection signal line Y. When the switching transistor YT is turned ON, the bit line BT is connected to the common bus line DT. When the switching transistor YN is turned ON, the bit line BN is connected to the common bus line DN. For example, when the Y switch portion 23 connects the bit line BT and BN to the common bus lines DT and DN upon reading, a bit line signal amplified by the amplifier portion 21 is supplied to the common bus line DBUS. Upon writing, the Y switch portion 23 transmits write information from the common bus line DBUS to the bit lines BT and the BN. By the combination of selection by the word line WL and column selection by the Y switch portion 23, address can be selected from the memory matrix. The circuitry illustrated in FIG. 5 is an example of the sense amplifier 12 and a sense amplifier 12 of a different circuitry may also be used.

(2-Dimensional Layout of a Usual Sense Amplifier)

Figure 6:
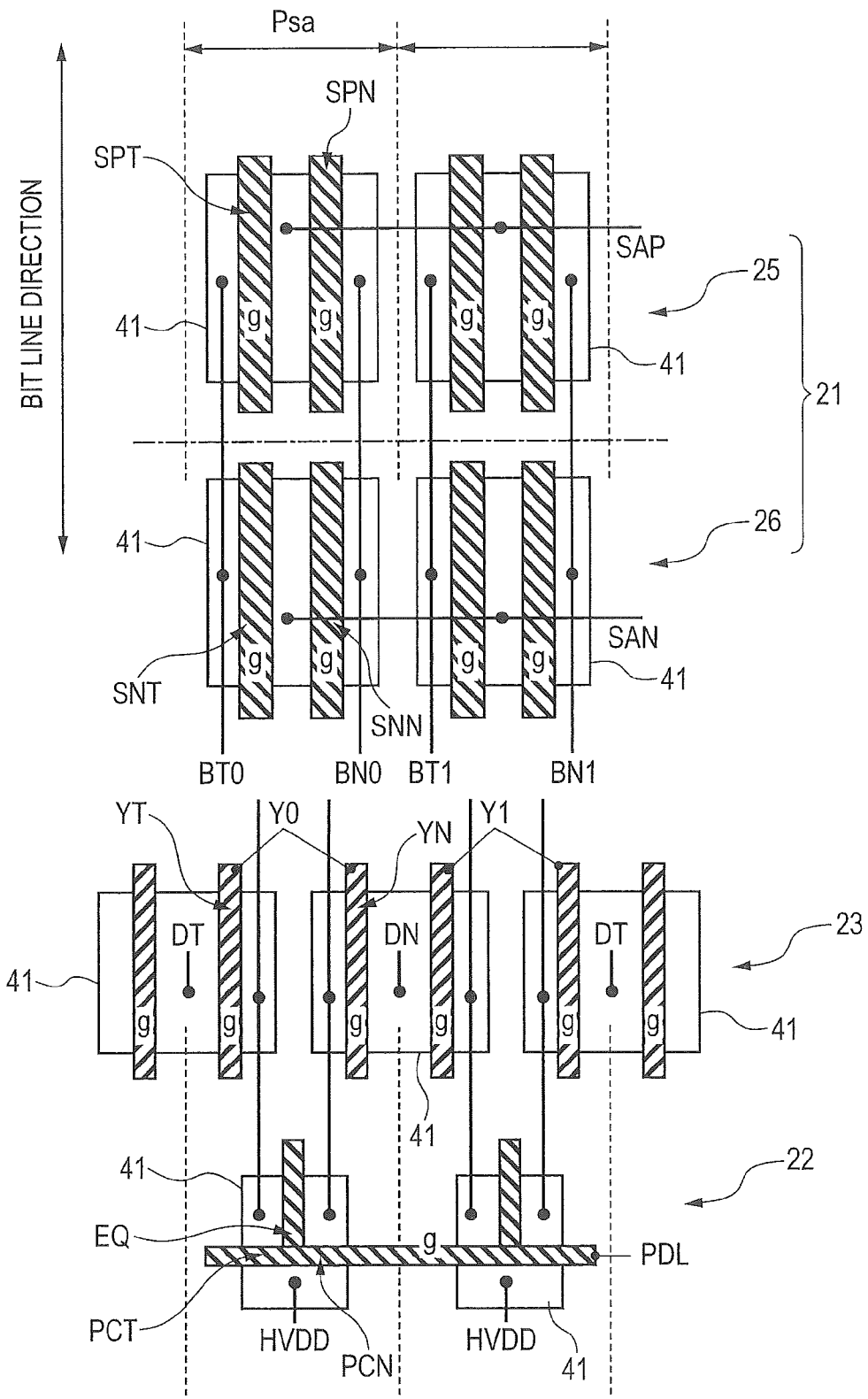
FIG. 6 is a layout view illustrating a usual sense amplifier

FIG. 6 is a layout view illustrating an example of an arrangement of transistors in a usual sense amplifier 12. FIG. 6 illustrates two adjacent sense amplifiers 12. In FIG. 6, a vertical direction (longitudinal direction) in the drawing is a bit line direction. In the following description for the layout, a direction perpendicular to the bit line direction is defined as a lateral direction. The lateral direction is a word line direction. In SA, each of the transistors has a diffusion layer 41 and a gate g. The gate g of each of the transistors is disposed so as to override the diffusion layer 41. In each of the transistors, a diffusion layer 41 on both sides of the gate g becomes source and drain. That is, each of the transistors is formed within the diffusion layer 41.

Two sense amplifiers 12 are juxtaposed in the lateral direction. In this example, the bit lines BT and BN of the sense amplifier 12 on the left are bit lines BT0 and BN0 respectively, and the bit lines BT and BN of the sense amplifier 12 on the right are bit lines BT1 and BN1 respectively. The bit lines BT0 and BN0 form a bit line pair. The bit lines BT1 and BN1 form a bit line pair. Further, the column selection signal line Y also includes column selection signal lines Y0 and Y1 in the same manner. The column selection signal lines Y0 and Y1 show column address to be selected.

A PMOS pair 25 is disposed in the SA pitch Psa. The PMOS pair 25 has two gates g. One of the two gates g corresponds to the amplifying PMOS transistor SPT and the other of them corresponds to the amplifying PMOS transistor SPN. The two gates g are disposed in the bit line direction. That is, the longitudinal direction of the gates g of the amplifying PMOS transistors SPT and SPN is along the bit line direction. The channel width direction of the amplifying PMOS transistors SPT and SPN is along the bit line direction. The amplifying PMOS transistor SPT and the amplifying PMOS transistor SPN share the diffusion layer 41. That is, the gate g of the amplifying PMOS transistor SPT and the gate g of the amplifying PMOS transistor SPN are disposed so as to override the integrally formed diffusion layer 41. A common source line SAP is connected to the diffusion layer 41 between two gates g of a linear shape. Accordingly, the amplifying PMOS transistor SPT and the amplifying PMOS transistor SPN share the diffusion layer 41 on the side of the common source line SAP.

In the same manner, an NMOS pair 26 is disposed in the SA pitch Psa. Two gates g are provided for the NMOS transistor 26. One of the two gates g corresponds to the amplifying NMOS transistor SNT and the other of them corresponds to the amplifying NMOS transistor SNN. The two gates g are disposed in the bit line direction. That is, the longitudinal direction of the gates g of the amplifying NMOS transistors SNT and SNN is along the bit line direction. Then, the channel width direction of the amplifying NMOS transistor SNT and SNN is along the bit line direction. The amplifying NMOS transistor SNP and the amplifying NMOS transistor SNN share the diffusion layer 41. That is, the gate g of the amplifying NMOS transistor SNT and the gate g of the amplifying NMOS transistor SNN are disposed so as to override the integrally formed diffusion layer 41. A common source line SAN is connected to the diffusion layer 41 between the two linear shape gates g. Accordingly, the amplifying NMOS transistor SNT and the amplifying NMOS transistor SNN share the diffusion layer 41 on the side of the common source line SAN. The transistor layout is identical between the PMOS pair 25 and the NMOS pair 26 in each of the SA pitches.

In the same manner, NMOS pair of the Y switch portion 23 is disposed in the SA pitch Psa. Two gates g are disposed in the SA pitch Psa. One of the two gates g corresponds to the switching transistor YT and the other of them corresponds to the switching transistor YN. The two gates g are disposed in the bit line direction. That is, the longitudinal direction of the gates g of the switching transistors YT and YN is along the bit line direction. Then, the channel width direction of the switching transistors YT and YN is along the bit line direction. In the two adjacent SA, the switching transistors YN share the diffusion layer 41. In two adjacent SA, the switching transistors YT share the diffusion layer 41.

The PMOS pair 25, the NMOS pair 26, and the Y switch portion 23 are juxtaposed in the bit line direction. That is, the NMOS pair 26 is interposed between the PMOS pair 25 and the Y switch portion in the bit line direction (vertical direction). Further, a precharge portion 22 is disposed below the Y switch portion 23. Accordingly, in FIG. 6, the PMOS pair 25, the NMOS pair 26, the Y switch portion 23, and the precharge portion 22 are disposed in this order from above. Three precharging transistors PCT, PCN, and EQ included in the precharge portion 22 are modified transistors using a T-shaped gate g. The precharging transistors PCT and PCN, and EQ share the diffusion layer 41.

(Concept of Sense Amplifier Configuration)

The concept of the SA layout according to the embodiment of the invention is to be described. For the amplifier portion 21 in which the SA pitch Psa is n times the bit line BL, a layout of a repeating pitch twice or one-half of n is adopted in other circuit regions. This can promote integration of the precharge portion 22 and the Y switch portion 23 constituting the inside of SA and adjacent SA. Accordingly, efficient layout is possible and the SA height can be reduced. The SA height means a size in the longitudinal direction of SA, that is, in the bit line direction in FIG. 6. The layout reduction means by integration can be attained by using the gate signal continuously and commonly and shearing the diffusion layer.

Alternatively, the gate shape of some or all of the transistors contained in the SA may be in a linear shape. Since refinement rule relating to the transistors can be used, a SA height is further reduced. Simultaneously, since transistors of special shape are not present, the effect of saving the device development that requires a special cost can be obtained. Only the transistors of standard shapes can be used, which results in improvement of the yield.

A transistor of the standard shape means a transistor having a linear gate. Further a transistor of a special shape means a transistor having a not linear gate. Transistors of the special shape includes transistors in which the gate is bent, for example, in a L-shape, a T-shape, a U-shape, an O-shape, or the like.

Figure 7:
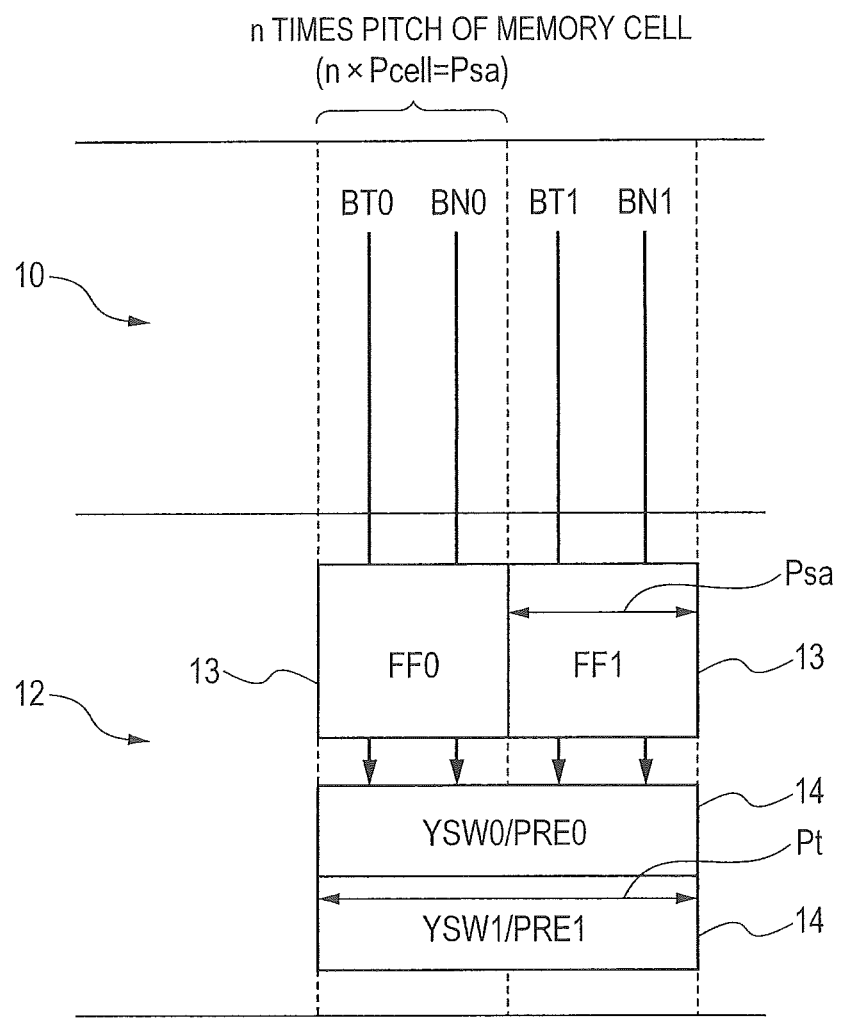
FIG. 7 is a conceptual view illustrating a configuration of a sense amplifier according to a preferred embodiment.

FIG. 7 illustrates a conceptual view of an entire configuration. FIG. 7 illustrates each two sets of sense amplifiers 12, latches FF 13, and YSW/PRE portions 14 arranged repeatedly. Latch FF 13 and YSW/PRE portion 14 corresponding to bit line pair BT0 and BN0 are shown as FF0 and YSW0/PRE0 respectively. Latch FF 13 and YSW/PRE portion 14 corresponding to bit line pair BT1 and BN1 are shown as FF1 and YSW1/PRE1, respectively.

The width of one latch FF 13 defines the SA pitch Psa of the sense amplifier 12 arranged repeatedly in the lateral direction. That is, the width of the latch FF 13 in the lateral direction is identical with the SA pitch Psa. The SA pitch Psa of the sense amplifier 12 is an integer multiple of the pitch Pcell of the memory cell. Psa=n (n is an integer)×Pcell. The SA pitch Psa is a width corresponding to the bit line pair BT0 and BN0. That is, the SA pitch Psa is a width corresponding to one bit line pair. The latch FF 13 connected to the bit line pair BT0 and BN0 and the latch FF 13 connected to the bit line pair BT1 and BN1 are juxtaposed in the lateral direction.

The width Pt of the YSW/PRE portion 14 is twice the SA pitch Psa. The width Pt of the YSW/PRE portion 14 is made wider than the SA pitch Psa which is the width of the latch FF 13. The YSW/PRE portions 14 corresponding to the two SAs are juxtaposed along the bit line direction. That is, the YSW0/PRE0 corresponding to the bit line pair BT0 and BN0, and YSW1/PRE1 corresponding to the bit line BT1 and BN1 are disposed in upper and lower two stages.

Figure 8:
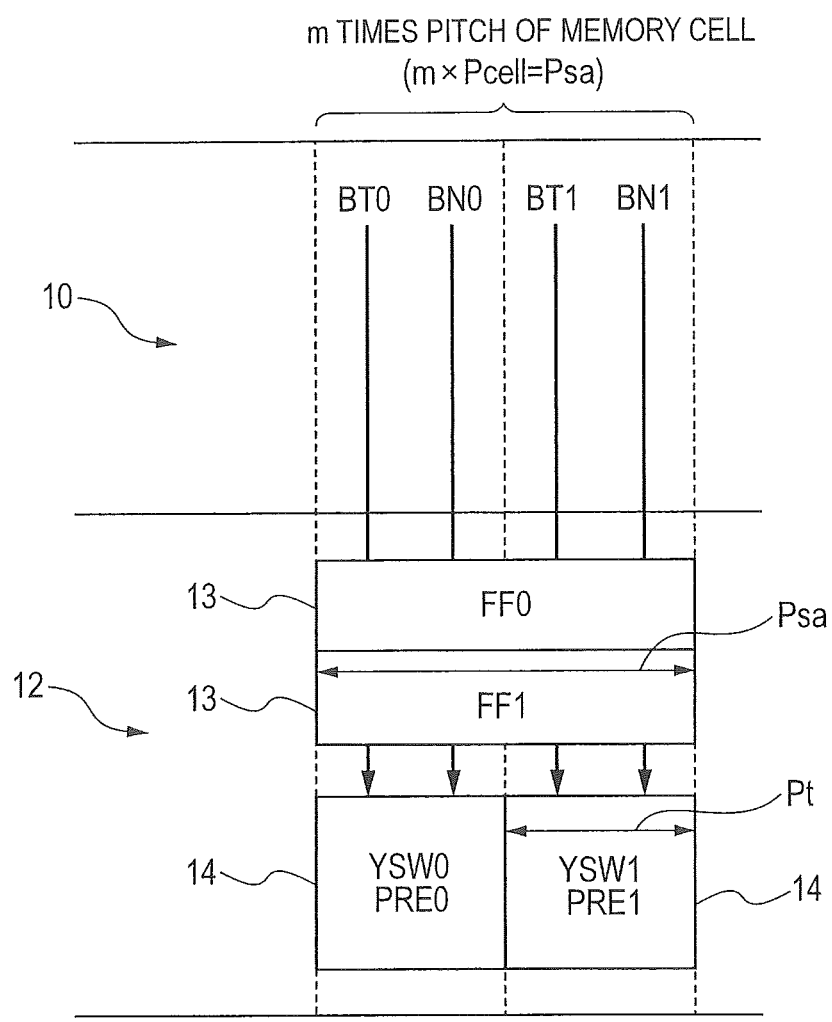
FIG. 8 is a conceptual view illustrating another configuration of a sense amplifier according to a preferred embodiment.

FIG. 8 illustrates another conceptual view for the entire configuration. The width of one latch FF 13 defines the SA pitch Psa. The width of the latch FF 13 in the lateral direction is identical with the SA pitch Psa. The SA pitch Psa of the sense amplifier 12 is an integer multiple of the pitch Pcell of the memory cell. That is, Psa=m (m is an integer)×Pcell. The SA pitch Psa is a width corresponding to the bit line pair BT0 and BN0, and the bit line pair BT1 and BN1. That is, the SA pitch Psa has a width corresponding to two bit line pairs. A latch FF 13 corresponding to the bit line pair BT0 and BN0 and the latch FF 13 corresponding to the bit line pair BT1 and BN1 are disposed in upper and lower two stages.

On the other hand, the width Pt of the YSW/PRE portion 14 is one-half the SA pitch Psa. The width Pt of the YSW/PRE portion 14 is made narrower than the SA pitch Psa which is a width of the latch FF 13. Two YSW/PRE portions 14 are juxtaposed in the lateral direction. That is, YSW0/PRE0 corresponding to the bit line pair BT0 ad BN0 and the YSW1/PRE1 corresponding to the bit line pair BT1 and BN1 are juxtaposed in the lateral direction.

In the semiconductor memory, the configuration illustrated in FIG. 7 or 8 is disposed repeatedly in the lateral direction. That is, for the SA pitch Psa, the latch FF 13 is disposed repeatedly at a pitch of a width Pt in the lateral direction. The YSW/PRE portion 14 is disposed repeatedly at a pitch of the width Pt in the lateral direction. In other words, the circuit layout of the semiconductor memory can be expressed as below. The semiconductor memory has a configuration of repeatedly arranging the standard layout as a standard in the lateral direction. That is, the standard layout of the latch FF 13 is disposed repeatedly in the lateral direction. In the same manner, the standard layout of the YSW/PRE portion 14 is disposed repeatedly in the lateral direction. A plurality of sense amplifiers 12 are constituted by the standard layouts arranged in plurality in the lateral direction.

Then, in one sense amplifier 12, the pitch width is different between the YSW/PRE portion 14 and the latch FF 13. The repeating pitch of the YSW/PRE portion 14 is twice or one-half of the repeating pitch of the latch FF 13. This can reduce the area and improve the performance.

As described above, the pitch of the latch FF 13 is different from the pitch of the YSW/PRE portion 14 in the lateral direction. The repeating pitch is twice or one-half for the latch FF 13 and the YSW/PRE portion 14. Accordingly, assuming the sense amplifiers 12 of a predetermined number, the number of repetition of the standard layout corresponding to the latch FF 13 is different from the number of repetition of the standard layout corresponding to the YSW/PRE portion 14. That is, the number of the latches FF 13 disposed repeatedly in the lateral direction is different from the number of the YSW/PRE portions 14 disposed repeatedly in the lateral direction. For example, when the width of the latch FF 13 is twice the width of the YSW/PRE portion 14, the number of repetition of the latch FF 13 is one-half of the number of repetition of the YSW/PRE portion 14. On the contrary, when the width of the latch FF 13 is one-half of the width of the YSW/PRE portion 14, the number of repetition of the latch FF 13 is twice the number of repetition the YSW/PRE portion 14. This can reduce the area and improve the performance.

Embodiment 1

Layout of Sense Amplifier

Figure 9:
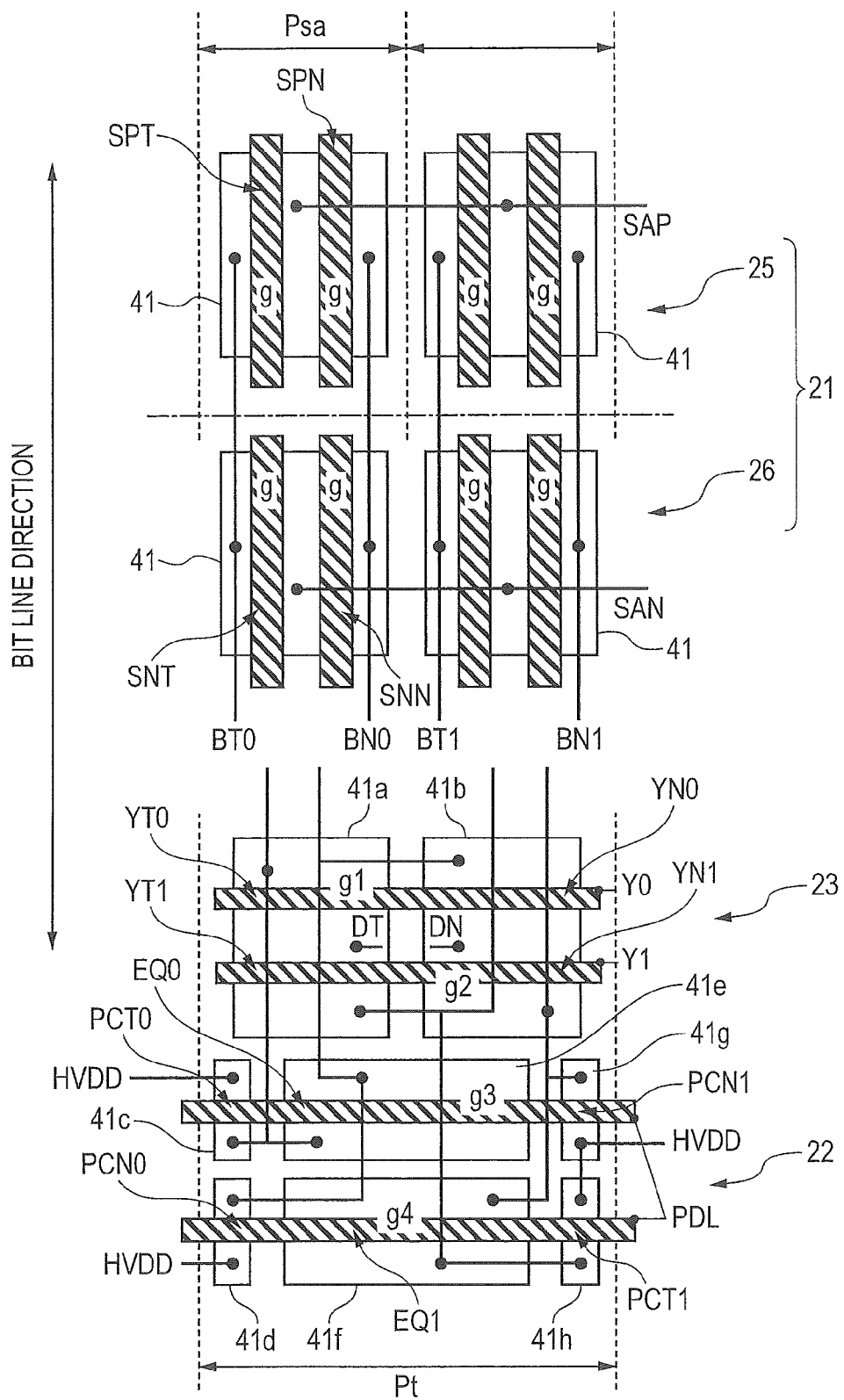
FIG. 9 is a layout view of a sense amplifier according to an embodiment 1.

The circuit layout according to this embodiment is to be described with reference to the drawings. FIG. 9 is a layout view of the sense amplifier 12 according to this embodiment. The basic circuitry of the sense amplifier 12 is identical with that illustrated in FIG. 5. Accordingly, for contents identical with those in FIG. 5, description therefor is to be omitted optionally. Also for the layout of the amplifier portion 21, since this is identical with that in FIG. 6, description therefor is to be omitted optionally. The amplifier portion 21 corresponds to the latch FF 13 in FIG. 1 to FIG. 4.

As has been described above, the width of the amplifying transistor pair in the amplifier portion 21 defines the SA pitch Psa. Then, as illustrated in FIG. 7, the pitch Pt for the precharge portion 22 and the Y switch portion 23 is twice the SA pitch Psa.

In FIG. 9, four gates g are disposed in total in the Y switch portion 23 and the precharge portion 22. Linear gates g are disposed in four stages in the Y switch portion 23 and the precharge portion 22. In the following description, gates are referred to as a gate g1 in the first stage (on the side of the NMOS pair 26 in FIG. 9) and, toward the lower side, as a gate g2 in the second stage, as a gate g3 in the third stage, and as a gate g4 in the fourth stage. Each of the gates g1 to g4 extends to adjacent sense amplifier pitch. That is, each of the gates g1 to g4 is formed being protruded to the adjacent sense amplifier pitch. Each gate g is formed overriding two SA pitches Psa.

The Y switch portion 23 has switching transistors YT and YN for connecting a plurality of bit line pairs selectively to a common bus line DBUS. That is, the Y switch portion 23 has two switching transistors YT and two switching transistors YN corresponding to the bit line pair BT0 and BN0 and the bit line pair BT1 and BN1. The switching transistors YT and YN corresponding to the bit line pair BT0 and BN0 are distinguished as switching transistors YT0 and YN0 and switching transistors YT and YN corresponding to the bit line pairs BT1 and BN1 are distinguished as switching transistors YT1 and YN1. In a case where the bit line is not specified, they are referred to as switching transistors YT and YN. Further, the precharging transistors PCT and PCN and the equalizing transistor EQ are also distinguished in the same manner.

When the bit line pair BT0 and BN0 are connected to the common bus lines DT and DN respectively, the switching transistors YT0 and YN0 are turned on by a column selection signal of a column selection signal line Y0. When the bit line pair BT1 and BN1 are connected to the common bus lines DT and DN respectively, the switching transistors YT1 and YN1 are turned on by a column selection signal of a column section signal line Y1. Thus, a bit line pair to be connected to the common bus line DBUS is selected by turning on one of the pair transistors of the switching transistors YT0 and YN0 and the switching transistors YT1 and YN1.

The Y switch portion 23 has two gates g1 and g2. In the Y switch portion 23, the gates g1 and g2 are in a two stage configuration. A column selection signal Y0 is connected to the gate g1 in the first stage for selecting the bit line pair BT0 and BN0, and a column selection signal Y1 is connected to the gate g2 in the second stage for selecting the bit line pair BT1 and BN1. Each of the gates g1 and g2 of the Y switch portion 23 is formed along the lateral direction. That is, the direction perpendicular to the bit line direction is a direction of the gate width W. Further, the two gates g1 and g2 of the Y switch portion 23 are disposed being spaced apart in the bit line direction. The two gates g1 and g2 of the Y switch portion 23 are formed linearly along the lateral direction and have substantially an identical shape.

Specifically, the lateral direction of the gate g1 of the switching transistors YT0 and YN0 in the first stage is along the longitudinal direction. The gate width direction of the switching transistors YT0 and YN0 of the Y switch portion 23 is a lateral direction. The gate g1 of the switching transistors YT0 and YN0 is one common electrode. That is, in the linear gate g1, a portion overriding the diffusion layer 41a serves as a gate of the switching transistor YT0 and a portion overriding the diffusion layer 41b serves as a gate of the switching transistor YN0.

The diffusion layer 41a and the diffusion layer 41b are isolated. The diffusion layer 41a is disposed in the SA amplifier pitch Psa of the bit line BT0 and BN0, and the diffusion layer 41b is disposed in the SA amplifier pitch Psa of the bit line pair BT1 and BN1. The gate g of the switching transistors YT0 and YN0 is continuous so as to override the two diffusion layers 41a and 41b. In other words, the gate g of the switching transistors YT0 and YN0 passes through the diffusion layers 41a and 41b.

The gate g2 of the switching transistor YT1 and the switching transistor YN1 is disposed in the second stage. Then, in the same manner as the gate g1 of the switching transistors YT0 and YN0, the gate g2 of the switching transistor YT1 and the switching transistor YN1 is a linear electrode. Also the gate g2 of the switching transistors YT1 and YN1 passes through the diffusion layer 41a and the diffusion layer 41b. Accordingly, the gates g1 and g2 connected with the column selection signal lines Y0 and Y1 are formed over the two SA amplifiers Psa.

Then, the switching transistor YT0 and the switching transistor YT1 share the diffusion layer 41a. A shared portion of the diffusion layer 41a of the two switching transistors YT0 and YT1 is connected to a common bus line DT. The switching transistors YT0 and YT1 are connected to the common bus line DT by an identical contact of the diffusion layer 41a. In the same manner, the switching transistor YN0 and the switching transistor YN1 share the diffusion layer 41b. A shared portion of the diffusion layer 41b of the two switching transistors YN0 and YT1 is connected to the common bus line DN. The switching transistors YN0 and YN1 are connected to the common bus line DN by an identical contact of the diffusion layer 41b.

The pitch Pt of the Y switch portion 23 is twice the SA pitch Psa in such a configuration. For example, the length of the electrode as the gates g1 and g2 is larger than the SA pitch Psa, which is about twice the Psa. Since the height is determined only by the shape of two continuous standard transistors and the gate does not protrude vertically out of the active device region, the height can be reduced easily. Since the gate width W has been restricted so far by the SA pitch Psa, such configuration is not general. However, since the transistor performance has been improved along with progress of refinement, the configuration described above can be adopted.

Then, the precharge portion 22 is to be described. The precharge portion 22 includes, precharging transistors PCT0 and PCT1, precharging transistors PCN0 and PCN1, and equalizing transistors EQ0 and EQ1. The precharge portion 22 has six diffusion layers 41c to 41h corresponding to the six transistors. The diffusion layers 41c, 41d, and 41e correspond to the precharging transistor PCT0, the precharging transistor PCN0, and the equalizing transistor EQ0 respectively. The diffusion layers 41f, 41g, and 41h correspond to the equalizing transistor EQ1, the precharging transistor PCN1, and the precharging transistor PCT1, respectively.

The precharge portion 22 includes two linear gates g3 and g4 extending in the lateral direction. The two gates g3 and g4 are disposed being spaced apart vertically each other. That is, the two gates g3 and g4 are disposed in upper and lower two stages. The gate g3 in the third stage is disposed so as to override the diffusion layers 41c, 41e, and 41g and the gate 14 in the fourth stage is disposed so as to override the diffusion layers 41d, 41f, and 41h. The gates g1 and g2 in the first stage and the second stage are disposed in the Y switch portion 23 as described above.

Three transistors, i.e., the precharging transistor PCT0, the equalizing transistor EQ0, and the precharging transistor PCN1 are juxtaposed in the lateral direction. The gate g3 in the third stage corresponds to the three transistors, i.e., the precharging transistor PCT0, the equalizing transistor EQ0, and the precharging transistor PCN1. Accordingly, the precharging transistor PCT0, the equalizing transistor EQ0, and the precharging transistor PCN1 share the gate g3. In other words, the gate g3 of the three transistors, that is, the precharging transistor PCT0, the equalizing transistor EQ0, and the precharging transistor PCN1 is formed integrally by an identical interconnect layer. The gate g3 of the three transistors, that is, the precharging transistor PCT0, the equalizing transistor EQ0, and the precharging transistor PCN1 is formed by one electrode pattern of an identical layer.

Also, the precharging transistor PCT1, the equalizing transistor EQ1, and the precharging transistor PCN0 share the gate g4 in the same manner as the precharging transistor PCT0, the equalizing transistor EQ0, and the precharging transistor PCN0. In other words, the precharging transistor PCT1, the equalizing transistor EQ1, and the precharging transistor PCN0 snare the gate g4 in the fourth stage. The gate g4 of the three transistors, i.e., the precharging transistor PCT1, the equalizing transistor EQ1, and the precharging transistor PCN1 is formed integrally by an identical interconnect layer. The gate g4 of the three transistors, i.e., the precharging transistor PCT1, the equalizing transistor EQ1, and the precharging transistor PCN1 is formed by an electrode pattern of an identical layer.

Pair transistors comprising the precharging transistor PCN0 and the precharging transistor PCT0 are arranged vertically in the SA pitch Psa on the left. The pair transistors comprising the precharging transistor PCN1 and the precharging transistor PCT1 are arranged vertically in the SA pitch Psa on the right. On the other hand, since higher driving performance is required for the equalizing transistor EQ0 than that for the precharging transistor PCN0 and the precharging transistor PCT0, the gate width W is made larger. That is, since the equalizing transistor EQ0 that directly shorts circuit the bit line pair BT0 and BN0 determines a precharging rate, it tends to be larger compared with the precharging transistors PCT0 and PCN0. Accordingly, the equalizing transistor EQ0 is not accommodated in the SA pitch Psa on the left. The pitch Pt of the precharge portion 22 is twice the SA amplifier pitch Psa.

In the layout illustrated in FIG. 6, when increase in the gate width W of the equalizing transistor EQ directly increases the SA height. However, in the layout of FIG. 9, a large gate width W can be obtained by using as far as the adjacent SA region. Since the gate signal is in common with that of the adjacent SA device, loss due to the gate isolation and the contact region is small and the size of the device can be larger only by the isolation of the diffusion layer. Since the height is twice the size of an independent transistor of a standard shape, the distance is determined by design criteria and can be reduced easily along with refinement of the transistor. In FIG. 9, all of the transistors in the sense amplifier 12 are transistors of a standard shape. Accordingly, only the transistors of the standard shape can be used to improve the yield. That is, arrangement the direction of the gate g is made uniform by using only the gate g of a linear shape. Accordingly, this embodiment provides a layout that can be stabilized easily against scattering in view of the device manufacture and high yield can be expected. Furthermore, the area in the longitudinal direction can be reduced.

A common bus DBUS is disposed corresponding to SA by the number of m (m is an integer of 2 or greater). A column is selected by turning on switching transistors Y of SA by the number of m selectively and connecting one of the bit line pairs by the number of m to the common bus line DBUS. Further, a column address is identical for columns situated on both sides of the column at the boundary of adjacent I/O. The gates of the switching transistors YT and YN are formed overriding the boundary of the adjacent I/O. With such a configuration, the performance of the switching transistors YT and YN can be improved and the reliability of the memory can be improved. Further, since the space for signal separation between the adjacent I/O can be decreased. Efficient layout can be obtained.

(Example of Transistor Arrangement in Amplifier Region)

Figure 10:
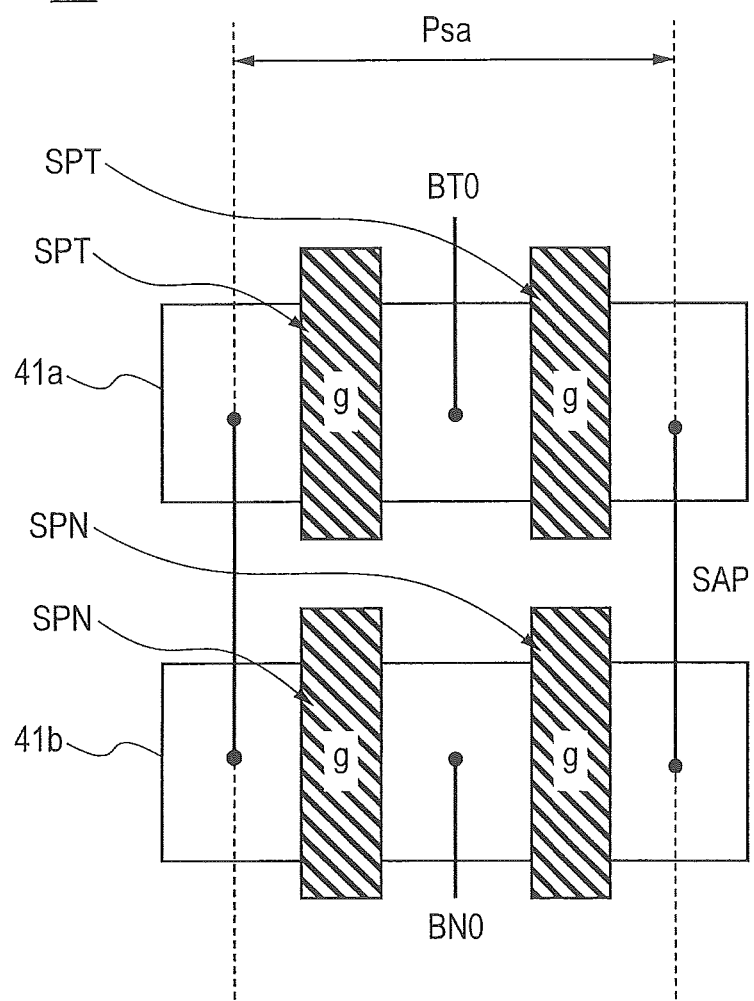
FIG. 10 is a layout view illustrating an example of arrangement of transistors in an amplifying region provided to a sense amplifier.
Figure 11:
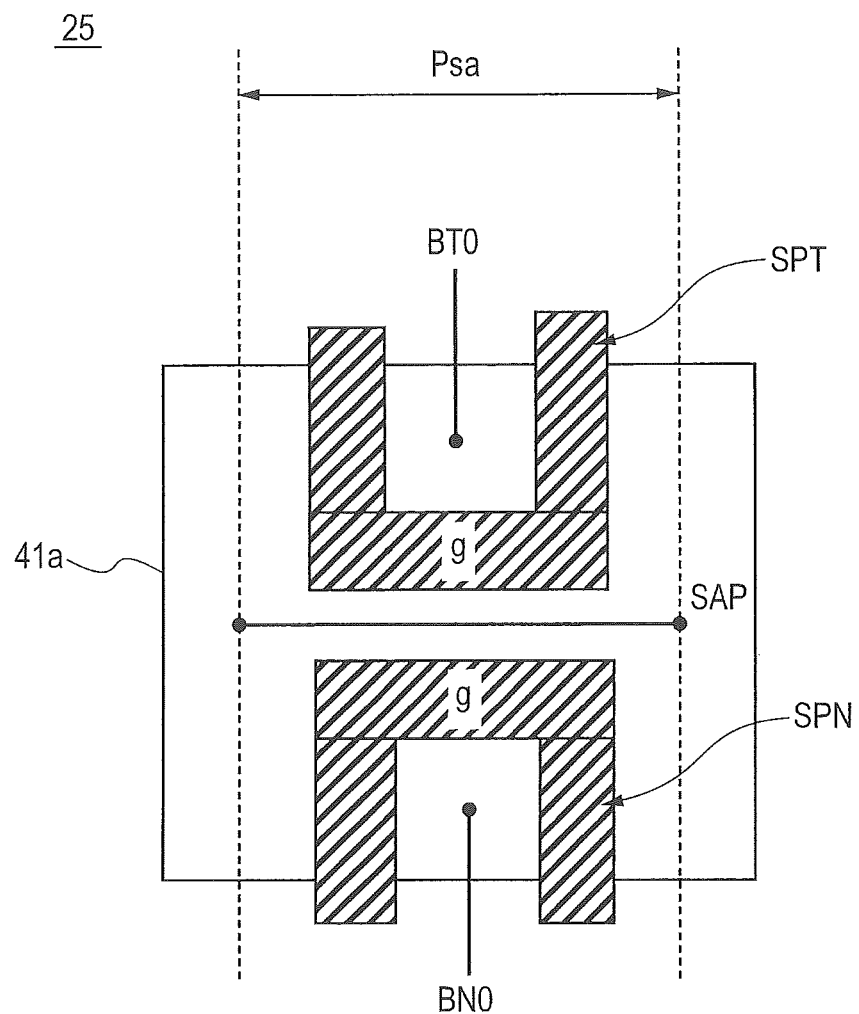
FIG. 11 is a layout view illustrating an example of arrangement of transistors in an amplifying region provided to a sense amplifier.
Figure 12:
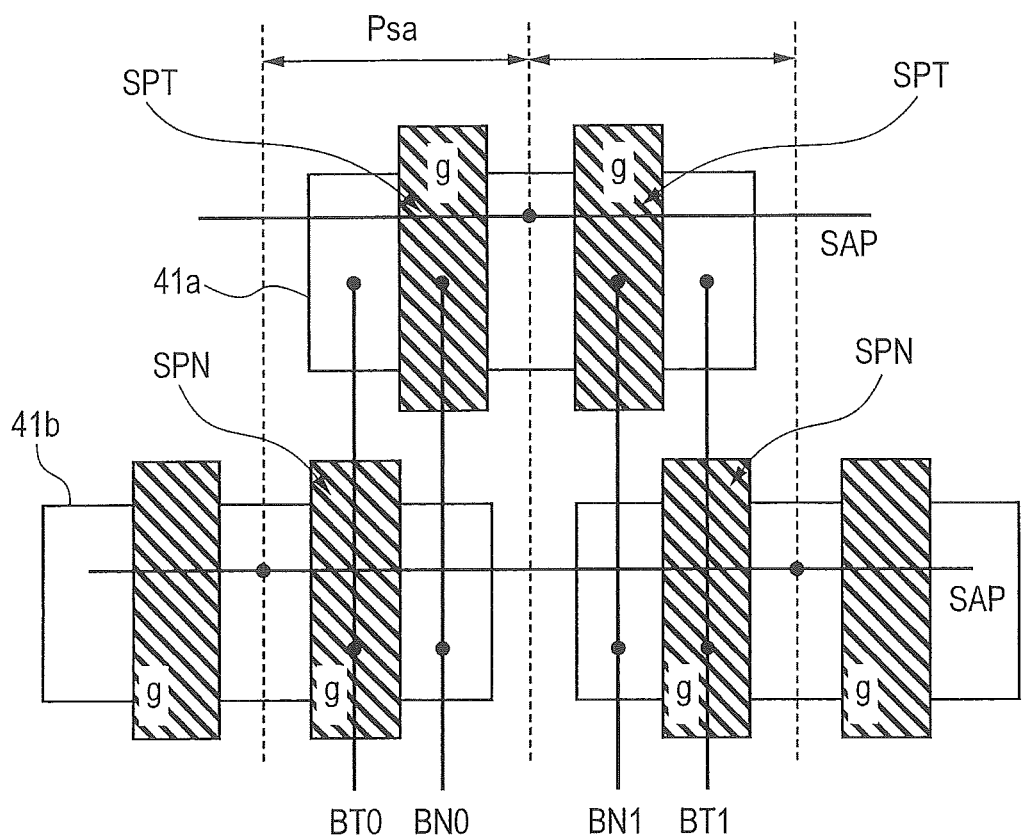
FIG. 12 is a layout view illustrating an example of arrangement of transistors in an amplifying region provided to a sense amplifier.

The amplifier portion 21 is a portion for analog operation of amplifying micro voltage of the sense amplifier 12. This requires a design that considers random variation by setting the gate length L somewhat larger for the amplifying PMOS transistors SPT and SPN and amplifying NMOS transistors SNT and SNN, and that attaches importance to the arrangement and the symmetry of the shape of the transistors. Examples of the layout for the amplifier portion 21 are to be described with reference to FIGS. 10 to 12. FIGS. 10 to 12 are views illustrating examples of the layout for the transistor shape in the amplifier portion 21 that determines the SA pitch Psa. FIGS. 10 to 12 illustrate examples of the layout of PMOS pair 25. The configurations identical with those of FIGS. 10 to 12 can be used for the NMOS pair 26.

In FIG. 10, gates g of the amplifying PMOS transistor SPT and the gate g of the amplifying PMOS transistor SPN are linear in the longitudinal direction. Two gates of g are used for the amplifying PMOS transistor SPT. In the same manner two gates g are used for the amplifying PMOS transistors SPN. The diffusion layer 41a for the amplifying PMOS transistor SPT and the diffusion layer 41b for the amplifying PMOS transistor SPN are spaced apart. The gate g of the amplifying PMOS transistor SPT and that of the amplifying PMOS transistor SPN are arranged in upper and lower two states.

In FIG. 11, the gate g is in a U-shaped configuration and an amplifying PMOS transistor SPT and an amplifying PMOS transistor SPN are arranged in upper and lower two stages. The gate g may also be in an O-shaped configuration instead of the U-shaped configuration and the amplifying PMOS transistor SPT and the amplifying PMOS transistor SPN may be arranged in upper and lower two stages. A diffusion layer 41a formed integrally is used for the amplifying PMOS transistor SPT, the amplifying PMOS transistor SPN, and the amplifying PMOS transistor SPT.

In FIG. 12, the amplifying PMOS transistor SPT and the amplifying PMOS transistor SPN are arranged in upper and lower two stages with the shape of the gate g being linear. The diffusion layer 41a of the amplifying PMOS transistor SPT and the diffusion layer 41b of the amplifying PMOS transistor SPN are spaced apart. The diffusion layer 41a and the diffusion layer 41b are arranged being displaced in the lateral direction. Then, the width of each of the diffusion layers 41a and 41b is larger than the SA pitch Psa. The diffusion layers 41a and 41b extend to the adjacent SA pitch. The amplifying PMOS transistors SPT of adjacent bit line pair share the diffusion layer 41a. In the same manner, the amplifying PMOS transistors SPN of adjacent bit line pair share the diffusion layer 41b.

In any of the configurations of FIG. 10 to FIG. 12, pair transistors of a long gate length L are disposed in the vicinity. Accordingly, the SA pitch Psa is determined based on the size of the pair transistor. The configuration of FIG. 10 to FIG. 12 may be adopted also for the PMOS pair 25 and the NMOS pair 26. Further, the configuration of FIG. 10 to FIG. 12 may be used also in the layout to be described later.

(Allocation of Column Selection)

Figure 13:
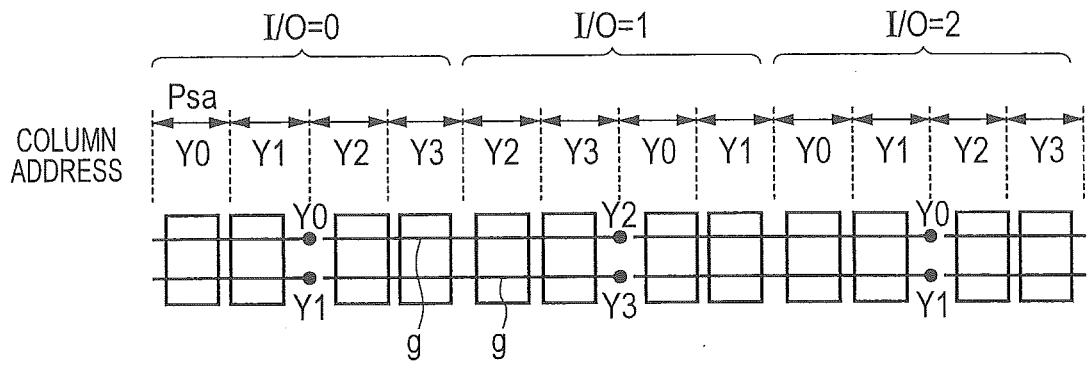
FIG. 13 is a view schematically illustrating an example of an arrangement for selection of columns in a Y switch portion.

Then, an example of arrangement of column selection in the Y switch portion 23 is described with reference to FIG. 13. FIG. 13 is a view for explaining a case where the number of columns is 4. Description is to be made to an example of selecting a column by selecting one bit line pair from four bit line pairs in each of I/O. In this example, column addresses Y0 to Y3 are allocated to one I/O. Switching transistor pair of the switching transistors YT and YN is connected to each of Y0 to Y3 as described above. The switching transistors YT and YN for Y0 to Y3 share a common bus line DBUS.

In I/O=0 and I/O=2, SA are arranged in the address order of Y0, Y1, Y2, and Y3 from the left. In I/O=1, SA are arranged in the address order of Y2, Y3, Y0, and Y1 from the left. Further, FIG. 13 schematically illustrates gates g for the switching transistors YT and YN.

In the arrangement of FIG. 13, a transistor pair Y0 and Y1 is not disposed between the transistor pair Y2 and Y3 of I/O=0 and a transistor pair Y2 and Y3 of I/O=1. Accordingly, transistor pair Y2 and Y3 can be arranged physically adjacent at the boundary of the adjacent I/O. Specifically, at the boundary of the adjacent I/O, Y2 is present on both sides of Y3 and Y3 is present on both sides of Y2. Thus, the gate of the transistor pair Y2 and Y3 can be shared for I/O=0 and I/O=1. In the same manner, the gate g of transistor pair Y0 and Y1 can be shared for adjacent I/O=2 and I/O=1. In other words, a gate g extending over four SA pitches Psa is disposed.

As described above, four SAs present at the boundary of adjacent I/O can share the gate g. For example, in two SAs of Y2 and two SAs of Y3, an integrated gate g is used for the switching transistors YT and YN. When the arrangement of column selection in FIG. 13 is used for the layout in FIG. 9, the gate can be shared overriding a region four times as large as the SA pitch. That is, the gate g of the switching transistors YT and YN overrides the boundary of the adjacent I/O. By adjusting the order of Y0 to Y4 between adjacent I/O, repetition of the gate signal can be made further in common. Since device isolation and contact are not necessary at the boundary of I/O, the gate width W of the switching transistors YT and YN can be increased. Accordingly, the performance of the switching transistors YT and YN can be improved.

In this case, for avoiding the selection of an identical selection column address (Y) in physically adjacent I/O, the input order of a decoder signal is set such that Y2 is adjacent to Y3 and Y1 is adjacent to Y0. It is configured such that identical column addresses not continue at the boundary of adjacent I/O. It is configured such that the column selection signal of an identical address does not continue in the adjacent I/O. This can provide an effect of lowering a test quality due to that the bit line interference is observed differently from other cases and lowering concurrent failure incidence at one portion by a soft error under irradiation of cosmic rays.

Figure 14:
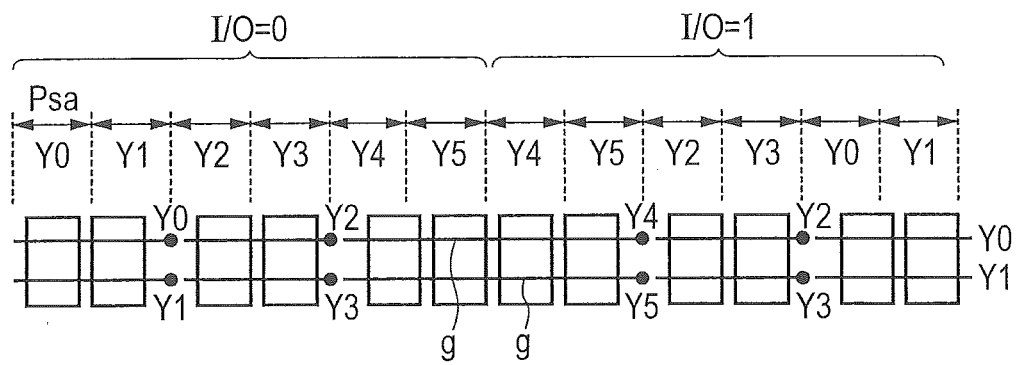
FIG. 14 is a view schematically illustrating an example of an arrangement for selection of columns in a Y switch portion.

FIG. 14 illustrates an example for the number of columns of 6 as an example where the number of columns is 4 or more. That is, column addresses Y0 to Y5 are allocated to respective I/O. An example of layout for selecting one column from six columns is to be described. At I/O=0, the Y switch portion 23 is arranged in the order of Y0, Y1, Y2, Y3, Y4, and Y5 from the left. At I/O=1, the Y switch portion 23 is arranged in the order of Y4, Y5, Y2, Y3, Y0, and Y1 from the left. In this configuration, gate g of the Y4 and Y5 transistor pair can be shared between adjacent I/O. Further, although not illustrated, the gate g of the Y0 and Y1 transistor pair can be shared at the boundary between I/O=1 and IO=2. Therefore, the gate width W of the switching transistors YT and YN can be increased.

Figure 15:
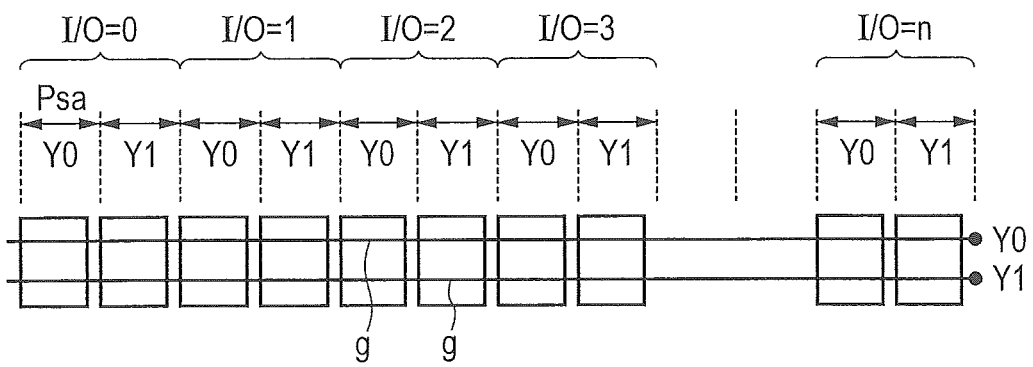
FIG. 15 is a view schematically illustrating an example of an arrangement for selection of columns in a Y switch portion.

FIG. 15 illustrates an example in which the number of columns is two. That is, column addresses Y0 and Y1 are allocated to each I/O. An example of layout for selecting one of two columns is to be described. In FIG. 15, Y0 and Y1 are arranged alternately. Accordingly, all I/O can share the gate g. Thus, the gate g can be passed through extensively. The gate g overrides the I/O boundary in FIG. 13 to FIG. 15. Then, at the boundary of the adjacent I/O, four or more switching transistors share the gate g. The gate width W of the switching transistors YT and YN can be increased. Thus, layout can be provided efficiently to reduce the area. It will be apparent that the number of columns in each I/O is not restricted to 2, 4, or 6, but may be in any number.

Embodiment 2

Example of Arrangement of Transistor in Y Switch Portion 23

Figure 16:
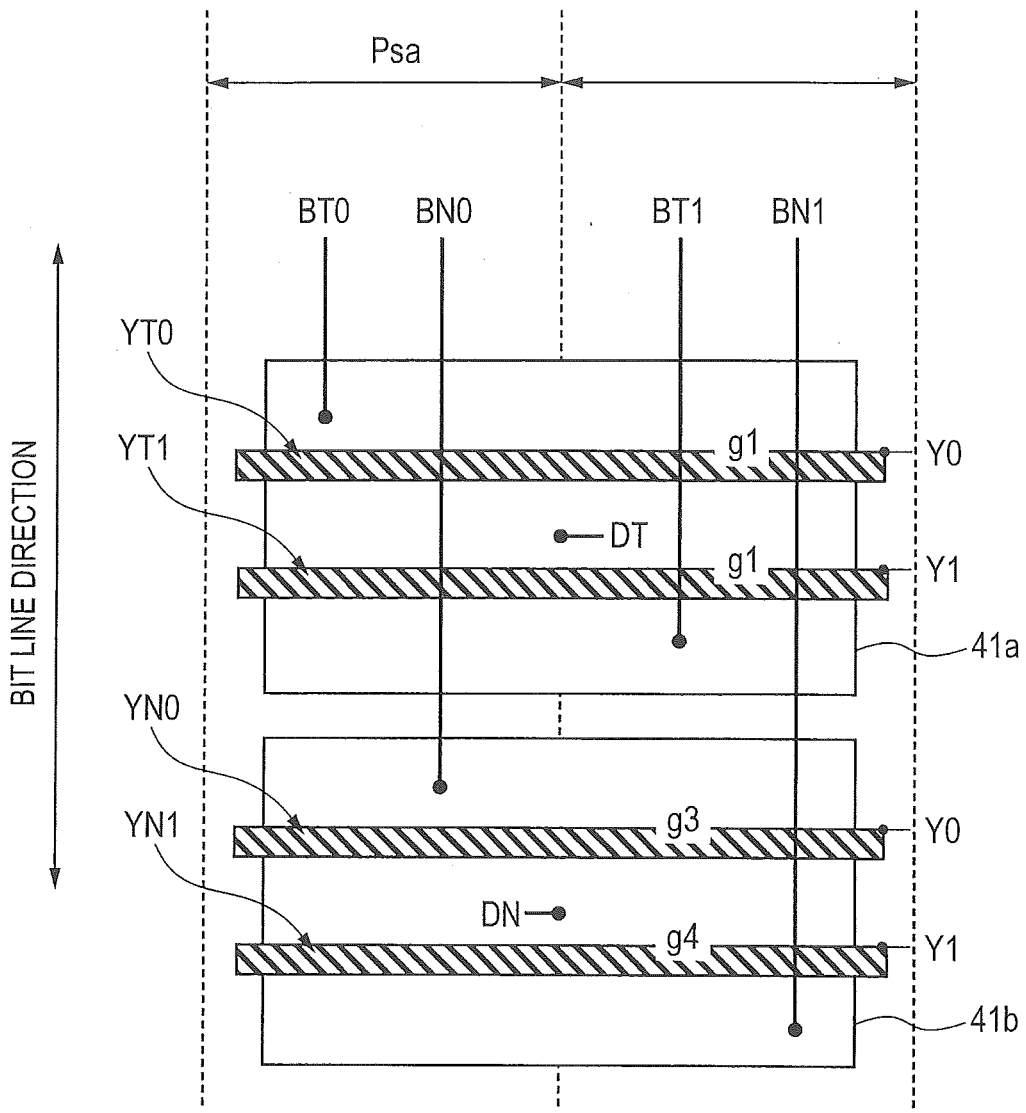
FIG. 16 is a layout view illustrating an example of arrangement of transistors in a Y switch portion of a sense amplifier according to an embodiment 2.

A configuration of a semiconductor memory according to this embodiment is to be described with reference to FIG. 16. FIG. 16 is a view illustrating a layout of a Y switch portion 23. Since other configurations than the Y switch portion 23 are identical with those in Embodiment 1, description therefor is to be omitted. Further, since the basic configuration of SA is identical with that of Embodiment 1, description is to be omitted for the contents identical with those of Embodiment 1. FIG. 16 illustrates two SA pitches Psa.

In FIG. 16, the gate width W of switching transistors YT and YN is enlarged as long as twice of the SA pitch Psa. Accordingly, four gates g extending in the lateral direction are disposed in the Y switch portion 23. That is, the gates g are arranged in four stages. The gate g1 in the first stage corresponds to a switching transistor YT0, and a gate 2 in the second stage corresponds to a switching transistor YT1. A gate g3 in the third stage corresponds to a switching transistor YN0 and a gate g in the fourth stage corresponds to a switching transistor YN1.

Further, diffusion layers 41a and 41b in two stages are disposed in the Y switch portion 23. A switching transistor YT0 and the switching transistor YT1 share the diffusion layer 41a connected to a common bus line DT. A shared portion of the diffusion layer 41a is a signal contact of the common bus line DT. The gates g1 and g2 are disposed on both upper and lower sides of the signal contact of the common bus line DT. The switching transistor YN0 and the switching transistor YN1 share the diffusion layer 41b connected to the common bus line DN. A shared portion of the diffusion layer 41b is a signal contact of the common bus line DN. The gates g3 and g4 are disposed on both upper and lower sides of the signal contact of the common bus line DN. The diffusion layers 41a and 41b are formed being extended to the adjacent SA pitch Psa. That is, the width of the diffusion layers 41a and 41b is larger than the SA pitch Psa and formed over two SA pitches Psa. The pitch of the Y switch portion 23 is twice the SA pitch Psa.

As described above, transistors arranged in an upper and lower two stage configuration in which the switching transistor YT0 and the switching transistor YT1 share the diffusion layer 41a. Switching transistor YN0 and switching transistor YN1 are arranged in an upper and lower two stage configuration in which the switching transistor YN0 and the switching transistor YN1 share the diffusion layer 41b. Then, respective transistors in each of the stages have a gate g along the direction of the word line.

In the layout, while the size in the direction of height is increased compared with the layout in FIG. 9, the gate width W of the switching transistors YT and YN can be increased as large as about twice of the pitch Psa. The gate width W of the switching transistors YT and YN can be increased to improve the performance. The arrangement direction of the gate g is made uniform by using only the gate of the linear shape. Accordingly, this embodiment provides a layout that can be stabilized easily against scattering in view of the device manufacture and high yield can be expected.

(Modification 1 of Y Switch Portion 23)

Figure 17:
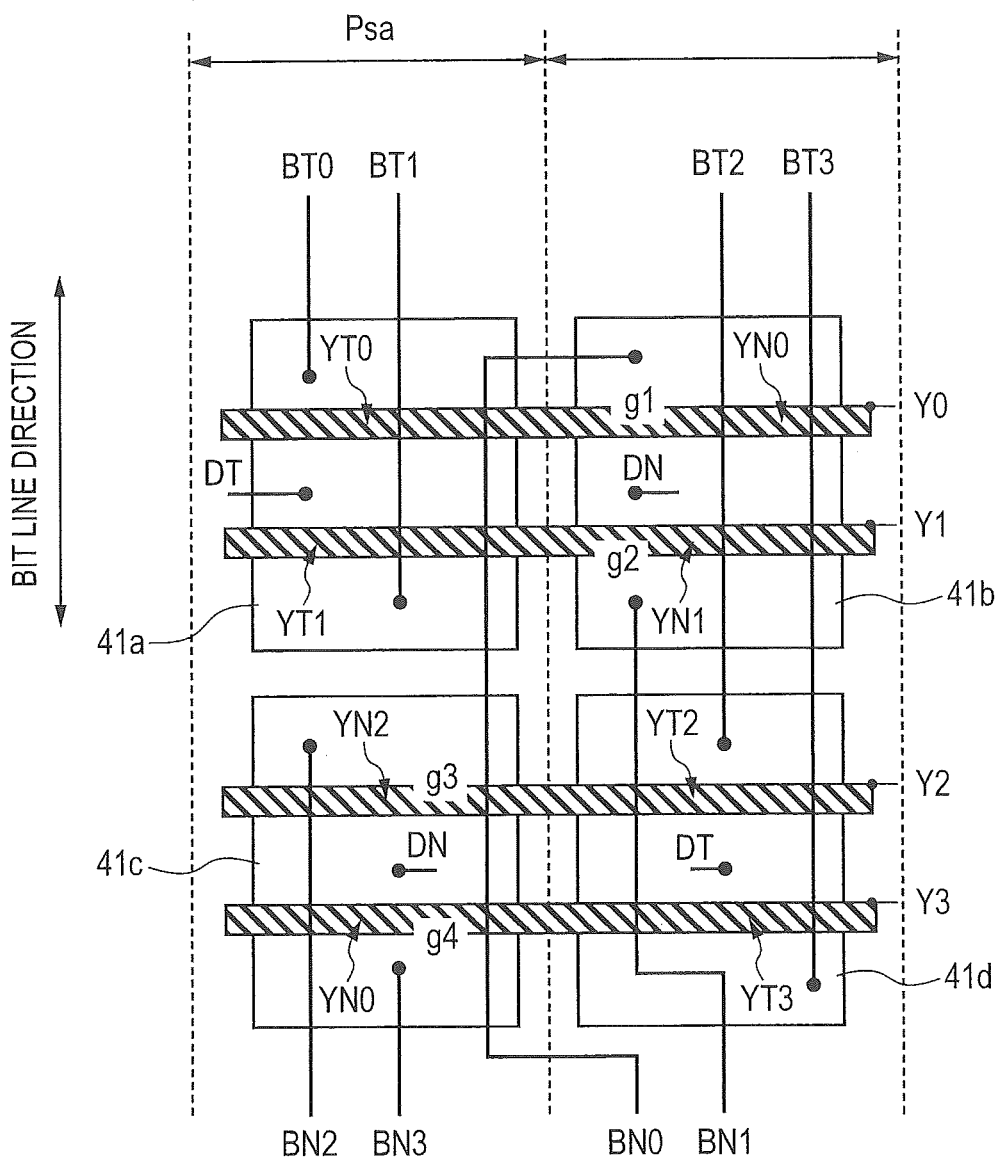
FIG. 17 is a layout view illustrating an example of arrangement of transistors in a Y switch portion of a sense amplifier according to an embodiment 2.

Then, a modification of the layout of the Y switch 23 is to be described with reference to FIG. 17. FIG. 17 illustrates a Y switch portion 23 of an open bit type memory cell. FIG. 17 illustrates Y switch portion 23 for four bit line pairs, that is, a bit line pair BT0 and BN0, a bit line pair BT1 and BN1, a bit line pair BT2 and BN2, and a bit line BT3 and BN3.

In this example, four bit lines BT0 to BT3 enter from the memory cell 11 on the upper side, and four bit line pairs BN0 to BN3 enter from the memory cell 11 on the lower side for a pitch twice the SA pitch Psa. Also in this case, each of the gate g1 to g4 is formed along the lateral direction. The length of the electrode of the gate g1 to g4 has a length twice the SA pitch Psa.

The Y switch portion 23 includes four diffusion layers 41a to 41d. The diffusion layers 41a to 41d are arranged as a 2 (longitudinal)×2 (lateral) matrix. The diffusion layer 41 is isolated for the transistor pair of each address. For example, the diffusion layer 41a for the switching transistor YT0 and the diffusion layer 41b for the switching transistor YN0 are isolated. Further, the switching transistor YT0 and the switching transistor YT1 share the diffusion layer 41a. This configuration is identical also in the diffusion layer 41d of the switching transistor YT2 and YT3. This is also identical in the diffusion layer 41c for the switching transistors YN2 and YN3. The diffusion layer 41a and the diffusion layer 41d are diagonally arranged and the diffusion layer 41b and the diffusion layer 41c are diagonally arranged.

Four gates g1 to g4 are arranged in upper and lower four stages. Also with such a configuration, the pitch of the Y switch portion 23 is twice the SA pitch Psa, and the advantageous effect described above can be obtained. The arrangement direction of gates g is unified only by using a linear shape gate g1 to g4. Accordingly, this embodiment provides a layout that can be stabilized easily against scattering in view of the device manufacture and high yield can be expected.

(Modification 2 of Y Switch Portion 23)

Figure 18:
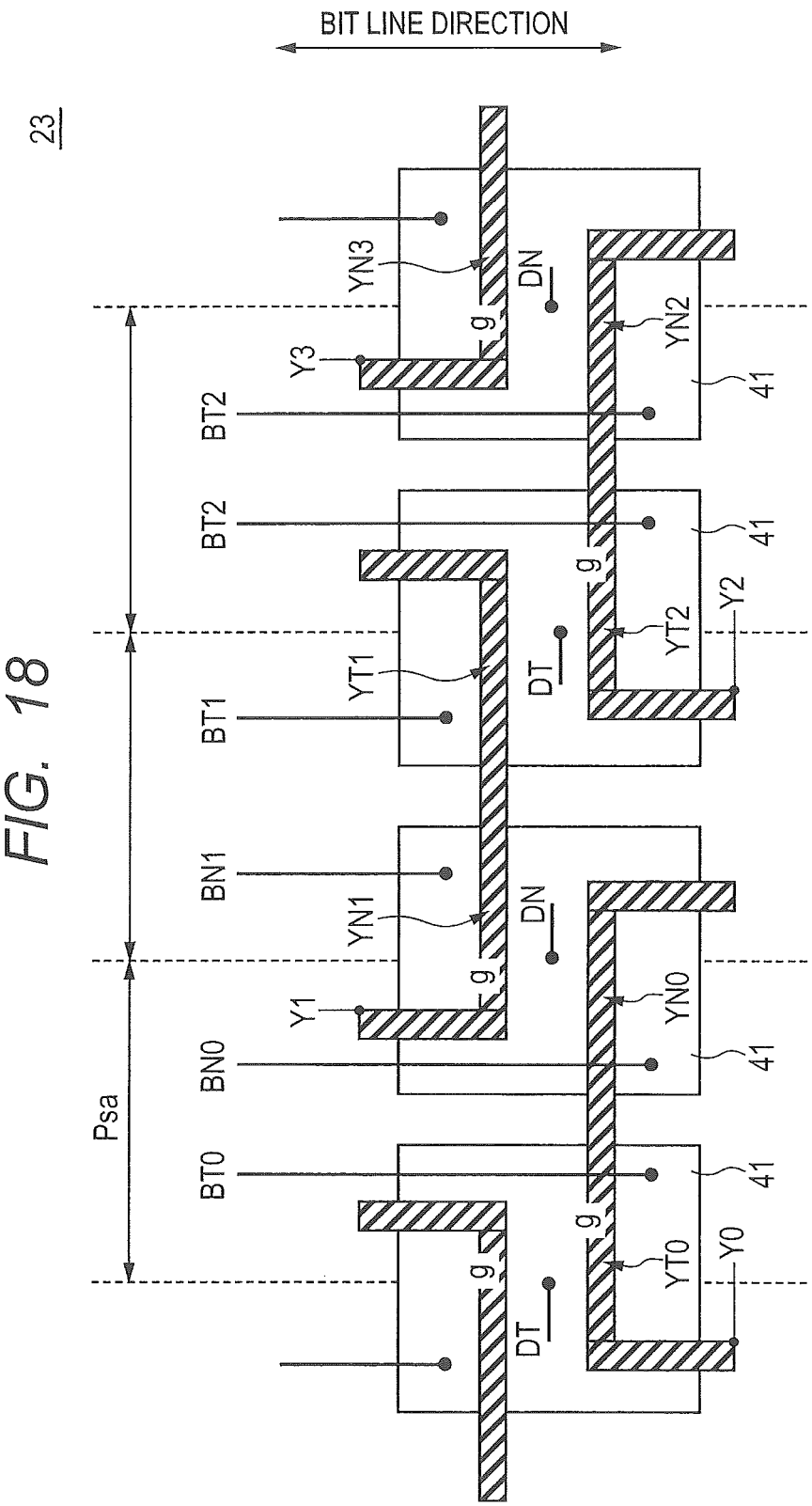
FIG. 18 is a layout view illustrating an example of arrangement of transistors in a Y switch portion of a sense amplifier according to the embodiment 2.

Modification 2 for the layout of the Y switch portion 23 is to be described with reference to FIG. 18. FIG. 18 illustrates a region three times as large as the SA pitch Psa. That is, FIG. 18 illustrates a Y switch portion 23 to three bit line pairs, i.e., bit line pair BT0 and BN0, bit line pair BT1 and BN1, and bit line pair BT2 and BN2. In the layout illustrated in FIG. 18, a gate g is bent into a U-shaped configuration at a right angle on both ends in the lateral direction. Since other basic configurations than the shape of the gate g are identical with those in the Embodiment 1, description therefor is to be omitted optionally.

In this configuration, it is not necessary to arrange a protruding portion of the gate g and a connection contact with the column selection signal line Y at the end of the diffusion layer 41 in the lateral direction. This enables to increase the gate width W of the transistor of the Y switch portion 23. Although the height increases due to the upper and lower protrusions of the gates, an optimum layout can be obtained in view of the combination of the design criteria and the transistor size. Further, the common gate region is displaced by the SA pitch between the upper switching transistor YT1 and the lower switching transistor YN2. That is, the protruding position of the gate g in the lateral direction is displaced between upper and lower gates g. This is a layout considering easy signal interconnect that connects from the bit line to the diffusion layer 41.

(Modification 3 of Y Switch Portion 23)

Figure 19:
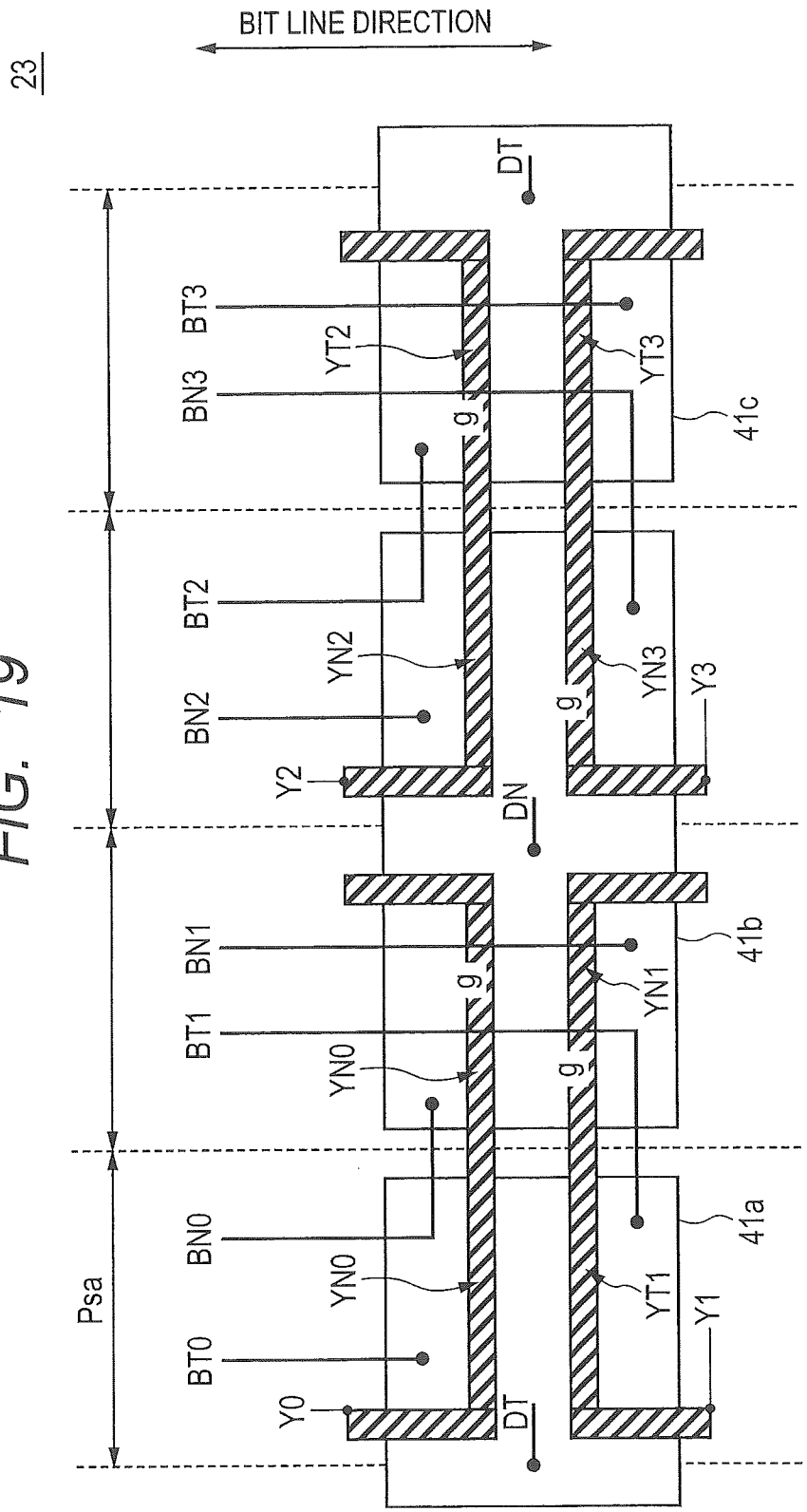
FIG. 19 is a layout view illustrating an example of arrangement of transistors in a Y switch portion of a sense amplifier according to the embodiment 2.

Then, Modification 3 of the layout of the Y switch portion 23 is to be described with reference to FIG. 19. FIG. 19 illustrates a Y switch portion 23 for four bit line pairs of a bit line pair BT0 and BN0, a bit line pair BT1 and BN1, a bit line pair BT2 and BN2, and a bit line pair BT3 and BN3. Further, FIG. 19 illustrates a region four times as large as the SA pitch Psa.

In FIG. 19, a gate g is formed in a U-shaped configuration in the same manner as the configuration of FIG. 16. A diffusion layer 41b is formed to a width wider than the SA pitch Psa and formed while protruding to the adjacent SA pitch Psa. Further, a diffusion layer 41b connected to a common bus line DN is added vertically and shared between adjacent right and left SA. That is, the diffusion layer 41b connected to the common bus line DN to be connected to the switching transistors YN0 to YN3 is shared. With such a configuration, a common diffusion layer 41b can be shared for the four switching transistors YN. Although not illustrated in the drawing, also the diffusion layers 41a and 41c connected to the common bus line DT are shared for adjacent SA. The isolation region of the diffusion layer 41 can be decreased.

The gate width W of the switching transistors YT and YN can be increased further than that of FIG. 18. For example, since the device isolation region and the contact are unnecessary, the size of the diffusion layer 41 can be increased and the gate width W can be widened.

The layout of the Y switch portion 23 illustrated in FIG. 9 can be modified to the layout shown in any of FIG. 16 to FIG. 19. The layout for the Y switch portion 23 illustrated in FIG. 16 to FIG. 19 and the layout of the PMOS pair 25 illustrated in FIG. 19 to FIG. 12 may also be combined.

Embodiment 3

Example of Transistor Arrangement in Precharge Portion 22

Figure 20:
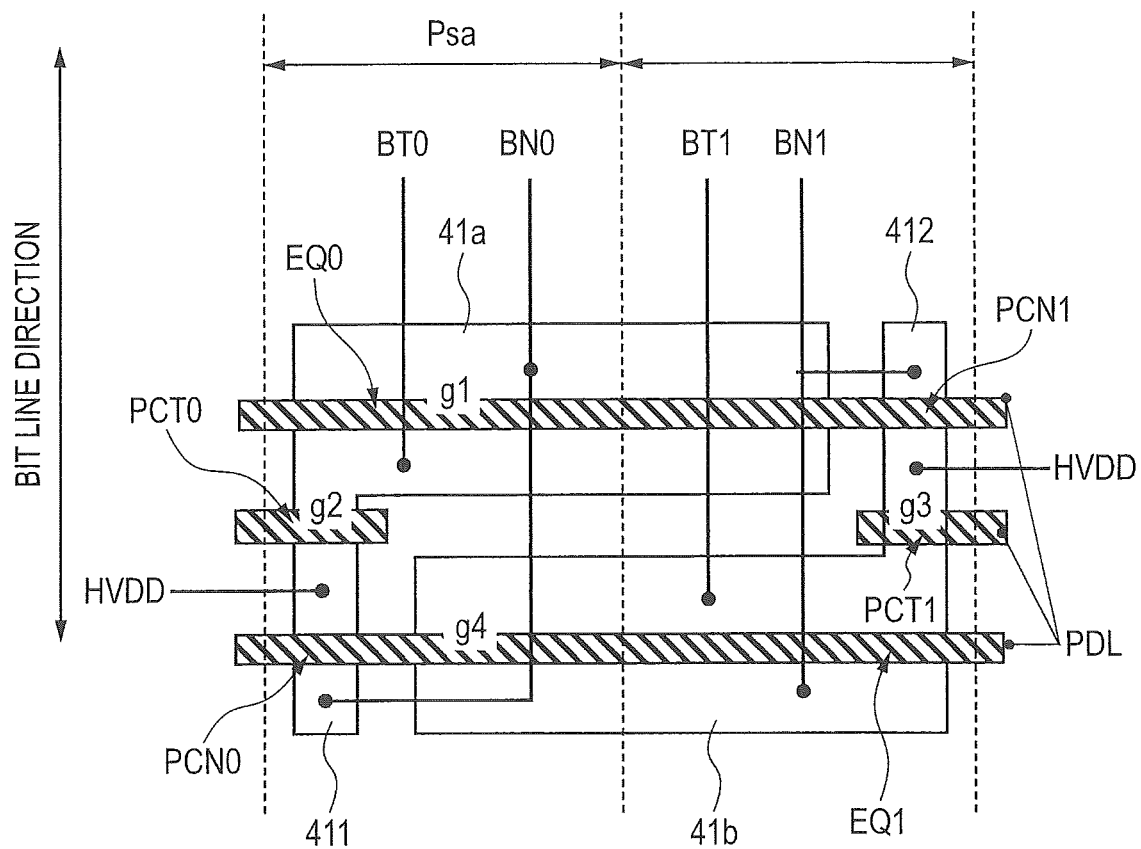
FIG. 20 is a layout view illustrating an example of arrangement of transistors in a precharge portion of a sense amplifier according to an embodiment 3.

A configuration of a semiconductor memory according to Embodiment 3 is to be described with reference to FIG. 20. FIG. 20 is a layout view of transistors in a precharge portion 22. The layout of the precharge portion 22 according to this embodiment can be used for Embodiment 1. For the contents identical with those of Embodiments 1 and 2, description is to be omitted.

Compared with the layout of Embodiment 1, the equalizing transistor EQ and the precharging transistor PCT share a diffusion layer 41 in FIG. 20. In FIG. 20, a diffusion layer 41a is formed for the bit line pair BT0 and BN0 and a diffusion layer 41b is formed for the bit line pair BT1 and BN1.

The side of the bit line BT0 of the equalizing transistor EQ0 and the side of the bit line BT0 of the precharging transistor PCT0 share the diffusion layer 41a. The side of HVDD of the precharging transistor PCN0 and the side of HVDD of the precharging transistor PCT0 share the diffusion layer 41a.

In the precharging portion 22, four gates g1 to g4 are disposed along the lateral direction. Gates g1 and g4 in the first stage and the third stage have a length more than twice the length of the SA pitch Psa. Two gates g2 and g3 are disposed in the second stage. The gate g1 in the first stage corresponds to the equalizing transistor EQ0 and the precharging transistor PCN1. The gate g4 in the third stage corresponds to the equalizing transistor EQ1 and the precharging transistor PCN0. The gate g2 in the second stage corresponds to the precharging transistor PCT0 and the other gate g3 in the second stage corresponds to the precharging transistor PCT1.

The equalizing transistor EQ0, the precharging transistor PCT0, and the precharging transistor PCN0 are arranged being spaced apart in the bit line direction. The gate 1 of the equalizing transistor EQ0, the gate 2 of the precharging transistor PCT0, and the gate g4 of the precharging transistor PCN0 are different gates. In the same manner, for the bit line pair BT1 and BN1, the gate 4 of the equalizing transistor EQ1 and the gate 3 of the precharging transistor PCT1, and the gate g1 of the precharging transistor PCN1 are different gates. The equalizing transistor EQ0 and the precharging transistor PCN1 share gate g1. The equalizing transistor EQ1 and the precharging transistor PCN0 share the gate g4. The gate g2 of the precharging transistor PCT0 is independent. The gate g3 of the precharging transistor PCT1 is independent.

The diffusion layers 41a and 41b are formed being protruded to the adjacent SA pitches Psa. That is, each of the diffusion layers 41a and 41b is wider than the SA pitch Psa and formed over the two SA pitches Psa. The diffusion layers 41a and 41b have extensions 411 and 412 respectively. Accordingly, the diffusion layers 41a and 41b are formed each into a L-shaped configuration and have extensions 411 and 412 at the portion extending in the bit line direction. The diffusion layer 41a is laid out rotational symmetric with respect to the diffusion layer 41b. In the diffusion layer 41a, the extension 411 extending in the longitudinal direction constitutes the precharging transistor PCT0 and the precharging transistor PCN0. In the diffusion layer 41b, the extension 412 extending in the direction of bit line constitutes a precharging transistor PCT1 and the precharging transistor PCN1.

The gate g1 of the precharging transistor PCN1 is extended so as to override the diffusion layer 41a. The gate g1 in the first stage overrides the diffusion layer 41a and the extension 412. A gate g1 shared for the equalizing transistor EQ0 and the precharging transistor QCN1 can be formed to a region twice of the SA pitch Psa. The gate g4 of the precharging transistor PCN0 is extended so as to override the diffusion layer 41b. The gate g4 in the third stage overrides the diffusion layer 41b and the extension 411. In the same manner, a gate g4 shared for the precharging transistor PCN0 and the equalizing transistor EQ1 can be formed.

Thus, the gate width W can be widened. Further, extensions 411 and 412 are formed to the diffusion layers 41a and 41b, and the precharging transistors PCN0 and PCN1 are disposed therein. Thus, the gate width of the equalizing transistor EQ for which high performance is required can be wider than that of the precharging transistor PCN. The arrangement direction of the gate g is made uniform by using only the linear shape gate g. Accordingly, this embodiment provides a layout that can be stabilized easily against scattering in view of the device manufacture and high yield can be expected. The pitch of the precharge portion 22 is twice as large as the SA pitch Psa. Accordingly, in the same manner as described above, the area can be reduced.

(Modification 1 of Precharge Portion 22)

Figure 21:
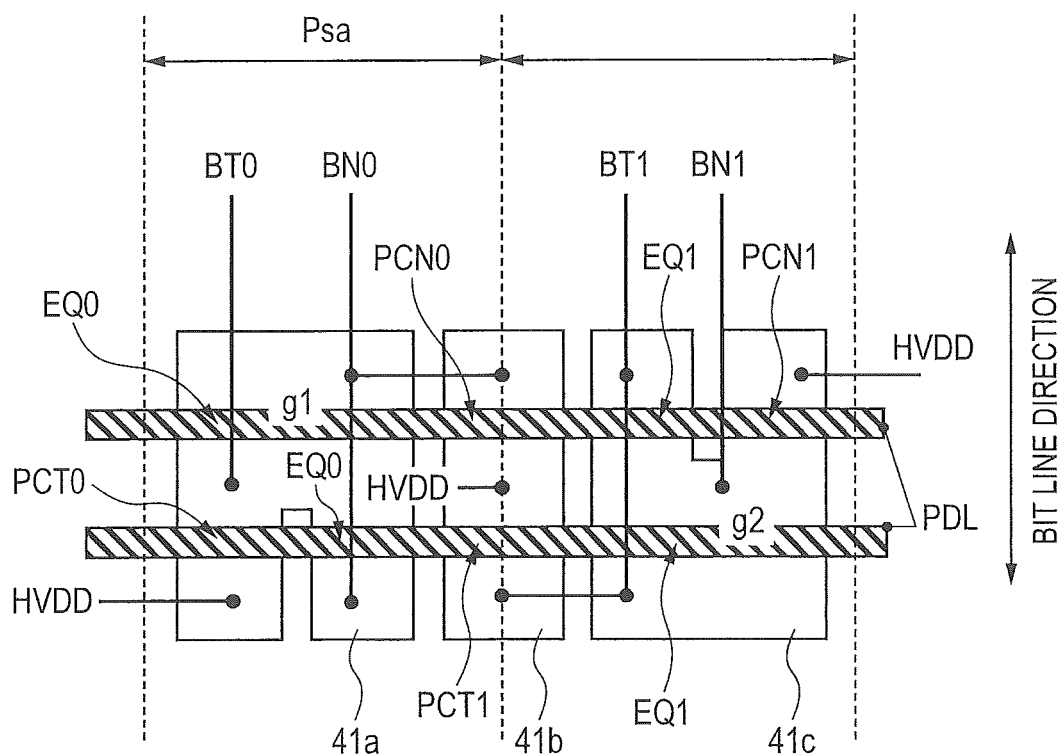
FIG. 21 is a layout view illustrating an example of arrangement of transistors in a precharge portion of a sense amplifier according to a modification 1 of the embodiment 3.

FIG. 21 is a layout illustrating Modification 1 of transistor arrangement of a precharge portion 22. In FIG. 21, three diffusion layers 41a to 41c are disposed. The diffusion layer 41b is made narrower than the diffusion layers 41a and 41c. Further, two linear gates g1 and g2 are disposed in the precharge portion 22. In FIG. 21, since the diffusion layer 41 is not isolated in the longitudinal direction and the gates g1 and g2 are in upper and lower two stages configuration, the height of the circuit can be reduced.

The diffusion layer 41a corresponds to a precharging transistor PCT0 and an equalizing transistor EQ0. The diffusion layer 41b corresponds to a precharging transistor PCN0 and a precharging transistor PCT1. The diffusion layer 41c corresponds to a precharging transistor PCN1 and an equalizing transistor EQ1. The transistor layout is rotationally symmetric.

The equalizing transistor EQ0, the precharging transistor PCN0, the equalizing transistor EQ1, and the precharging transistor PCN1 share the gate g1 in the upper stage. The precharging transistor PCT0, the equalizing transistor EQ0, the precharging transistor PCT1 and the equalizing transistor EQ1 share the gate g2 in the lower stage.

Accordingly, the equalizing transistor EQ0 comprises two transistors in parallel connection disposed in the diffusion layer 41a. The equalizing transistor EQ0 is formed of a transistor having a gate width W about identical with that of the precharging transistors PCT and PCN and a transistor of a larger gate width than that of the precharging transistors PCT and PCN. In the equalizing transistor EQ0, a transistor of a wide gate width W is disposed in the upper stage and a transistor of a narrow gate width W is disposed in the lower stage. In the same manner, the equalizing transistor EQ1 comprises two transistors in parallel connection disposed in the diffusion layer 41c. In the equalizing transistor EQ1, a transistor of a narrow gate width W is disposed in the upper stage and a transistor of a wide gate width W is disposed in the lower stage.

The precharging transistor PCN0 and the precharging transistor PCT1 are allocated to the diffusion layer 41b. The precharging transistors PCN0 and PCT1 are disposed in upper and lower two stages. In the two precharging transistors PCN0 and PCN1, a diffusion layer 41b supplied with a precharge potential HVDD is used in common. Further, the precharging transistor PCT has a gate width W about identical with that of the precharging transistor PCN. The gate width W of the precharging transistors PCN and PCT is about identical with that of a transistor having a narrower gate width W of the equalizing transistors EQ0 in the upper and lower two stages.

With such a configuration, the gate width W of the equalizing transistor EQ can be made larger than the SA pitch Psa. The arrangement direction of the gate g is made uniform by using only the linear shape gate g. Accordingly, this embodiment provides a layout that can be stabilized easily against scattering in view of the device manufacture and high yield can be expected. The pitch of the precharge portion 22 is twice the SA pitch Psa. Accordingly, the area can be reduced in the same manner as described previously.

(Modification 2 of Precharge Portion 22)

Figure 22:
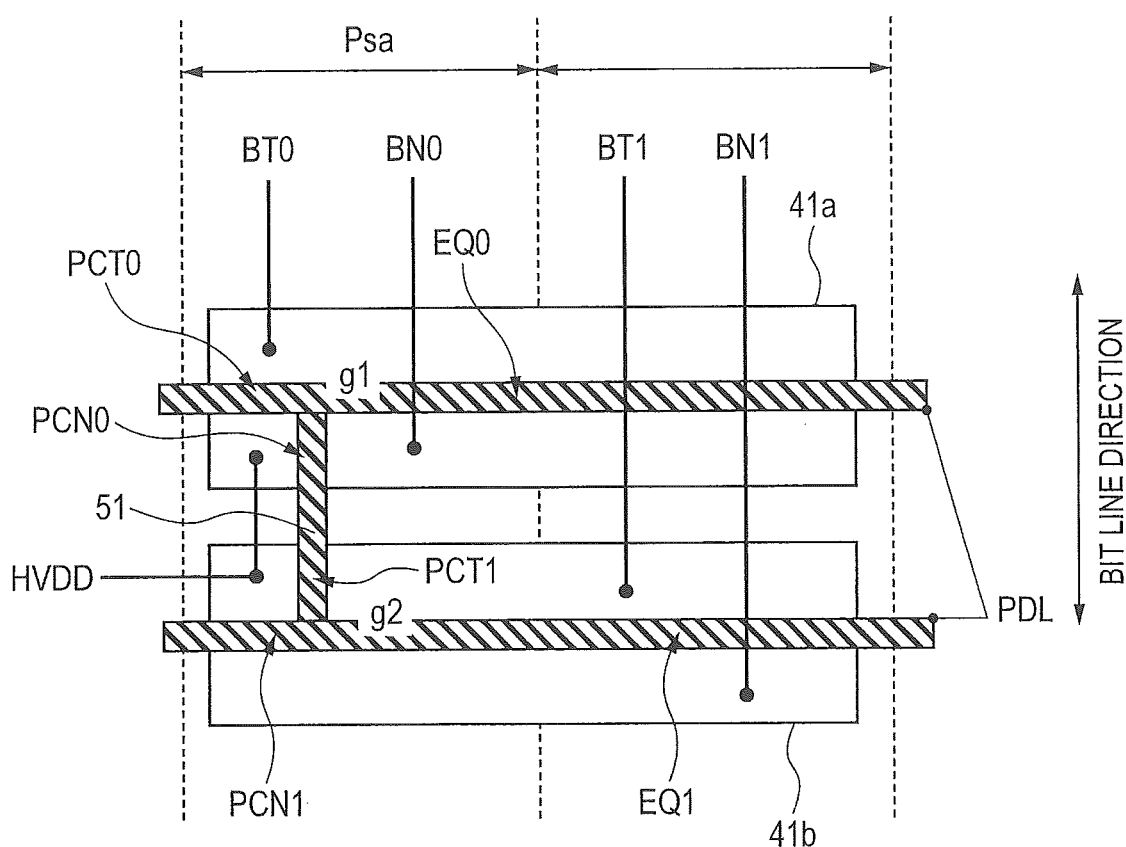
FIG. 22 is a layout view illustrating an example of arrangement of transistors in a precharge portion of a sense amplifier according to a modification 2 of the embodiment 3.

FIG. 22 is a layout illustrating Modification 2 of a transistor arrangement in precharge portion 22. In FIG. 22, two diffusion layer 41a and 41b are disposed. The diffusion layer 41a and 41b are disposed in upper and lower two stages. Further, a longitudinal gate 51 formed along the bit line direction is provided. In this embodiment, the gates g1 and g2 in the upper and lower two stages are connected by the longitudinal gate 51. The longitudinal gate 51 extends from the diffusion layer 41a to the diffusion layer 41b in the direction of the bit line. The longitudinal gate 51 is disposed near the left end of the diffusion layers 41a and 41b.

The longitudinal gate 51 serves as the gate of the precharging transistors PCN0 and PCT1. Then, in the gate g1 in the first stage, a portion left to the longitudinal gate 51 serves as a gate for the precharging transistor PCT0. In the gate g2 in the second stage, a portion left to the longitudinal gate 51 serves as a precharging transistor PCN1. Gates g1 and g2 on the right of the longitudinal gate 51 serve as the gates for the equalizing transistors EQ0 and EQ1 respectively. Since the position of the longitudinal direction 51 is in right to left asymmetric, the gate width of the equalizing transistor EQ can be wider than that of the precharging transistors PCT and PCN. That is, the gate width W of the equalizing transistor EQ is larger than the SA pitch Psa and can be enlarged about twice of the SA pitch Psa.

In the layout of FIG. 22, a gate corresponding to the diffusion layer 41a is in a T-shaped configuration. In the same manner, the gate corresponding to the diffusion layer 41b is in a T-shaped configuration. Then, in this configuration, two gates g1 and g2 in the lateral direction are connected by the longitudinal gate 51. The gate can be formed into a T-shaped configuration by providing the longitudinal gate 51. Accordingly, the area does not increase by the gate protrusion in the direction of the height. Further, in FIG. 22, since the diffusion layer 41 is not isolated in the bit line direction and the gates g1 and g2 are in an upper and lower two stage configuration, the height in the bit line direction can be decreased.

The layout for the precharge portion 22 illustrated in FIG. 9 can be modified to the layout illustrated in any one of FIG. 20 to FIG. 22. Alternatively, the layout of the precharge portion 22 illustrated in FIG. 20 to FIG. 22 may also be combined with the layout of the PMOS pair 25 illustrated in FIG. 10 to FIG. 12 or the layout of the Y switch portion 23 illustrated in FIG. 16 to FIG. 19. The pitch of the precharge portion 22 is twice the SA pitch Psa. Accordingly, the area can be reduced in the same manner as described above.

Embodiment 4

Layout of Sense Amplifier

Figure 23:
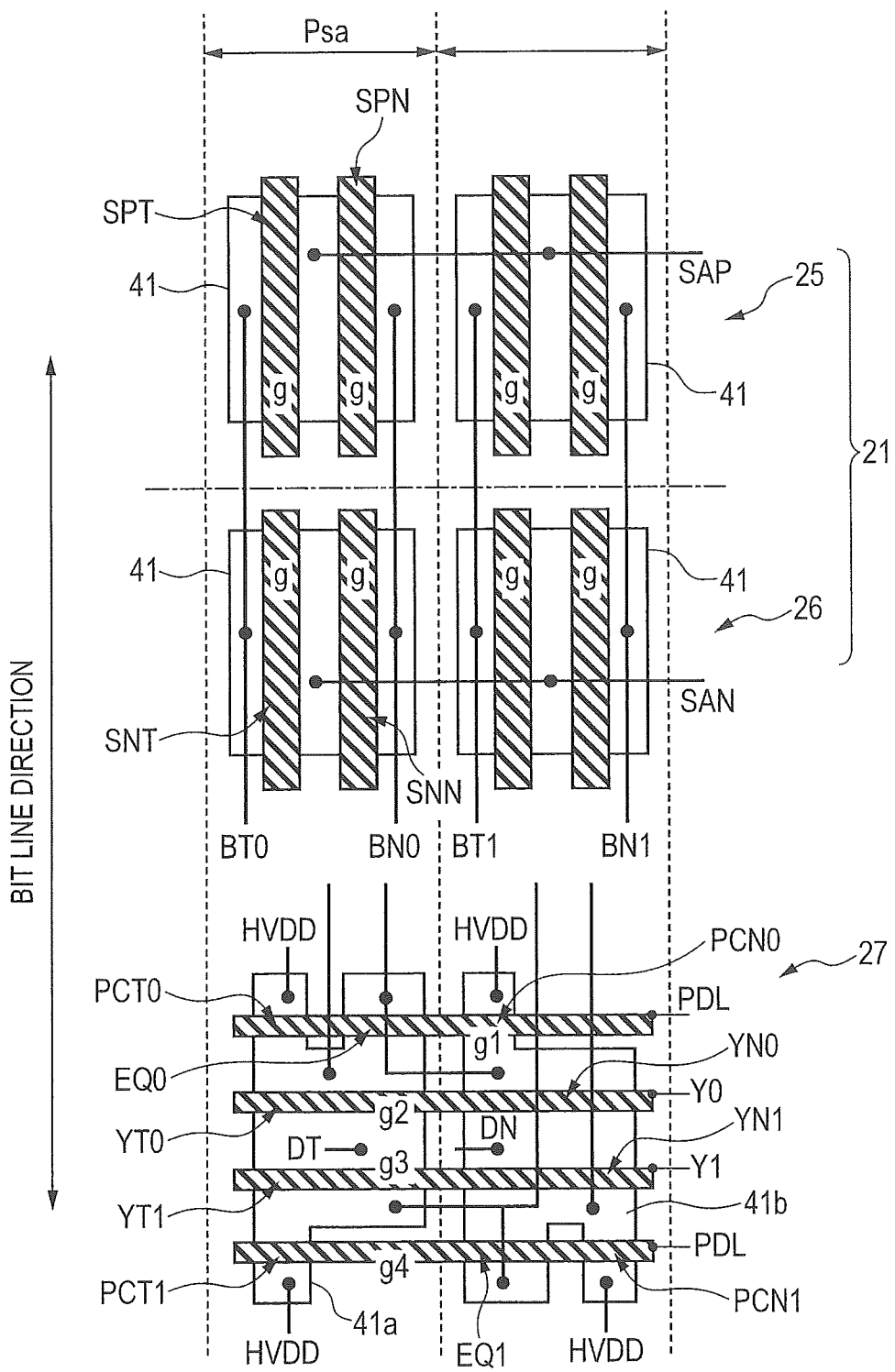
FIG. 23 is a layout view illustrating an example of arrangement of transistors of a sense amplifier according to an embodiment 4.

The configuration of the semiconductor memory according to Embodiment 4 is to be described with reference to FIG. 23. FIG. 23 illustrates a layout of a sense amplifier 12. For contents identical with those of Embodiments 1 to 3, description is to be omitted.

In the layout of FIG. 23, the precharge portion 22 and the Y switch portion 23 described above are integrated. In the following description, a portion in which the precharge portion 22 and the Y switch portion 23 are integrated is referred to as a YSW/PRE portion 27. A PMOS pair 25, an NMOS pair 26, and a YSW/PRE portion 27 are juxtaposed in a bit line direction. FIG. 23 illustrates a transistor layout of two SA pitches Psa. Since the PMOS pair 25 and the NMOS pair 26 are identical with those of FIG. 9, description therefor is to be omitted.

For example, in a low VDD generation at VDD 1.2 V, since the precharge voltage VHDD is ½ VDD, when precharging transistors PCT and PCN, and an equalizing transistor EQ are turned-on, the voltage Vg between the gate and the drain (or source) is ½ VDD and the on performance is extremely insufficient. A countermeasure for reliably precharging the bit line of DRAM includes the followings methods.

One of the methods is to increase the potential of a precharge signal line VDL to higher than a power source voltage VDD but this requires a high voltage withstanding transistor of increasing the film thickness of the gate of the precharging transistors PCT and PCN and the equalizing transistor EQ. However, it has recently become possible to use a core transistor equal with the switching transistors YT and YN. The other method is a GND potential precharge circuitry. In this case, increase of the potential of the precharge signal VDL is not necessary. Since a core transistor identical with the switching transistors YT and YN can be used in any of the methods, an integration layout design technique has become important.

In FIG. 23, a YSW/PRE portion 27 includes two diffusion layers 41a and 41b. In the YSW/PRE portion 27, a diffusion layer 41a is disposed in the SA pitch Psa on the left and a diffusion layer 41b is disposed in the SA pitch Psa on the right. The SA pitch Psa on the left corresponds to SA of a bit line pair BT0 and BN0 and the SA pitch Psa on the right corresponds to SA of a bit line pair BT1 and BN2. The layout of the diffusion layer 41a is rotationally symmetric with respect to the diffusion layer 41b. A precharging transistor PCT0, an equalizing transistor EQ0, a precharging transistor PCN1, and switching transistors YT0 and YT1 share the diffusion layer 41a. That is, the integrally formed diffusion layer 41a corresponds to the precharging transistors PCT0 and PCT1, the equalizing transistor EQ0, and the switching transistors YT0 and YT1. In the same manner, precharging transistors PCN1 and PCN0, an equalizing transistor EQ1, and switching transistors YN0 and YN1 share the diffusion layer 41b.

The YSW/PRE portion 27 includes four gate g1 to gate g4. They are referred to as gate g1, gate g2, gate g3, and gate g4 orderly from the uppermost stage, that is, gate g on the side of the NMOS pair 26. The gate 1 is connected with a precharge signal line PDL of the bit line pair BT0 and BN0. The gate g2 is connected with a column selection signal line Y0. The gate g3 is connected with a column selection signal line Y1. The gate g4 is connected with the precharge signal line PDL of the bit line pair BT1 and BN1. The four gates g1 to gate g4 are linear electrodes along the lateral direction respectively. Each of the gate g1 to gate g4 extends to the adjacent sense amplifier pitch Psa. That is, each of the gates g1 to gate g4 is formed being protruded to the adjacent sense amplifier pitch Psa. Each of the gate g1 to gate g4 is formed from the diffusion layer 41a to the diffusion layer 41b. Each of the gate g1 to gate g4 has a length about twice the SA pitch Psa and overrides the diffusion layers 41a and 41b.

The switching transistors YT0 and YT1 are disposed in the SA pitch Psa on the left. The switching transistors YN0 and YN1 are disposed in the SA pitch Psa on the right. The gate g2 is formed overriding the diffusion layers 41a and 41b in the lateral direction and a common column selection signal is supplied to the switching transistors YT0 and YN0. The gate g3 is formed overriding the diffusion layers 41a and 41b in the lateral direction, and a common column selection signal is supplied to the switching transistors YT1 and YN1.

The precharging transistor PCT0 and the equalizing transistor EQ0 are disposed in the SA pitch Psa on the left. The precharging transistor PCN0 is disposed in the SA pitch Psa on the right. Then, the precharging transistor PCT0, the PCN0, and the equalizing transistor EQ0 share one linear gate g1. In the same manner, the precharging transistor PCN1 and the equalizing transistor EQ1 are disposed in the SA pitch Psa on the right. The precharging transistor PCT1 is disposed in the SA pitch Psa on the left. Then, the precharging transistors PCT1 and PCN1 and the equalizing transistor EQ1 share one linear gate g4.

The gate g2 of the switching transistors YT0 and YN0, and the gate g3 of the switching transistors YT1 and YN1 are disposed at an identical position in the lateral direction and are spaced apart in the bit line direction. The gate g1 of the precharging transistors PCT0 and PCN0 and the equalizing transistor EQ0, and the gate g4 of the precharging transistors PCT1 and PCN1, and the equalizing transistor EQ1 are disposed at an identical position in the lateral direction and are spaced apart in the bit line direction. Four gates g1 to g4 are disposed each at an identical position in the lateral direction and are spaced apart in the bit line direction. Then, two gates g2 and gate g3 of the switching transistors are disposed between the two gates g1 and g4 of the precharging transistors in the bit line direction.

The diffusion layer connected with the common bus line of the switching transistor YT0 and the diffusion layer connected with a common bus line of the switching transistor YT1 in the bit line direction are shared. A common bus line DT is connected to the shared diffusion layer 41a. In the same manner, a diffusion layer connected with the common bus line of the switching transistor YN0 and the diffusion layer connected with the common bus line of the switching transistor YN1 in the bit line direction are shared. A common bus line DT is connected to the shared diffusion layer 41b.

The diffusion layers 41a and 41b are extended vertically, in which the precharging transistors PCT and PCN and the equalizing transistor EQ are disposed. For example, the precharging transistor PCT0 and the equalizing transistor EQ0 are disposed above the switching transistor YT0 and the precharging transistor PCT1 is disposed below the switching transistor YT1. The switching transistors YT0 and YT1, the precharging transistors PCT0 and PCT1, and the equalizing transistor EQ0 share the diffusion layer. Specifically, the diffusion layer connected with the bit line BT0 of the switching transistor YT0 and the diffusion layer connected with BT0 of the precharging transistor PCT0 and equalizing transistor EQ0 share the diffusion layer 41a. Further, also the diffusion layer 41b has the same layout. Accordingly, the diffusion layer 41a is used in common with the switching transistors YT0 and YT1, the precharging transistors PCT0 and PCN1, and the equalizing transistor EQ0.

With such a configuration, ten transistors disposed in the two SAs can be laid out in the two diffusion layers 41a and 41b. Thus, the device isolation region of the diffusion layer 41 can be decreased and the gate width W can be widened at a small area. Further, since the four linear gate g1 to gate g4 serve for the ten transistors disposed to the two SAs, increase of the SA height can be suppressed. The arrangement direction of the gate g is made uniform by using only the linear shape gate g. Accordingly, this embodiment provides a layout that can be stabilized easily against scattering in view of the device manufacture and high yield can be expected. The pitch of the YSW/PRE portion 27 is twice the SA pitch Psa. Accordingly, the area can be reduced in the same manner as described above. Further, the diffusion layer 41 is integrated for the switching transistor and the precharging transistor. Thus, efficient layout can be attained and the area can be reduced. A efficient layout can be provided by sharing the diffusion layer 41 between the side of the bit line of the equalizing transistor EQ and the side of the bit line of the switching transistor. Further, the connection points of the gate g and the connection interconnect can be decreased by sharing the gate g for the plurality of transistors. Further, the device isolation region can be decreased by sharing the diffusion layer 41. This enables to obtain an efficient layout to reduce the area.

(Modification 1 of Layout of YSW/PRE Portion 27)

Figure 24:
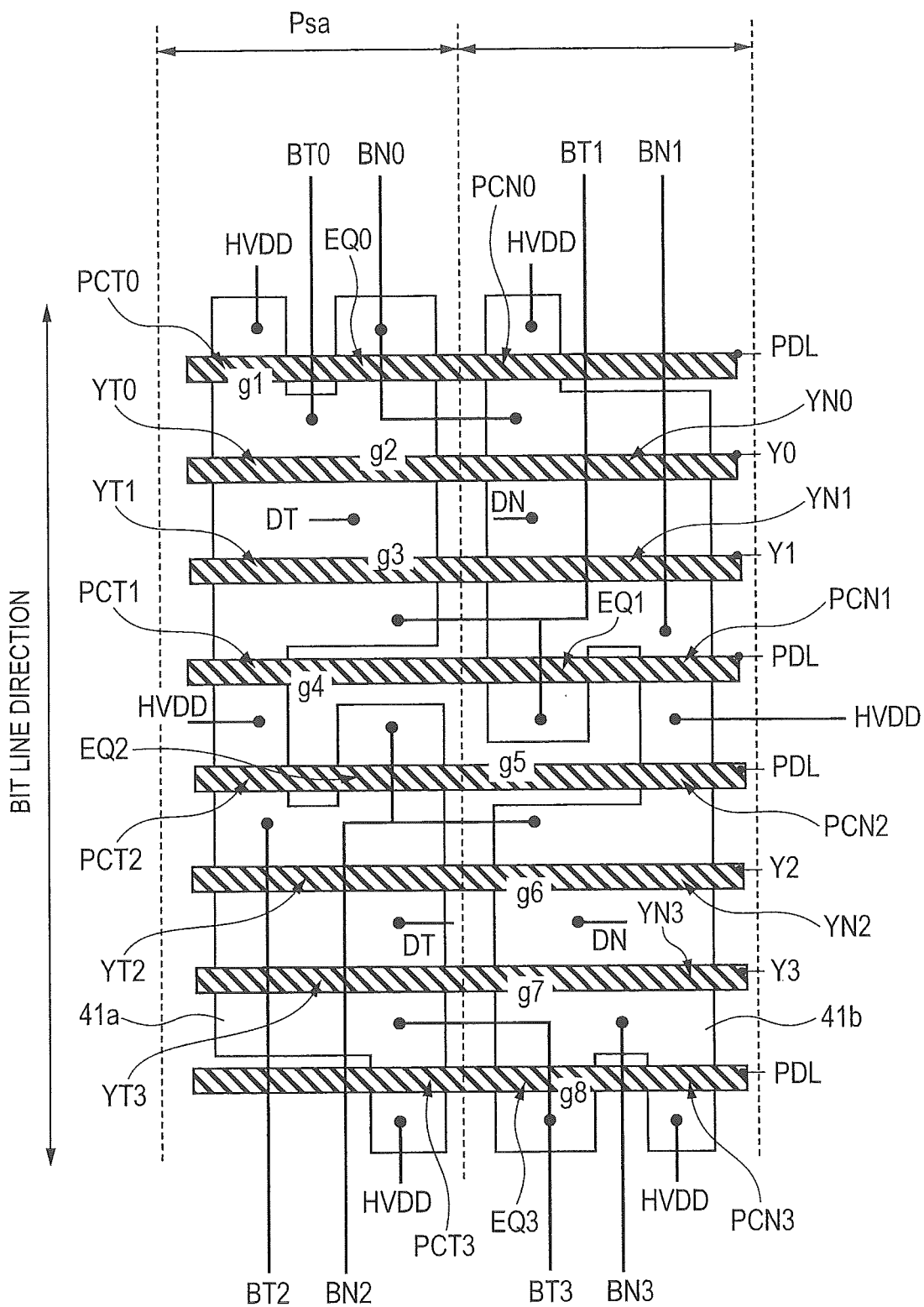
FIG. 24 is a layout view illustrating an example of an arrangement of transistors in a YSW/PRE portion according to a modification 1 of the embodiment 4.

Modification 1 of the YSW/PRE portion 27 in which the precharge portion and Y switch portion are integrated is to be described with reference to FIG. 24. FIG. 24 is view illustrating an example of the layout for the transistors in the YSW/PRE portion. For portions identical with those of FIG. 23, description is to be omitted optionally. FIG. 24 illustrates an example of disposing bit lines so as to be supplied to the YSW/PRE portion 27 from above and below each by four in the open bit system. Further, FIG. 24 illustrates an example in which four pairs of bit line pair BT0 and BN0 to bit line pair BT3 and BN3 are arranged at a pitch twice the SA pitch Psa.

In FIG. 24, diffusion layers 41a and 41b are disposed in a range twice the SA pitch Psa in the YSW/PRE portion 27. The diffusion layer 41a is disposed in the SA pitch Psa on the left. The diffusion layer 41b is disposed in the SA pitch Psa on the right. The layout for the diffusion layer 41a is rotationally symmetric with respect to the diffusion layer 41b. The SA pitch Psa on the left corresponds to SA of the bit line pair BT0 and BN0, and the bit line pair BT2 and BN2. The SA pitch Psa on the right corresponds to SA of the bit line pair BT1 and BN1, and the bit line pair BT3 and BN3.

Further, eight gates g are disposed in the YSW/PRE portion 27. They are referred to as gate g1, gate g2, gate g3, gate g4, gate g5, gate g6, gate g7, and gate g8 orderly from the gate g in the uppermost stage. The gate g1 is connected to a precharge signal line PDL of the bit line pair BT0 and BN0. The gate g2 is connected to a column selection signal line Y0. The gate g3 is connected to a column selection signal Y1. The gate g4 is connected to a precharge signal line PDL of the bit line pair BT1 and BN1. The gate g5 is connected to a precharge signal line PDL of the bit line pair BT2 and BN2, and the gate g6 is connected to a column selection signal line Y2. The gate g7 is connected to a column selection signal line Y3. The gate g8 is connected to the precharge signal line PDL of the bit line pair BT3 and BN3.

In the layout of FIG. 24, two diffusion layers 41a and 41b are used for four SAs. That is, the diffusion layer 41 of the YSW/PRE portion 27 is formed integrally between the upper and lower SA amplifiers. Accordingly, the height can be reduced than in a case of merely disposing the layout of FIG. 23 in two stages. That is, the device isolation region can be saved to the upper and lower SA diffusion layers 41 to efficiently obtain the layout.

For example, switching transistors YT0 and YT3 correspond to an integrally formed diffusion layer 41a. Further, four precharging transistors PCT are disposed in the diffusion layer 41a. Equalizing transistors EQ0 and EQ2 are disposed in the diffusion layer 41a. In the same manner, switching transistors YN0 to YN3 are disposed in an integrally formed diffusion layer 41b. Four precharging transistors PCN are disposed in the diffusion layer 41b. Equalizing transistors EQ1 and EQ3 are disposed in the diffusion layer 41b. One diffusion layer 41 carry ten transistors.

Further, the gate g4 supplied with the precharge signal line PDL of the bit line pair BT1 and BN1 and the gate g5 supplied with the precharge signal line PDL of the bit line pair BT2 and BL2 are disposed continuously. Then, the precharging transistor PCT1 and the precharging transistor PCT2 share the diffusion layer supplied with a precharge voltage HVDD. In the same manner, the precharging transistor PCN1 and the precharging transistor PCN2 share a diffusion layer supplied with a precharge voltage HVDD. Thus, the number of connection contacts for the precharge voltage HVDD can be decreased to reduce the height. Further, the equalizing transistor EQ2 is disposed to the diffusion layer 41a and the equalizing transistor EQ1 is disposed in the diffusion layer 41b.

Further, the gate width W of the equalizing transistor EQ and the precharging transistor PCT is set so as to be accommodated in the gate width W of the switching transistor YT. For example, the total width of the gate width W of the precharging transistor PCT2 and the equalizing transistor EQ2 is accommodated within the gate width W of the switching transistor YT2. The gate width W of the switching transistor YT has a space for the equalizing transistor EQ in addition to the precharging transistor PCT. In the same manner, the gate width W of the equalizing transistor EQ and the precharging transistor PCN is set so as to be accommodated within the gate width W of the switching transistor YN. Accordingly, the equalizing transistor EQ can be disposed in the lateral direction of the precharging transistor PCT or the precharging transistor PCN.

Such layout enables a compact layout of high device density. The direction of disposing the gate g is made uniform by using only the linear shape gate g. Accordingly, this embodiment provides a layout that can be stabilized easily against scattering in view of the device manufacture and a high yield can be expected. The pitch of the YSW/PRE portion 27 is twice the SA pitch Psa. Accordingly, the area can be reduced in the same manner as described above.

(Modification 2 of Layout in YSW/PRE Portion 27)

Figure 25:
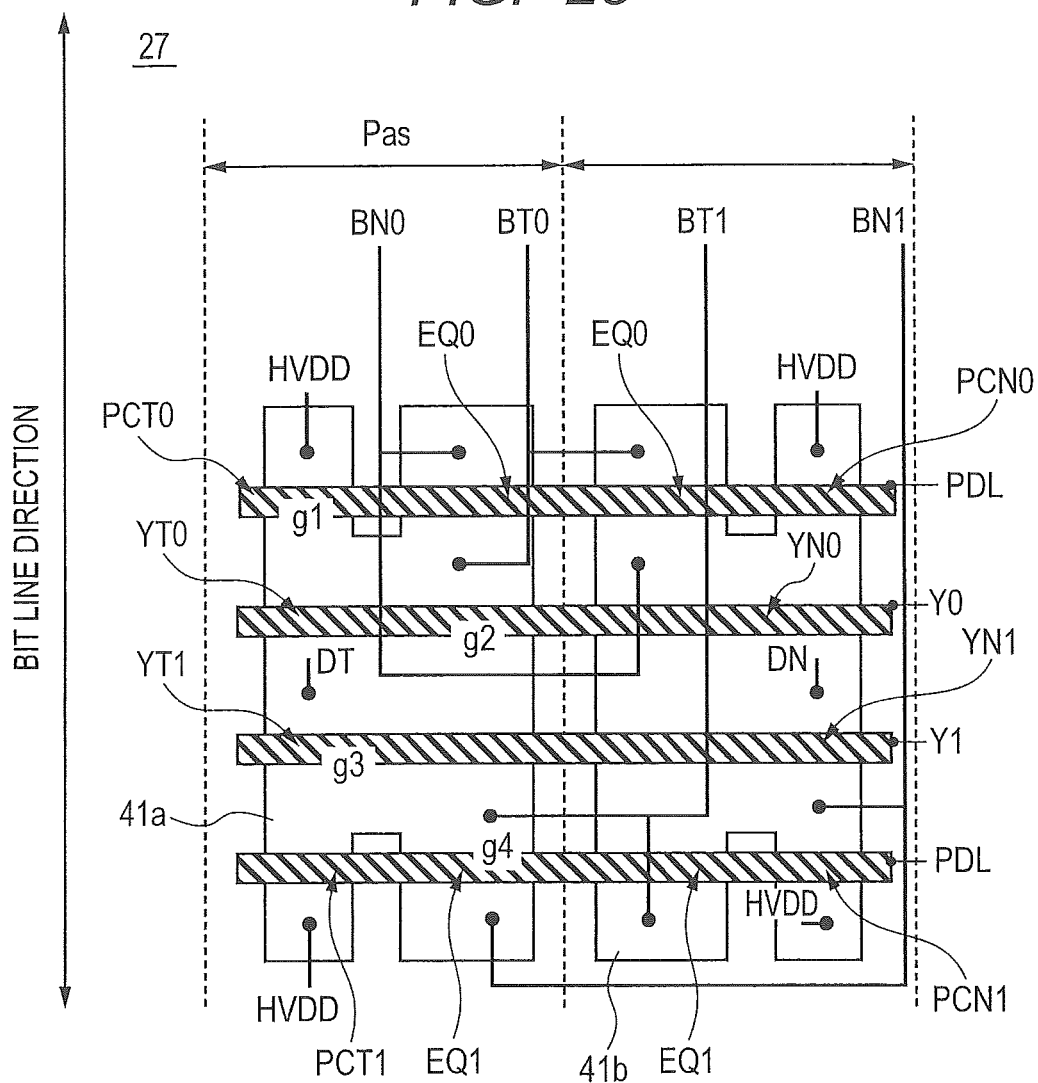
FIG. 25 is a layout view illustrating an example of an arrangement of transistors in a YSW/PRE portion according to a modification 2 of the embodiment 4.

Modification 2 of a YSW/PRE portion 27 in which a precharge portion and a Y switch portion are integrated is to be described with reference to FIG. 25. FIG. 25 is a view illustrating an example of a layout of a transistor in the YSW/PRE portion 27. In FIG. 25, the arrangement of the equalizing transistor EQ is modified relative to the configuration of FIG. 23. For the portions identical with those in FIG. 23, description is to be optionally omitted.

In FIG. 25, an equalizing transistor EQ1 is disposed in a diffusion layer 41a. An equalizing transistor EQ1 is disposed below a switching transistor YT1. In the same manner, an equalizing transistor EQ0 is disposed in a diffusion layer 41b. The equalizing transistor EQ0 is disposed below a switching transistor YN0. The equalizing transistor EQ0 in the diffusion layer 41a and the equalizing transistor EQ0 in the diffusion layer 41b are connected in parallel. The equalizing transistor EQ1 in the diffusion layer 41a and the equalizing transistor EQ1 in the diffusion layer 41b are connected in parallel. With such a configuration, the substantial gate width W of the equalizing transistor EQ can be widened. Accordingly, the performance of the equalizing transistor EQ can be improved.

A connection point between the bit line BT0 and the diffusion layer 41b and a connection point between the bit line BN1 and the diffusion layer 41a are added to FIG. 23. While the signal connection is somewhat complicated compared with that in FIG. 23, the performance of the equalizing transistor EQ can be enhanced without increasing the height of SA. The arrangement direction of the gate g is made uniform by using only the linear shape gate g. Accordingly, this embodiment provides a layout that can be stabilized easily against scattering in view of the device manufacture and high yield can be expected.

Embodiment 5

Also in this embodiment, a precharge portion and a Y switch portion are integrated in the same manner as in the Embodiment 4. For the contents identical with those of the Embodiments 1 to 4, description is to be omitted. The Embodiment 5 uses a layout capable of easily reducing the SA height along with refinement of device design criteria.

Figure 26:
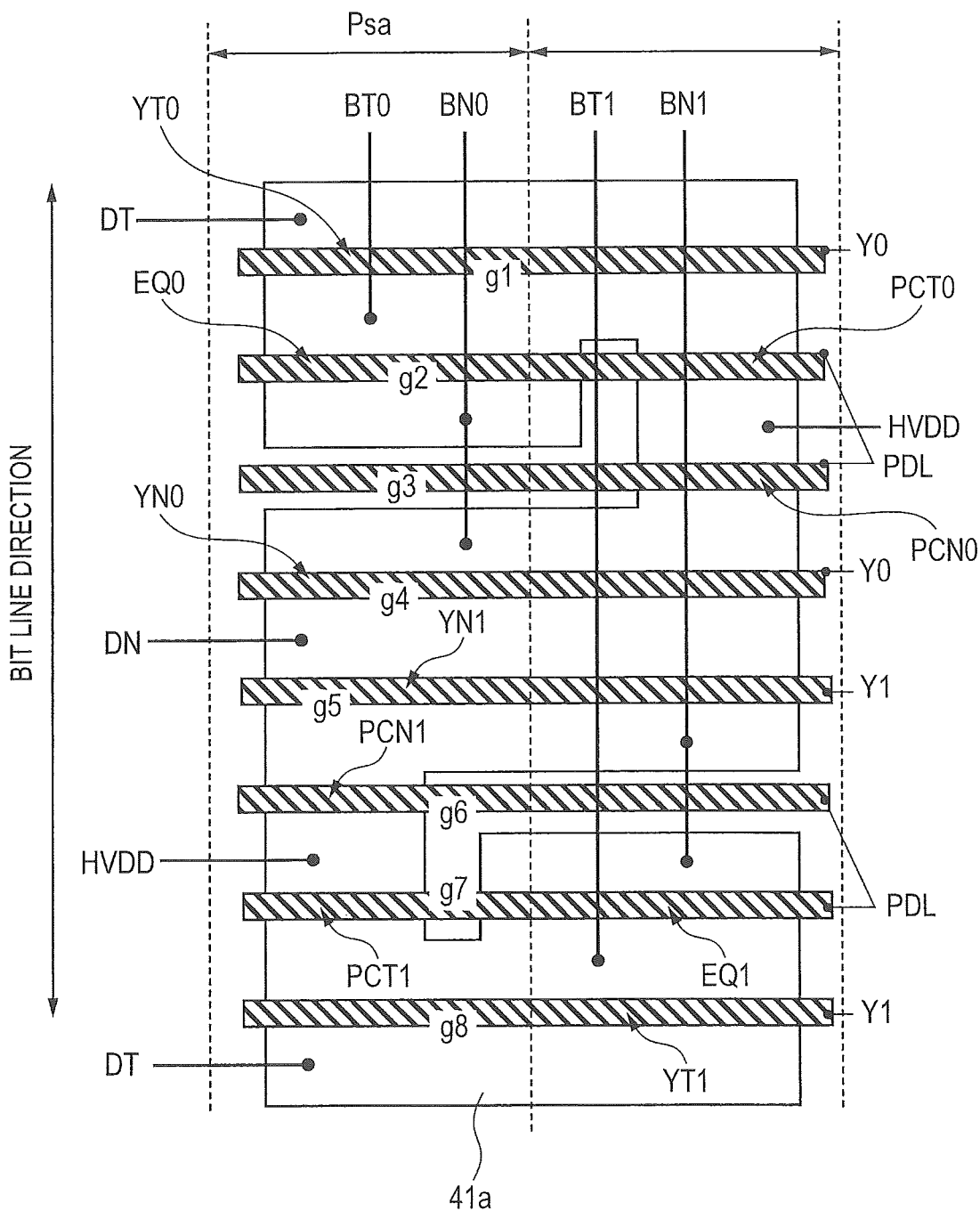
FIG. 26 is a layout view illustrating an example of arrangement of transistors in a YSW/PRE portion according to an embodiment 5.

The layout of transistors in a YSW/PRE portion 27 according to this embodiment is to be described with reference to FIG. 26. For the configurations identical with those in the Embodiments 1 to 4, description is to be omitted optionally. For example, since the PMOS pair 25 and the NMOS pair 26 described in any of FIG. 9 to FIG. 12 can be used, description therefor is to be omitted.

The YSW/PRE portion 27 is to be described with reference to FIG. 26. For the contents identical with those in the embodiments described above, description is to be omitted. In FIG. 26, eight gates g1 to g8 are disposed. Each of the gates g1 to g8 is formed linearly along the lateral direction. The gates are referred to as gate g1, gate g2, gate d3, gate g4, gate g5, gate g6, gate g7, and gate g8 orderly from the gate in the uppermost stage. The gate g1 is connected to a column selection signal line Y0. The gate g2 is connected to a precharge signal line PDL. The gate g3 is connected to the precharge signal line PDL. The gate g4 is connected to the column selection signal line Y0. The gate g5 is connected to a column selection signal Y1. The gate g6 is connected to the precharge signal line PDL. The gate g7 is connected to the precharge signal line PDL. The gate g8 is connected to the column selection signal Y1.

Transistors of two SAs are disposed in an integrally formed diffusion layer 41a. Accordingly, the diffusion layer 41a is formed overriding the two SA pitches Psa. The width of the diffusion layer 41a is wider than the SA pitch Psa and formed being protruded to an adjacent pitch Psa. The diffusion layer 41a is rotationally symmetric. Further, also the transistor layout is rotationally symmetry.

A switching transistor YT0 and a switching transistor YN0 correspond to gates g in different stages. The gate g1 in the first stage corresponds to the switching transistor YT0 and the gate g4 in the fourth stage corresponds to the switching transistor YN0. In the same manner, a switching transistor YT1 and a switching transistor YN1 correspond to gates g in different stages. The gate g5 in the fifth stage corresponds to the switching transistor YN1 and the gate g8 in the eighth stage corresponds to the switching transistor YT1. Thus, since the switching transistor YT and the switching transistor YN are not juxtaposed in the lateral direction, the gate width W of the switching transistors YT and YN can be widened. In this embodiment, each of the switching transistors YT and YN has a gate width W about twice the SA pitch Psa. Thus, the performance of the switching transistors YT and YN can be improved.

The gates g2 and g3 of an equalizing transistor EQ0 and precharging transistors PCT0 and PCN0 are disposed between the gate g1 of the switching transistor YT0 and the gate g4 of the switching transistor YN0. The precharging transistor PCT0 and the equalizing transistor EQ0 are juxtaposed in the lateral direction. Two transistors, i.e., the equalizing transistor EQ0 and the precharging transistor PCT0 are juxtaposed in a range twice the SA pitch Psa. Also the gates g6 and g7 of the equalizing transistor EQ1 and the precharging transistors PCT1 and PCN1 are disposed in the same manner between the gate g5 in the fifth stage and the gate g8 in the eighth stage. Accordingly, the performance of the precharging transistors PCT and PCN and the equalizing transistor EQ can be improved. Further, the gate width W of the equalizing transistor EQ is wider than the gate width W of the precharging transistors PCT and PCN. Thus, the performance of the equalizing transistor EQ can be improved.

Further, the switching transistor YN0 and the switching transistor YN1 share a common bias line DN. This can decrease the number of contacts. Further, since the integral diffusion layer 41a is used for the two SAs, the device isolation region can be decreased. Thus, the size in the direction of the height can be reduced further. The arrangement direction of gate g is made uniform by using only the linear shape gate g. Accordingly, this embodiment provides a layout that can be stabilized easily against scattering in view of the device manufacture and high yield can be expected. The pitch of the YSW/PRE portion 27 is twice the SA pitch Psa. Accordingly, the area can be reduced in the same manner as described above.

(Modification 1 of YSW/PRE Portion 27)

Figure 27:
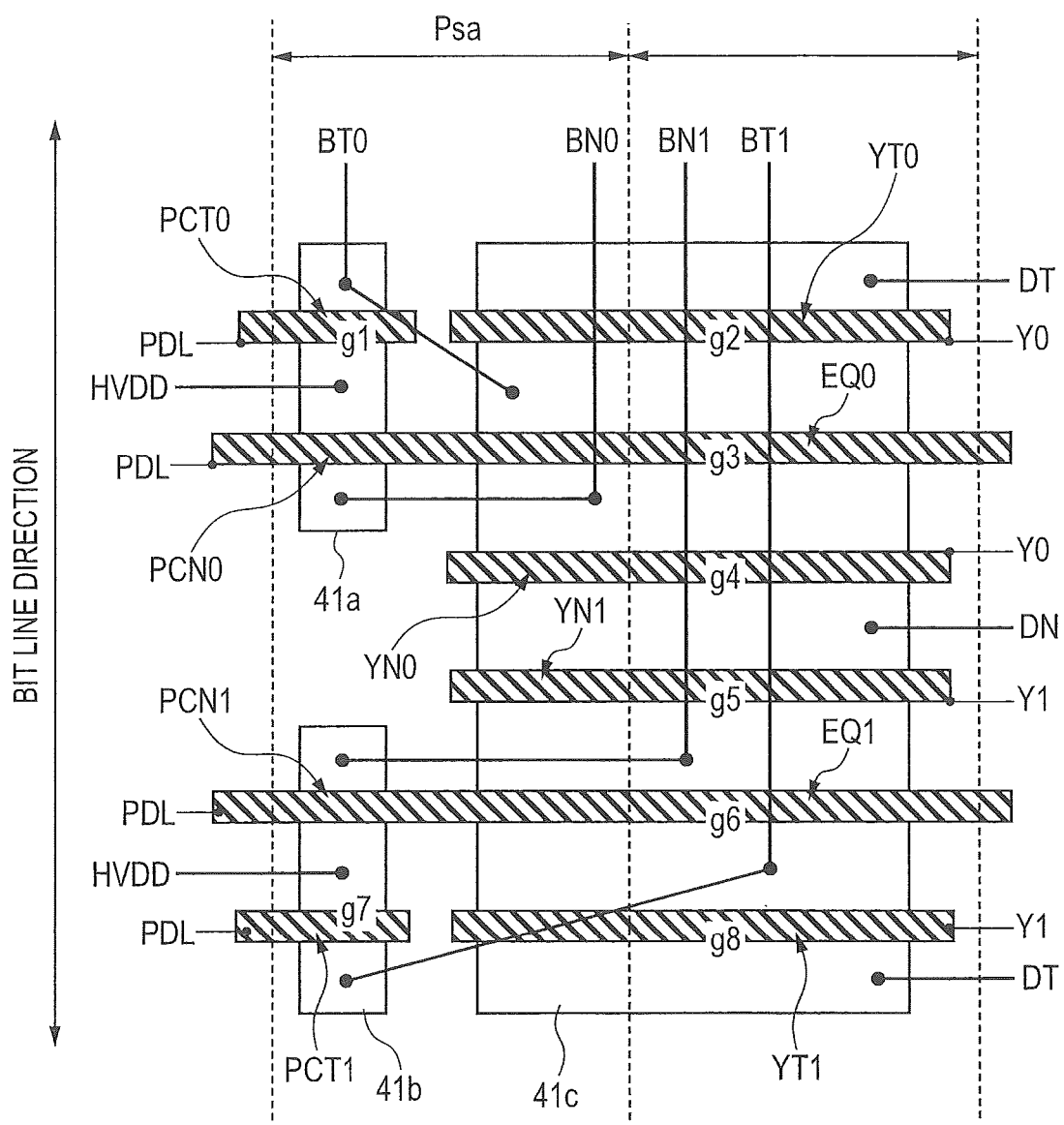
FIG. 27 is a layout view illustrating an example arrangement of transistors of a YSW/PRE portion according to a modification 1 of the embodiment 5.

Modification 1 of the YSW/PRE portion 27 is to be described with reference to FIG. 27. For the contents identical with those of the layout described above, description is to be omitted. In FIG. 27, eight gates g1 to g8 are disposed. Each of the gates g1 to g8 is formed linearly along the lateral direction. In the uppermost stage, two gates g1 and g2 are juxtaposed in the lateral direction. In the lowermost stage, two gates g7 and g8 are juxtaposed in the lateral direction. Accordingly, the eight gates g1 to g8 are disposed in six stages. A precharge signal line PDL is connected to the gate g1 in the first stage and a column selection signal line Y0 is connected to the other gate g2 in the first stage. The gate g3 is connected to the precharge signal line PDL, the gate g4 is connected to the column selection signal line Y0. The gate g5 is connected to a column selection signal line Y1. The gate g6 is connected to the precharge signal line PDL. The precharge signal line PDL is connected to the gate g7 and the column selection signal line Y1 is connected to the other gate g8 in the sixth stage.

In FIG. 27, three diffusion layers 41a to 41c are disposed in two SA pitches Psa. Each of the diffusion layers 41a to 41c is formed into a rectangular shape. The diffusion layers 41a and 41b are disposed in the SA pitch Psa corresponding to a bit line pair BT0 and BN0. That is, the width of the diffusion layers 41a and 41b in the lateral direction is smaller than the SA pitch Psa. The diffusion layer 41c is formed at a width wider than the SA pitch and protrudes to an adjacent SA pitch.

The diffusion layer 41c is disposed over the two SA pitches Psa. The width of the diffusion layer 41c in the lateral direction is larger than the SA pitch Psa.

The diffusion layer 41a corresponds to precharging transistors PCT0 and PCN0. The precharging transistors PCT0 and PCN0 share the diffusion layer 41a connected with a precharge voltage HVDD. The diffusion layer 41b corresponds to precharging transistors PCT1 and PCN1. The precharging transistors PCT1 and PCN1 share the diffusion layer 41b connected to the precharge voltage HVDD. The diffusion layer 41a and the diffusion layer 41b are disposed in upper and lower two stages.

The diffusion layer 41c has an area larger than the total area of the diffusion layer 41a and the diffusion layer 41b. The gates g2, g3, g4, g5, g6, and g8 override the diffusion layer 41c. The gates g1 and g3 override the diffusion layer 41a. The gates g6 and g7 override the diffusion layer 41b. The gate g2 corresponds to a switching transistor YT0. The gate g3 corresponds to an equalizing transistor EQ0. The gate g4 corresponds to a switching transistor YN0. The gate g5 corresponds to a switching transistor YN1. The gate g6 corresponds to an equalizing transistor EQ1. The gate g8 corresponds to a switching transistor YT1. The switching transistor YN0 and the switching transistor YN1 share the diffusion layer 41c connected with a common bus line DN.

In this configuration, the diffusion layer 41c extends to the adjacent SA pitch. Accordingly, the gate width W of the equalizing transistor EQ and the switching transistors YT and YN can be wider than the SA pitch Psa. Further, since they can be laid out efficiently, the area can be reduced. The arrangement direction of the gate g is made uniform by using only the linear shape gate g. Accordingly, this embodiment provides a layout that can be stabilized easily against scattering in view of the device manufacture and high yield can be expected. The pitch of the YSW/PRE portion 27 is twice the SA pitch Psa. Accordingly, the area can be reduced in the same manner as described above.

(Modification 2 of YSW/PRE Portion 27)

Figure 28:
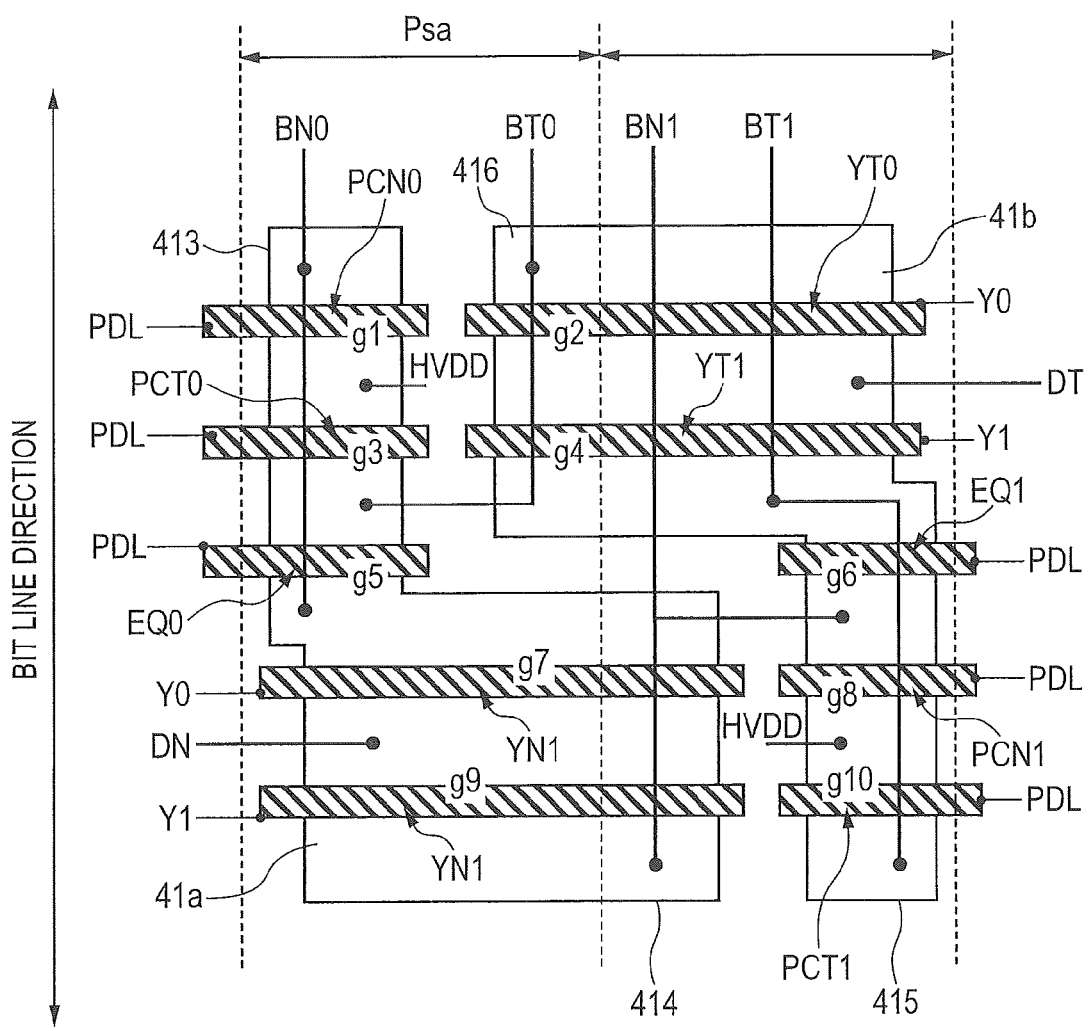
FIG. 28 is a layout view illustrating an example of an arrangement of transistors in a YSW/PRE portion according to a modification 2 of the embodiment 5.

Modification 2 of the YSW/PRE portion 27 is to be described with reference to FIG. 28. For contents identical with those of the layout described above, description is to be omitted. In FIG. 28, ten gates g1 to g10 are disposed. Each of the gates g is formed linearly along the lateral direction. In each of the stages, two gates g are juxtaposed in the lateral direction. Accordingly, ten gates g1 to g10 are disposed in five stages.

In the first stage, the gate g1 is connected to a precharge signal line PDL and the other gate g2 is connected to a column selection signal Y0. In the second stage, the gate g3 is connected to the precharge signal line PDL and the other gate g4 is connected to a column selection signal Y1. In the third stage, the gate g5 is connected to the precharge signal line PDL and the other gate g6 is connected to the precharge signal line PDL. In the fourth stage, the gate g7 is connected to the column selection signal line Y0 and the other gate g8 is connected to the precharge signal line PDL. In the fifth stage, the gate g9 is connected to the column selection signal line Y1 and the other gate g10 is connected to the precharge signal line PDL.

The gate g1 corresponds to a precharging transistor PCN0, and the gate g2 corresponds to a switching transistor YT0. The gate g3 corresponds to a precharging transistor PCT0 and the gate g4 corresponds to a switching transistor YT1. The switching transistor YT1 and the switching transistor YT0 share a diffusion layer connected to a common bus line DT.

The precharging transistor PCT0 and the precharging transistor PCN0 share a diffusion layer connected to a precharge voltage HVDD.

The gate g5 corresponds to an equalizing transistor EQ0 and the gate g6 corresponds to an equalizing transistor EQ1. The gate g7 corresponds to a switching transistor YN0 and the gate g8 corresponds to a precharging transistor PCN1. The gate g9 corresponds to a switching transistor YN1 and the gate g10 corresponds to a precharging transistor PCT1. The switching transistor YN0 and the switching transistor YN1 share a diffusion layer connected with the common bus line DN. The precharging transistor PCT1 and the precharging transistor PCN1 share a diffusion layer connected to the precharging voltage HVDD.

Two diffusion layers 41a and 41b are disposed within a range twice the SA pitch Psa. The diffusion layer 41a is disposed mainly in the SA pitch Psa on the side of the bit line pair BT0 and BN0 and a portion thereof has a wide portion 414 extending to a SA pitch Psa on the side of the bit line pair BT1 and BN1. The diffusion layer 41b is disposed mainly in the SA pitch Psa on the side of the bit line pair BT1 and BN1 and a portion thereof has a wide portion 416 extending to the SA pitch Psa on the side of the bit line pair BT0 and BN0. The diffusion layer 41a has a layout rotationally symmetric with respect to the diffusion layer 41b. Further, the transistor layout is also rotationally symmetric.

In each of the stages, one of the gates g overrides the diffusion layer 41a and the other of the gates g overrides the diffusion layer 41b. A narrow portion 413 of the diffusion layer 41a and a wide portion 416 of the diffusion layer 41b are juxtaposed in the lateral direction, and a narrow portion 415 of the diffusion layer 41b and a wide portion 414 of the diffusion layer 41a are juxtaposed in the lateral direction. The width of the wide portions 414 and 416 in the lateral direction is wider than the SA pitch Psa and the width of the narrow portions 413 and 415 in the lateral direction is narrower than the SA pitch Psa.

The gates g1, g3, and g5 of the precharging transistors PCN0 and PCT0, and the equalizing transistor EQ0 override the narrow portion 413. The gates g10, g8, and g6 of the precharging transistors PCN1 and PCT1, and the equalizing transistor EQ1 override the narrow portion 415. The gates g2 and g4 of the switching transistors YT0 and YT1 override the wide portion 416. The gates g7 and g9 of the switching transistors YN0 and YN1 override the wide portion 414.

With such a configuration, the gate width W of the switching transistors YT and YN can be wider than the SA pitch Psa. Further, the YSW/PRE portion 27 of two SAs can be obtained at a height by five stages of the gates g. Accordingly, the size in the direction of the height can be reduced. The arrangement direction of the gate g is made uniform by using only the linear shape gate g. Accordingly, this embodiment provides a layout that can be stabilized easily against scattering in view of the device manufacture and high yield can be expected. The pitch of the YSW/PRE portion 27 is twice the SA pitch Psa. Accordingly, the area can be reduced in the same manner as described above.

Embodiment 6

Also in this embodiment, a precharge portion and a Y switch portion are integrated in the same manner as in the Embodiments 4 and 5. For contents identical with those in the Embodiments 1 to 5, description is to be omitted. The Embodiment 6 is an example of using a shape other than the linear shape for the gate of the transistor. This is disadvantageous in view of the device criteria, but can provide a condition capable of further proceeding sharing and integration of diffusion layers and gate signals.

A transistor layout in the YSW/PRE portion 27 according to this embodiment is to be described with reference to FIG. 29. For configurations identical with those in the Embodiments 1 to 5, description is to be omitted optionally. For example, since the PMOS pair 25 and NMOS pair 26 described in any of FIG. 9 to FIG. 12 can be used also in this embodiment, detailed description therefor is to be omitted.

Figure 29:
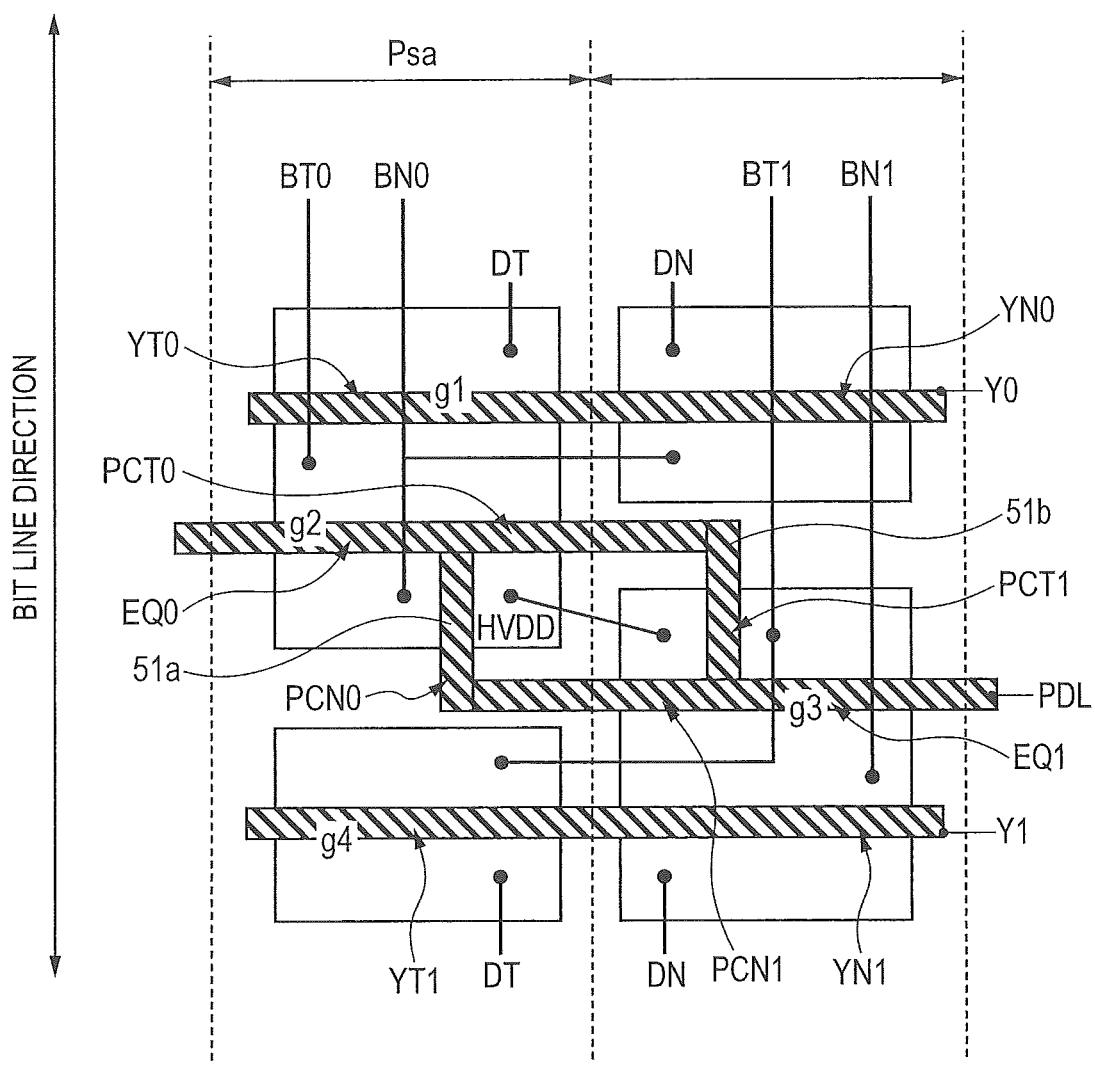
FIG. 29 is a layout view illustrating an example of arrangement of transistors in a YSW/PRE portion according to an embodiment 6.

In FIG. 29, gates g for precharging transistors PCN and PCT and an equalizing transistor EQ are formed each in a T-shaped configuration and integrated. In FIG. 29, gates g1 to g4 are disposed in upper and lower four stages. Gates g2 and g3 in the second stage and the third stage are connected by two longitudinal gates 51a and 51b. In this layout, a portion of the diffusion layer corresponding to a precharge voltage HVDD is surrounded by the gates. The gate g1 in the first stage is connected to a column selection signal line Y0. The gates g2 and g3 and the longitudinal gates 51a and 51b in the second stage and the third stage are connected to a precharge signal line PDL. The gate g4 in the fourth stage is connected to a column signal selection line Y1.

The YSW/PRE portion 27 includes four diffusion layers 41a to 41d. The diffusion layers 41a and 41b are disposed in upper and lower two stages in the SA pitch Psa on the side of a bit line pair BT0 and BN0, the diffusion layers 41c and 41d are disposed in upper and lower two stages in the SA pitch Psa on the side of a bit line pair BT1 and BN1. Each of the diffusion layers 41a to 41d has a rotationally symmetric layout. Further, the transistor layout in the YSW/PRE portion 27 is rotationally symmetric.

The gate g1 in the first stage is disposed from the diffusion layer 41a to the diffusion layer 41c. That is, the gate g1 in the first stage is longer than the SA pitch Psa and overrides two SA pitches Psa. The gate g2 in the second stage is disposed so as to override the diffusion layer 41a. The gate g3 in the third stage is disposed so as to override the diffusion layer 41d. The gate g4 in the fourth stage is disposed from the diffusion layer 41b to the diffusion layer 41d. That is, the gate g4 in the fourth stage is longer than the SA pitch Psa and override two SA pitches Psa. The longitudinal gate 51a corresponds to the diffusion layer 41a. The other longitudinal gate 51b corresponds to the diffusion layer 41d. T-shaped gates are formed by providing the longitudinal gates 51a and 51b.

For the gate g1 in the first stage, a portion overriding the diffusion layer 41a is a gate g of a switching transistor YT0 and a portion overriding the diffusion layer 41c is a gate g of a switching transistor YN0. For the gate g2 in the second stage, a portion left to the longitudinal gate 51a is a gate g of the equalizing transistor EQ0 and a portion to the right thereof is a gate g of a precharging transistor PCT0. The longitudinal gate 51a is a gate of a precharging transistor PCN0. As described above, the gate g2 in the second stage and the longitudinal gate 51a extending therebelow constitute a T-shaped gate of the precharging transistors PCN0 and PCT0 and the equalizing transistor EQ0.

In the same manner, for the gate g3 in the third stage, a portion right to the longitudinal gate 51b is a gate of an equalizing transistor EQ1 and a portion on the left thereof is a gate of a precharging transistor PCN1. The longitudinal gate 51b is a gate of a precharging transistor PCT1. As described above, the gate g3 in the third stage and the longitudinal gate 51b extending thereabove constitute a T-shaped gate of the precharging transistors PCN1 and PCT1, and the equalizing transistor EQ1. Two sets of the T-shaped transistors are opposite in the vertical direction and juxtaposed in the lateral direction. For the gate g4 in the fourth stage, a portion overriding the diffusion layer 41a is a gate of the switching transistor YT1 and a portion overriding the diffusion layer 41d is a gate for a switching transistor YN1.

Further, the switching transistor YT0, the equalizing transistor EQ0, and the precharging transistor PCT0 share a region on the side of the bit line BT0. The switching transistor YN1, the equalizing transistor EQ1, and the precharging transistor PCN1 share a region on the side of the bit line BN1. A connection line of a precharge voltage HVDD for connecting the diffusion layer 41a and the diffusion layer 41d is disposed in a region surrounded by the two longitudinal gates 51a and 51b, the gate g2 in the second stage, and the gate g3 in the third stage.

The same effect as described above can be obtained by the layout. For example, since the pitch of the YSW/PRE portion 27 is twice the SA pitch Psa, the area can be reduced. Further, since the number of stages of the gates g can be decreased, the vertical size can be reduced.

(Modification 1 of YSW/PRE Portion 27)

Modification 1 of the YSW/PRE portion 27 is to be described with reference to FIG. 30. For contents identical with those in the embodiments described above, description is to be omitted. Compared with the layout of FIG. 28, a longitudinal gate 51 is used in FIG. 30. The gate g of precharging transistors PCN and PCT and equalizing transistors EQ is formed into a T-shaped configuration and integrated.

Figure 30:
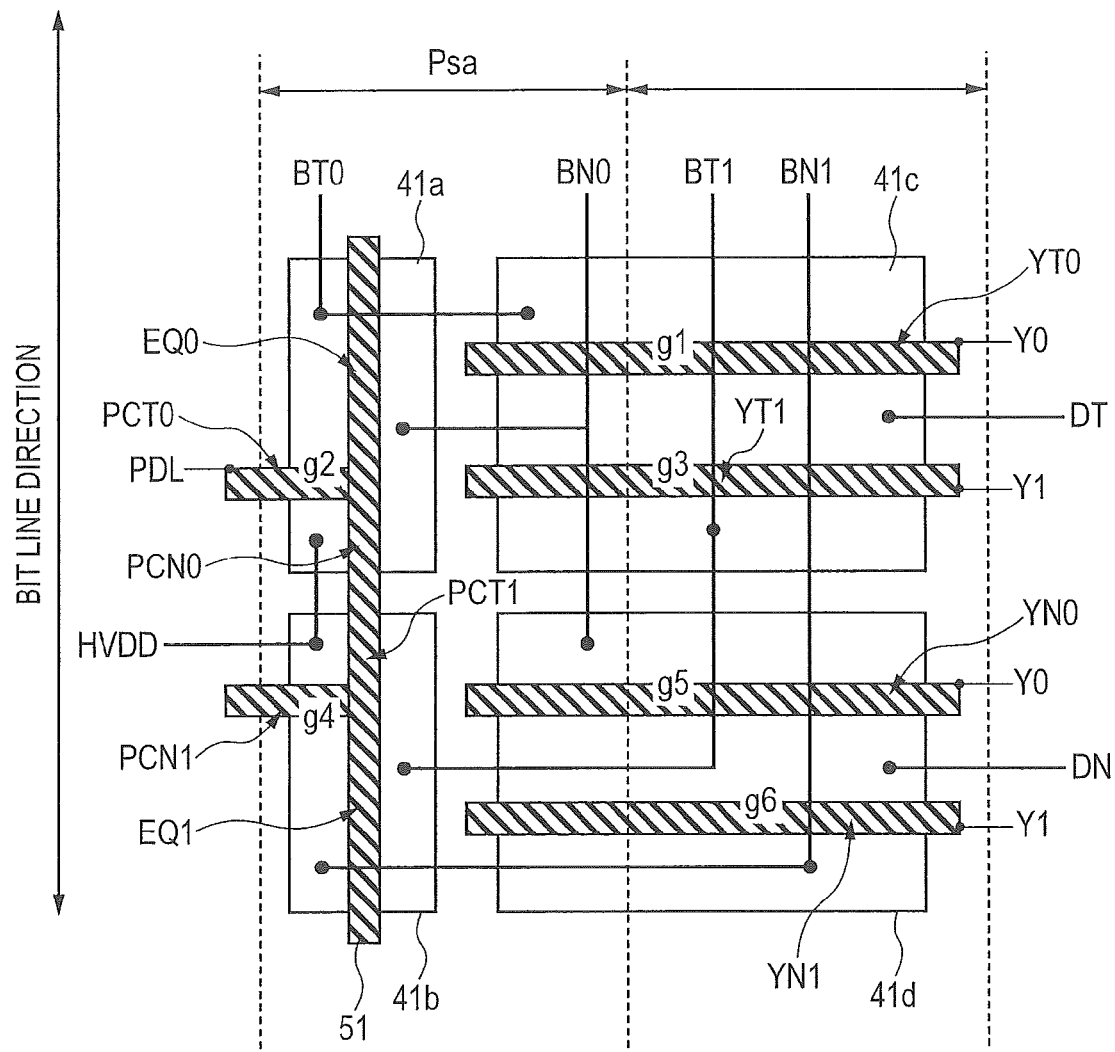
FIG. 30 is a layout view illustrating an example of arrangement of transistors in a YSW/PRE portion according to modification 1 of the embodiment 6.

In FIG. 30, gates g are disposed in upper and lower four stages. Two gates g2 and g3 are disposed in a second stage, and two gates g4 and g5 are disposed in the third stage. Accordingly, gates g1 to g6 are disposed in the lateral direction by the number of six in total. Then, the gate g2 in the second stage and the other gate g4 in the third stage are connected by the longitudinal gate 51.

In FIG. 30, four diffusion layers 41a to 41d are disposed in a region twice the SA pitch Psa. Each of the diffusion layers 41c and 41d has a width wider than the SA pitch Psa and protrudes to an adjacent SA pitch Psa. The diffusion layers 41a and 41b are disposed in upper and lower two stages and each diffusion layer has a substantially identical width in the lateral direction. The diffusion layers 41a and 41b are disposed in the SA pitch Psa on the left. The diffusion layers 41c and 41d are disposed in upper and lower two stages, and the diffusion layers 41c and 41c are disposed in upper and lower two stages and each diffusion layer has a substantially identical width in the lateral direction. The diffusion layers 41c and 41d protrude from the inside of the SA pitch Psa on a left to the SA pitch Psa on the right. Accordingly, the width of the diffusion layers 41c and 41d in the lateral direction is wider than that of the diffusion layers 41a and 41b.

The gate g1 in the first stage is connected to a column selection signal line Y0. The gate g1 in the first stage is disposed so as to override the diffusion layer 41c. In the second stage, the gate g2 is connected to a precharge signal line PDL and the other gate g3 is connected to a column selection signal line Y1. In the second stage, the gate g2 is disposed so as to override the diffusion layer 41a and the other gate g3 corresponds to the diffusion layer 41c. In the third stage, the gate g4 is connected to a precharge signal line PDL and the other gate g5 is connected to a column selection signal line Y0. In the third stage, the gate g4 corresponds to the diffusion layer 41b and the other gate g5 is disposed so as to override the diffusion layer 41d. The gate g6 in the fourth stage is connected to the column selection signal line Y1. The gate g6 in the fourth stage is disposed so as to override the diffusion layer 41d.

The gate g1 in the first stage corresponds to a switching transistor YT0. In the second stage, the gate g2 corresponds to a precharging transistor PCT0 and the other gate g3 corresponds to a switching transistor YT1. In the third stage, the gate g4 corresponds to a precharging transistor PCN1 and the other gate g5 corresponds to a switching transistor YN0. In the fourth stage, the gate g6 corresponds to a switching transistor YN1. The longitudinal gate 51 is disposed so as to override the diffusion layer 41a and the diffusion layer 41b.

The diffusion layer 41a corresponds to precharging transistors PCT0 and PCN0, and an equalizing transistor EQ0. In the diffusion layer 41a, a portion above the gate g2 of the longitudinal gate 51 is a gate of an equalizing transistor EQ0 and a portion below the gate is a gate of the precharging transistor PCN0. As described above, the longitudinal gate 51 and the gate g2 in the second stage extending in the lateral side constitutes the T-shaped gate of the precharging transistors PCN0 and PCT0 and the equalizing transistor EQ0.

The diffusion layer 41b corresponds to the precharging transistors PCT1 and PCN1, and the equalizing transistor EQ1. In the diffusion layer 41b, a portion of the longitudinal gate 51 above the gate g4 is a gate of the precharging transistor PCT1 and a portion below the gate g4 is a gate of the equalizing transistor EQ1. Thus, the longitudinal gate 51 and the gate g4 in the third stage extending on the lateral side of the gate 51 constitute the T-shaped gate of the precharging transistors PCN1 and PCT1, and the equalizing transistor EQ1. Then, in the SA pitch Psa of the bit line pair BT0 and BN0, two sets of T-shaped transistors are arranged in a vertical direction. The T-shaped gate is mirror asymmetric with respect to a lateral line as an axis.

By the layout, the switching transistors YT and YN can be arranged on the right. Further, the precharging transistors PCT and PCN and the equalizing transistor EQ can be arranged on the left. Further, the longitudinal gate 51 that passes through the two diffusion layers 41a and 41b in the longitudinal direction corresponds to the precharging transistor PCN0, the equalizing transistor EQ0, the equalizing transistor EQ1, and the precharging transistor PCT1. Thus, the gate width W of the equalizing transistor EQ can be increased easily and the performance of the equalizing transistor EQ can be improved. Further, the same effect as described above can be obtained. For example, since the pitch of the YSW/PRE portion 27 is twice the SA pitch Psa, the area can be reduced.

(Modification 2 of YSW/PRE Portion 27)

Modification 2 of the YSW/PRE portion 27 is to be described with reference to FIG. 31. For contents identical with those of the embodiments described above, description is to be omitted. For the layout of FIG. 27, longitudinal gates 51 are used in FIG. 31. One diffusion layer 41a is disposed to a region four times as large as the SA pitch Psa. That is, an integrally formed diffusion layer 41a is formed over four SA pitches Psa.

Figure 31:
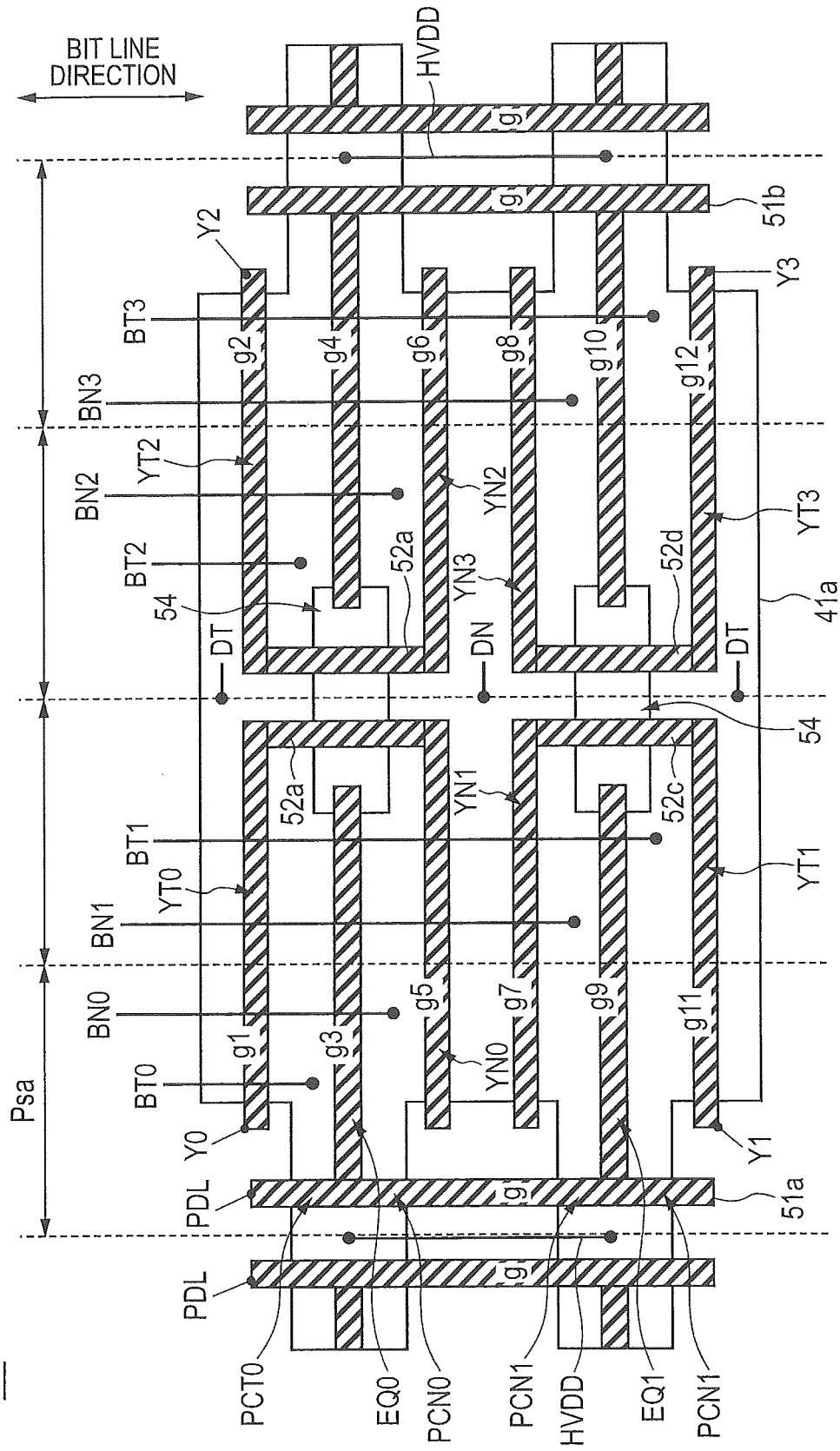
FIG. 31 is a layout view illustrating an example of arrangement of transistors in a YSW/PRE portion according to modification 2 of the embodiment 6.

FIG. 31 illustrates a layout of the YSW/PRE portion 27 to four bit line pairs BT0 to BT3 and BN0 to BN3. The layout corresponds to a bit line pair BT0 and BN0, a bit line pair BT1 and BN1, a bit line pair BT2 and BN2, and a bit line pair BT3 and BN3 orderly from the SA pitch Psa on the left. Since the entire layout is symmetrical with respect to the boundary between the second and third SA pitches Psa from the left as an axis, description for the layout of the two SA pitches Psa on the right is to be omitted. That is, the layout for the bit line pair BT0 and BN0 and the bit line pair BT1 and BN1 is mirror symmetric with respect to the bit line pair BT2 and BN2 and the bit line pair BT3 and BN3. Accordingly, description for the layout relating to the bit line pair BT2 and BN2 and the bit line pair BT3 and BN3 is to be omitted. Further, the entire layout is mirror symmetric with respect to the lateral line as an axis.

Gates g are disposed in six stages. In a region four times as large as the SA pitch Psa, gates are disposed by two in each of the first stage to the sixth stage. The gates g in the first stage are referred to as gates g1 and g2. In the same manner, the gates g in the second stage are referred as gates g3 and g4. The gates g in the third stage are referred to as gate g5 and g6, the gates g in the fourth stage are referred to as gate g7 and g8. The gates g in the fifth stage are referred to as gate 9 and gate 10, and the gates g in the sixth stage are referred to as gate 11 and gate 12.

The gate g3 in the second stage and the gate g9 in the fifth stage are connected by a longitudinal gate 51a. The gate g1 in the first state and the gate g5 in the third stage are connected by a longitudinal gate 52a, and they are formed into a U-shape configuration. The gate g7 in the fourth stage and the gate g11 in a sixth stage are connected by a longitudinal gate 53c and formed into a U-shaped configuration.

The gate g3 in the second stage, the gate g9 in the fifth stage, and the longitudinal gate 51a are connected to a precharge signal line PDL. The gates g of precharging transistors PCN and PCT and equalizing transistors EQ are formed into a T-shaped configuration and integrated. The gate g1 in the first stage, the gate g5 in the third stage, and the longitudinal gate 52a are connected to a column selection signal line Y0. The gate g7 in the fourth stage, the gate g11 in the sixth stage, and the longitudinal gate 52c are connected to a column selection signal line Y1.

The gate g1 in the first stage corresponds to a switching transistor YT0. The gate g3 in the second stage correspond to an equalizing transistor EQ0. The gate g5 in the third stage corresponds to a switching transistor YN0. The gate g7 in the fourth stage correspond to a switching transistor YN1. The gate g9 in the fifth stage corresponds to an equalizing transistor EQ1. The gate g11 in the sixth stage corresponds to a switching transistor YT1. The longitudinal gate 51a corresponds, orderly, from the upper portion, a precharging transistor PCT0, a precharging transistor PCN0, a precharging transistor PCN1, and a precharging transistor PCT1.

The gate g1 in the first stage and the gate g5 in the third stage are connected by way of a longitudinal gate 52a, the gate g7 in the fourth stage and the gate g11 in the sixth stage are connected by way of a longitudinal gate 52c. Then, the longitudinal gates 52a and 52b are disposed so as to override opening portions 54 on the diffusion layer 41a. Accordingly, each of the switching transistors YT and YN has an L-shaped gate g.

The diffusion layer 41a extends to adjacent SA pitch. Accordingly, an isolation region of the diffusion layer 41a can be decreased. The two SA pitches Psa on the left and the two SA pitches Psa on the right can share a common bus line DN. That is, four switching transistors YT0 to YT3 share a common bus DN. In other words, four switching transistors YT0 to YT3 have identical contacts for the contact of the diffusion layer 51a. Further, the switching transistor YT0 and the switching transistor YT2 share the common bus line DT. The switching transistor YT1 and the switching transistor YT3 share the common bus line DT. Further, the common bus line DT is shared between the not illustrated SA pitches Psa on both sides. Accordingly, the number of contacts can be decreased. The diffusion layer 41a can be shared between the adjacent pattern and the size of the switching transistors YT and YN can be made larger. Accordingly, an efficient layout can be provided and the area can be reduced. Since the pitch of the YSW/PRE portion 27 is larger than the SA pitch Psa, the area can further be reduced.

In the layouts described so far, transistors by the number of one-half or more of the total number of transistors included in the precharge portion 22 and the Y switch portion 23 (five transistors, i.e., the precharging transistors PCT and PCN, the equalizing transistor EQ, and the switching transistors YT and YN) have a gate with the longitudinal direction along the vertical direction perpendicular to the bit line direction. At least one of the precharge portion 22 and the switch portion 23 is disposed repeatedly at a pitch wider than the sense amplifier pitch.

Further, in the layouts described so far, the longitudinal direction of the gate g is along the vertical direction perpendicular to the bit line direction. Then, channels of two transistors are disposed continuously in the longitudinal direction of the gate g. That is, the channel width direction of the two switching transistors sharing the gate g is along the longitudinal direction of the gate g. For example, one gate g corresponds to the switching transistors YT0 and YT1 and the channel width direction of the switching transistors YT0 and YT1 is along the longitudinal direction of the gate g. As described above, channels of two or more switching transistors are continuous in the longitudinal direction of the gate of the switching transistor. For example, the gate g extending in the vertical direction corresponds to switching transistors YT0 and the switching transistor YT1. That is, the switching transistor YT0 and the switching transistor YT1 share the gate g. Thus, an efficient layout can be provided for the electrode pattern of the gate g and the area can be reduced. Further, according to the configuration of FIG. 13 to FIG. 15, channels of four or more switching transistors can share the gate g in the boundary of adjacent I/O. In the same manner, two or more precharging transistors can share one gate g. This can further reduce the area.

(Modification 3 of YSW/PRE Portion 27)

Figure 32:
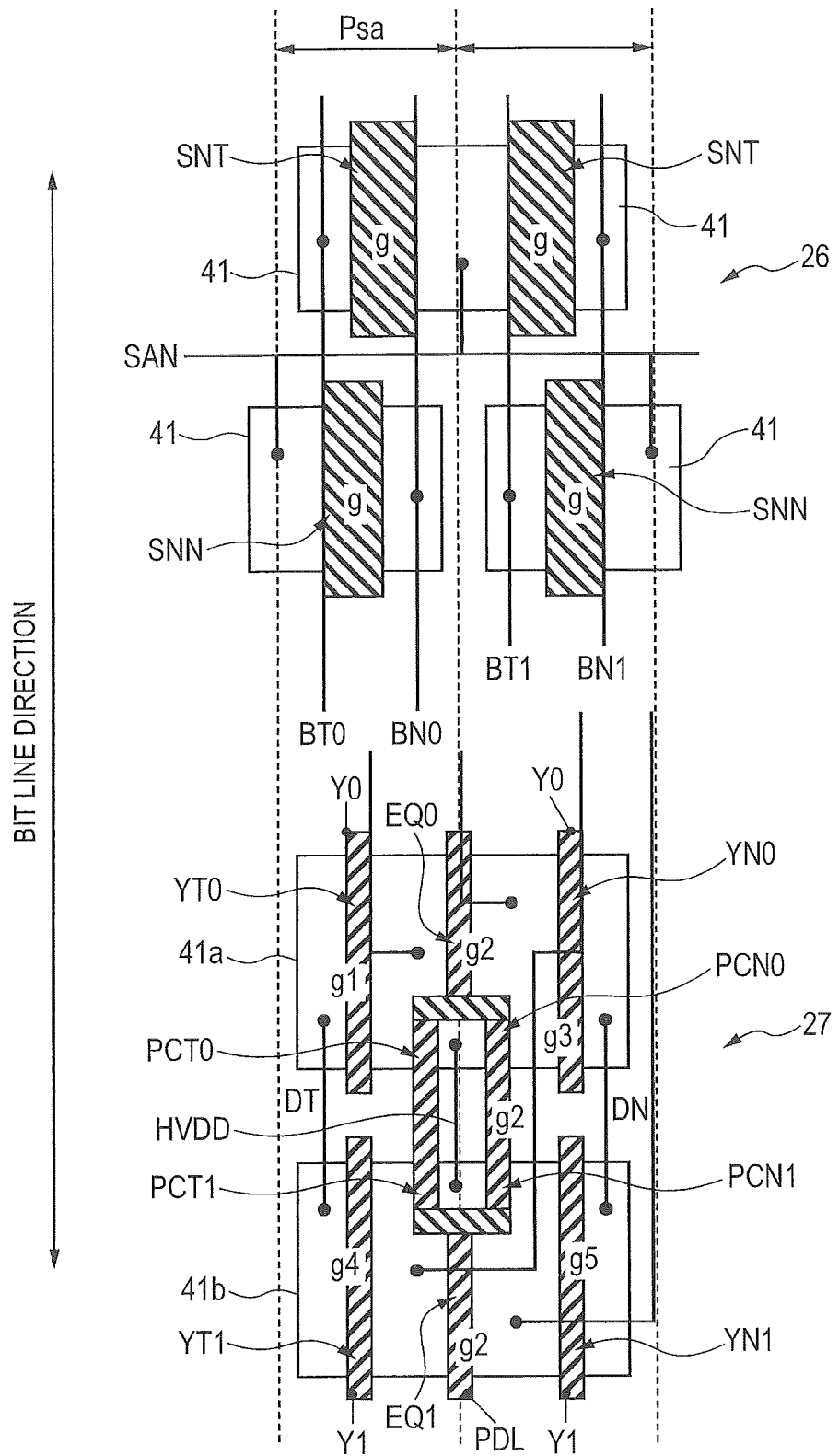
FIG. 32 is a layout view illustrating an example of arrangement of transistors in a YSW/PRE portion according to modification 3 of the embodiment 6.

Modification 3 of the YSW/PRE portion 27 is to be described with reference to FIG. 32. For the contents identical with those of the layout described above, description is to be omitted. In FIG. 32, gates g are arranged in the longitudinal direction. That is, in the YSW/PRE portion 27, the longitudinal direction of the gate g of the transistor is along the bit line direction. Then, switching transistors YT and YN, precharging transistors PCT and PCN, and equalizing transistors EQ are realized in an integrated transistor shape.

The YSW/PRE portion 27 includes diffusion layers 41a and 41b disposed in two stages. The diffusion layer 41a in the first stage corresponds to transistors of a bit line pair BT0 and BN0, and the diffusion layer 41b in the second stage correspond to transistors of a bit line pair BT1 and BN1. The layout for the bit line pair BT0 and BN0 and the layout for the bit line pair BT1 and BN1 is mirror asymmetric with respect to a line in the lateral direction. Accordingly, for the layout of the bit line pair BT1 and BN1, description is to be omitted.

The diffusion layers 41a and 41b are formed each wider than the SA pitch Psa and formed over two SA pitches Psa. Five gates g1 to g5 are disposed in the YSW/PRE portion 27. The diffusion layer 41a corresponds to three gates g1 to g3. The diffusion layer 41b corresponds to three gates g4, g2, and g5. The three gates g1 to g3 are juxtaposed in the lateral direction. The gate g1 on the left corresponds to a switching transistor YT and the gate g3 on the right corresponds to a switching transistor YN0. An intermediate gate g2 corresponds to an equalizing transistor EQ0 and precharging transistors PCT0 and PCN0. The gate g2 is branched at the midway and one of the branches corresponds to a precharging transistor PCT0 and the other of the branch corresponds to a precharging transistor PCN0. Further, a not branched portion of the gate g2 corresponds to an equalizing transistor EQ0. The intermediate gate g2 extends from the diffusion layer 41a to the diffusion layer 41b. That is, the intermediate gate g2 is formed from the diffusion layer 41a to the diffusion layer 41b and supplied with a common precharge signal.

The diffusion layer 41a to the left of the gate g1 on the left is connected to a common bus line DT. The diffusion layer 41a to the right of the gate g3 on the right is connected to a common bus line DN. The diffusion layer 41a between the gate g1 on the left and the intermediate gate g2 is connected to a bit line BT0. Accordingly, the switching transistor YT0, the equalizing transistor EQ0, and the precharging transistor PCT0 share the diffusion layer 41a of the bit line BT0. The diffusion layer 41a between the gate g3 on the right and the intermediate gate g2 is connected to the bit line BN0. Accordingly, the switching transistor YN0, the equalizing transistor EQ0, and the precharging transistor PCN0 share the diffusion layer 41a on the side of the bit line BN0.

As described above, the switching transistors YT0 and YN0, the precharging transistors PCT0 and PCN0, and the equalizing transistor EQ0 for the bit line pair BT0 and BN0 share the integrated diffusion layer 41a. Then, the diffusion layer 41a and the diffusion layer 41b are disposed vertically and corresponded to two columns Y0 and Y1. As illustrated in FIG. 7, the switching transistors YT0 and YN0, the precharging transistors PCT0 and PCN0, and the equalizing transistor EQ0 in one column are accommodated in a region of a width twice the SA pitch Psa. Thus, the area can be reduced without narrowing the gate width W.

Further, the diffusion layers 41a and 41b of the common bus lines DT and DN on right and left ends can be shared between adjacent SA region patterns. For example, the diffusion layer at the left end of the diffusion layer 41a can be integrated with the diffusion layer of the common bus line DN of the bit line pair BT2 and BN2 (not illustrated). In the same manner, the diffusion layer at the left end of the diffusion layer 41b can be integrated with the diffusion layer of the common bus line DN of the bit line pair BT3 and BN3 (not illustrated). Accordingly, integrated shape of transistors can be proceeded further to improve the area efficiency.

As described above, the layouts of the Embodiments 4 to 6 have the diffusion layer 41a in which the switching transistors YT0 and YN0, the precharging transistors PCT0 and PCN0, and the equalizing transistor EQ0 are formed integrally. That is, the diffusion layer 41a of the precharging transistors PT0 and PCN0, and the equalizing transistor EQ0 is formed integrally with the diffusion layer 41a of the switching transistors YT0 and YN0. With such a layout, the transistors can be arranged being closed to the isolation region of the diffusion layers. Thus, the area can be reduced without narrowing the gate width W.

Figure 33:
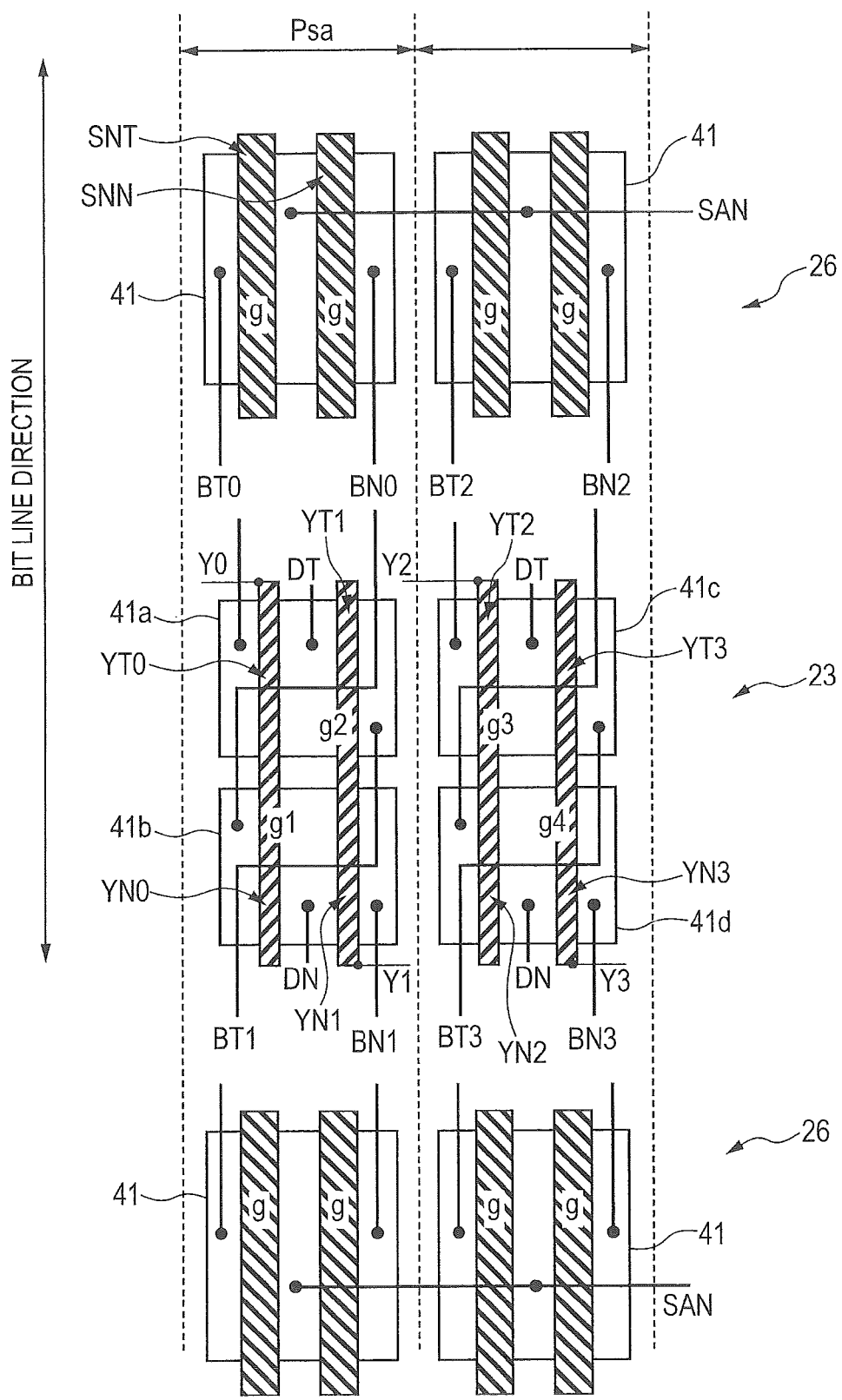
FIG. 33 is a layout view illustrating an example of arrangement of transistors in a Y switch portion according to an embodiment 7.

In the layout of FIG. 33, transistors by the number of one-half or more of the total number of the transistors contained in the precharge portion 22 and the Y switch portion 23 (five transistors in this embodiment, i.e., the precharging transistors PCT and PCN, the equalizing transistor EQ and the switching transistors YT and YN) have a gate with the longitudinal direction being along the bit line direction. Then, at least one of the precharge portion 22 and the switch portion 23 is disposed repeatedly at a pitch larger than that of the sense amplifier pitch.

Further, in the layout of the Embodiments 1 to 6, since the pitch of the precharge portion 22 and the Y switch portion 23 is different from the SA pitch Psa, the number of repetition of the sense amplifier 12 and the number of repetition of the Y switch portion 23 and the precharge portion 22 in the lateral direction are different. In this embodiment, the number of repetition of the sense amplifier 12 is twice the number of repetition of the Y switch portion 23 and the number of repetition of the precharge portion 22. Further, it is also possible to use a YSW/PRE portion 27 in which the Y switch portion 23 and the precharge portion 22 are integrated.

Embodiment 7

Figure 34:
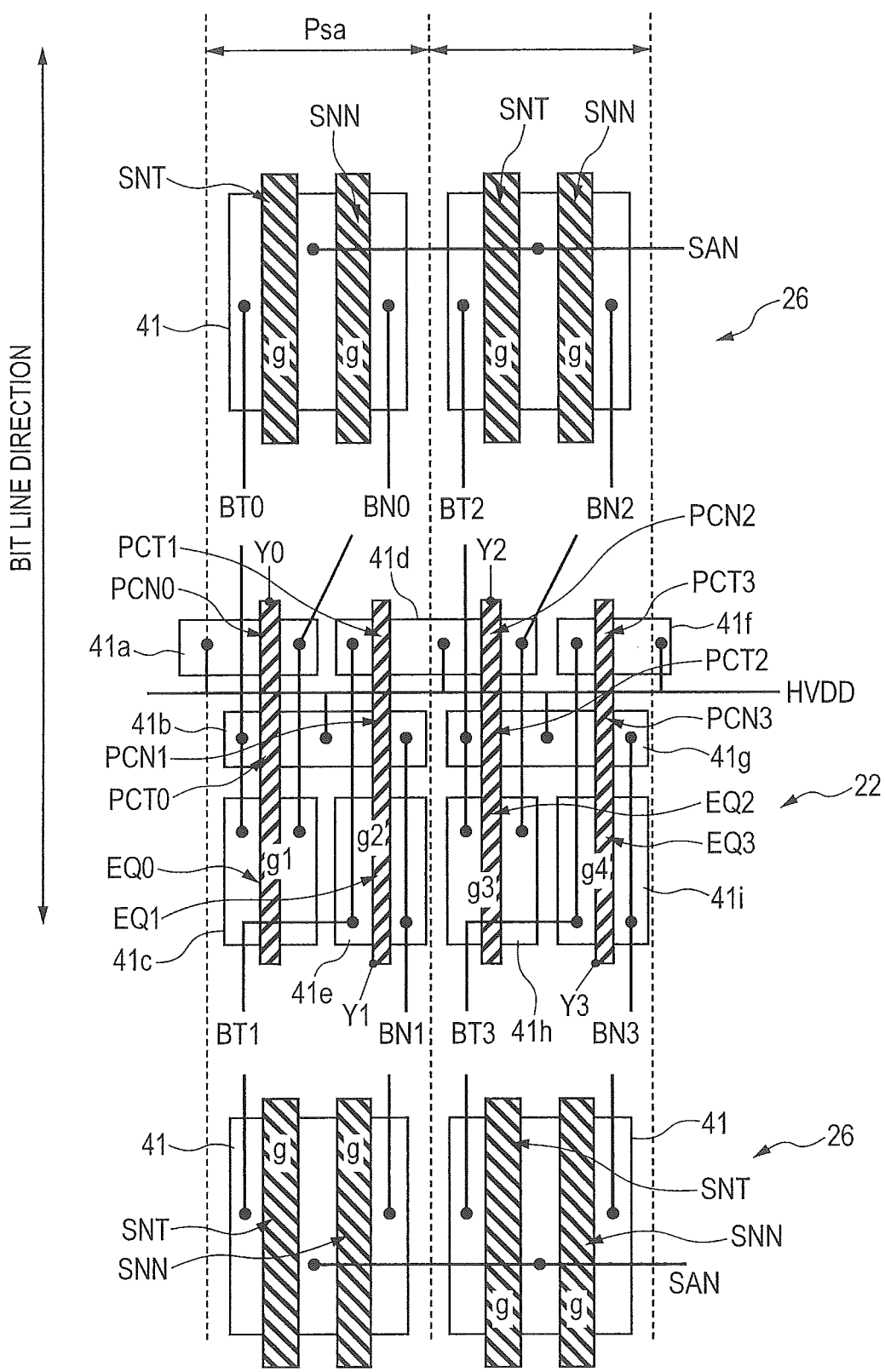
FIG. 34 is a layout View illustrating an example of arrangement of transistors in a precharge portion according to the embodiment 7.

A layout according to this embodiment is to be described with reference to FIGS. 33 and 34. FIG. 33 is a view illustrating a layout of a Y switch portion 23. FIG. 34 is a view illustrating a layout of a precharge portion 22. For contents identical with those in the Embodiments 1 to 6, description is to be omitted. In the previous Embodiments 1 to 6, each of the pitches of the precharge portion 22 and the Y switch portion 23 was twice the SA pitch Psa as illustrated in FIG. 7. The Embodiment 7 has a layout as illustrated in FIG. 8 in which the pitch of the precharge portion 22 and the Y switch portion 23 is one-half the SA pitch Psa.

FIG. 33 illustrates a layout of the Y switch portion 23 of the semiconductor memory according to this embodiment. FIG. 33 shows a Y switch portion 23 in the open bit configuration. Accordingly, an NMOS pair 26 is disposed above and below the Y switch portion 23 respectively. That is, the Y switch portion 23 is disposed between NMOS pairs 26 spaced apart in a vertical direction. In FIG. 33, the Y switch portion. 23 for four bit line pairs is disposed in a region of a width twice the SA pitch Psa. In FIG. 33, the precharge portion 22 is not illustrated.

Paired amplifying transistors of a bit line pair BT0 and BN0 correspond to the NMOS pair 26 on the left in the upper stage, and paired amplifying transistors of a bit line BT1 and BN1 correspond to the NMOS pair 26 on the left in the lower stage. Paired amplifying transistors of bit line pair BT2 and BN2 correspond to the NMOS pair 26 on the right in the upper stage, and the paired amplifying transistors of bit line pair BT3 and BN3 correspond to the NMOS pair 26 on the right in the lower stage. Since each of the NMOS pairs 26 has the same configuration as that of FIG. 9, description therefor is to be omitted. The layout of the Y switch portion 23 in FIG. 33 is identical with the layout rotated by 90° from that in FIG. 17.

The Y switch portion 23 includes four diffusion layers 41a to 41d. The diffusion layers 41a and 41b are disposed in two stages in the SA pitch Psa on the left. The diffusion layers 41c and 41d are disposed in two stages in the SA pitch Psa on the right. The diffusion layer 41a in the upper left stage and the diffusion layer 41b in the lower left stage correspond to the bit line pair BT0 and BN0 and the bit line pair BT1 and BN1. The diffusion layer 41c in the upper right stage and the diffusion layer 41d in the lower right stage correspond to the bit line pair BT2 and BN2 and the bit line pair BT3 and BN3.

Since the layout is substantially identical between the SA pitch Psa on the left and the SA pitch Psa on the right, description is to be omitted for the SA pitch Psa on the right. That is, the transistor layout of the bit line pair BT2 and BN2 is identical with the transistor layout of the bit line pair BT0 and BN0 and the transistor layout of the bit line pair BT3 and BN3 is identical with the transistor layout of the bit line pair BT1 and BN1.

The Y switch portion 23 includes four gates g1 to g4. Two gates g1 and g2 are disposed in the SA pitch Psa on the left. Two gates g1 the g2 are disposed in the SA pitch Psa on the left. Two gates g3, g4 are disposed in the SA pitch Psa on the right. Each of the gates g1 to g4 is disposed in parallel with the direction of the bit line. In other words, the gates g1 to g4 are longitudinal gates along the bit line direction. Each of the gates g1 to g4 has a linear shape having the longitudinal direction along the bit line direction. Accordingly, the bit line direction is parallel with the gate width W. Further, the two gates g1 and g2 are disposed being spaced apart in the lateral direction. In this embodiment, the two gates g disposed in the SA pitch Psa on the left are distinguished as the gate g1 on the left and as the gate g2 on the right. The gate g1 on the left is connected to a column selection signal Y0, and the gate g2 on the right is connected to a column selection signal Y1. The gates g1 and g2 are disposed so as to override the diffusion layers 41a and 41b respectively. That is, each of the gates g1 and g2 is formed in a region from the diffusion layer 41a to the diffusion layer 41b.

The diffusion layer 41a corresponds to switching transistors YT0 and YT1, and the diffusion layer 41b corresponds to switching transistors YN0 and YN1. The diffusion layer 41a is connected to the bit line BT0 on the left of the gate g1 and the diffusion layer 41b is connected to the bit line BN0 on the left of the gate g1. The diffusion layer 41a is connected to the bit line BT1 on the right of the gate g2 and the diffusion layer 41b is connected to the bit line BN1 on the right of the gate g2. The diffusion layer 41a is connected to a common bus line DT between the gate g1 and the gate g2. In the same manner, the diffusion layer 41b is connected to the common bus line DN between the gate g1 and the gate g2. Accordingly, the switching transistors YT0 and YN0 share the gate g1. In the same manner, the switching transistors YT1 and YN1 share the gate g2. Then, the switching transistor YT0 and the switching transistor YT1 share the diffusion layer 41a on the side of the common bus line DT. The switching transistor YN0 and the switching transistor YN1 share the diffusion layer 41a on the side of the common bus line DN.

As described above, the left half of the diffusion layer 41a and 41b corresponds to the devices of the bit line pair BT0 and BN0 and the right half thereof corresponds to the devices of the bit line pair BT1 and BN1. Further, the upper and lower switching transistors YT0 and YN0 share the gate g and the upper and lower switching transistors YT1 and YN1 share the gate g. The two switching transistors YT and YN disposed in the longitudinal direction can share the diffusion layer corresponding to the column signal line Y.

Accordingly, since the number of contacts can be decreased, the transistors can be disposed being closed to an isolation region of the diffusion layers. Thus, the area can be reduced without narrowing the gate width W. The arrangement direction of the gate g is made uniform by using only the linear shape gate g. Accordingly, this embodiment provides a layout that can be stabilized easily against scattering in view of the device manufacture and high yield can be expected. The Y switch portion 23 is disposed repeatedly at one-half pitch of the SA pitch Psa. Thus, an efficient layout can be obtained and the area can be reduced.

Then, the layout of the precharge portion 22 of the semiconductor memory according to this embodiment is to be described with reference to FIG. 34. FIG. 34 is a view illustrating a layout of the precharge portion 22 of the semiconductor memory according to this embodiment. Also the layout illustrated in FIG. 34 has an open bit system like that in FIG. 33 and shows a region of a width twice the SA pitch Psa. In FIG. 34, precharge portions 22 of four bit line pairs are disposed in a region of a width twice the SA pitch Psa. A precharge portion 22 of one SA is disposed in a region of a width one-half the SA pitch Psa. NMOS pair 26 is disposed above and below the precharge portion 22 respectively. The precharge portion 22 is disposed between the NMOS pairs 26 spaced apart in the vertical direction. Since the arrangement of the NMOS pair 26 is identical with that in FIG. 9, description therefor is to be omitted.

The transistor layout is mirror symmetric with respect to a longitudinal line as an axis in a region of a width twice the SA pitch Psa. The SA pitch Psa on the left corresponds to the bit line pair BT0 and BN0 and the bit line pair BT1 and BN1. The SA pitch Psa on the right corresponds to the bit line pair BT2 and BN2 and the bit line pair BT3 and BN3. Further, also in each of the right and left SA pitches, the transistor layout is mirror symmetric with respect to a longitudinal line as an axis.

The precharge portion 22 includes nine diffusion layers 41a to 41i. The diffusion layers 41a, 41b, 41c, and 41e are disposed in the SA pitches Psa on the left. The diffusion layers 41f, 41g, 41h, and 41i are disposed in the SA pitch Psa on the right. The diffusion layer 41d is disposed over the SA pitches Psa on the right and left. The diffusion layer 41a and the diffusion layer 41f has a mirror symmetric layout. The diffusion layer 41b and the diffusion layer 41g have a mirror symmetric layout. In the same manner, the diffusion layer 41c and the diffusion layer 41i have a mirror symmetric layout, and the diffusion layer 41e and the diffusion layer 41h have a mirror symmetric layout. The diffusion layer 41d have a mirror symmetric shape with respect to the boundary line between the SA pitches on the right and left.

Four gates g1 to g4 are disposed in a region of the width twice the SA pitch Psa. Each of the gates g1 to g4 is formed in parallel with the bit line direction. In other words, each of the gates g1 to g4 is a longitudinal gate along the bit line direction. Each of the gates g1 to g4 has a linear shape having the longitudinal direction along the bit line direction. Accordingly, the bit line direction is in parallel with the gate width W. Further, the four gates g1 to g4 are disposed being spaced apart in the lateral direction. Two gates g1 and g2 are disposed in the SA pitch Psa on the left and two gates g3 and g4 are disposed in the SA pitch Psa on the right.

The gate g1 is connected to a column selection signal Y0. The gate g2 is connected to a column selection signal line Y1. The gate g3 is connected to a column selection signal line Y2. The gate g4 is connected to a column selection signal line Y3. Each of the gates g1 to g4 is disposed so as to override three diffusion layers 41. For example, the gate g1 is disposed over the diffusion layers 41a, 41b, and 41c. The gate g2 is disposed over the diffusion layers 41d, 41b, and 41e. The gate g3 is disposed over the diffusion layers 41d, 41g, and 41h. The gate g4 is disposed over the diffusion layers 41f, 41g, and 41i.

The diffusion layer 41a corresponds to a precharging transistor PCN0 and the diffusion layer 41c corresponds to an equalizing transistor EQ0. The diffusion layer 41e corresponds to an equalizing transistor EQ1. The diffusion layer 41b corresponds to precharging transistors PCT0 and PCT1. In the diffusion layer 41b, precharging transistors PCT0 and PCN1 share a precharge voltage HVDD. The diffusion layer 41d corresponds to precharging transistors PCT1 and PCN1. In the diffusion layer 41d, the precharging transistors PCT1 and PCN2 share the precharge voltage HVDD.

In the same manner, the diffusion layer 41h corresponds to an equalizing transistor EQ2, and the diffusion layer 41i corresponds to an equalizing transistor EQ3. The diffusion layer 41f corresponds to a precharging transistor PCT3. The diffusion layer 41g corresponds to precharging transistors PCT2 and PCN3. In the diffusion layer 41g, the precharging transistors PCT2 and PCN3 share the precharge voltage HVDD. The diffusion layers 41a and 41f share the precharge voltage HVDD in the SA pitch Psa adjacent further to the outside.

As described above, the precharging transistors PCN and PCT, and the equalizing transistor EQ share the gate g with the longitudinal direction along the bit line direction. Accordingly, the three precharging transistors PCN and PCT and the equalizing transistor EQ disposed in the longitudinal direction can share the precharge signal line PDL. Since the number of contacts can be decreased, the transistors can be disposed being close to the isolation region of the diffusion layer. Thus, the area can be reduced without narrowing the gate width W.

The gate arrangement direction is made uniform by using only the linear shape gate g. Accordingly, this can provide a layout that can be stabilized easily against scattering in view of device manufacture and high yield can be expected. This can provide an efficient layout.

(Modification of Embodiment 7)

Figure 35:
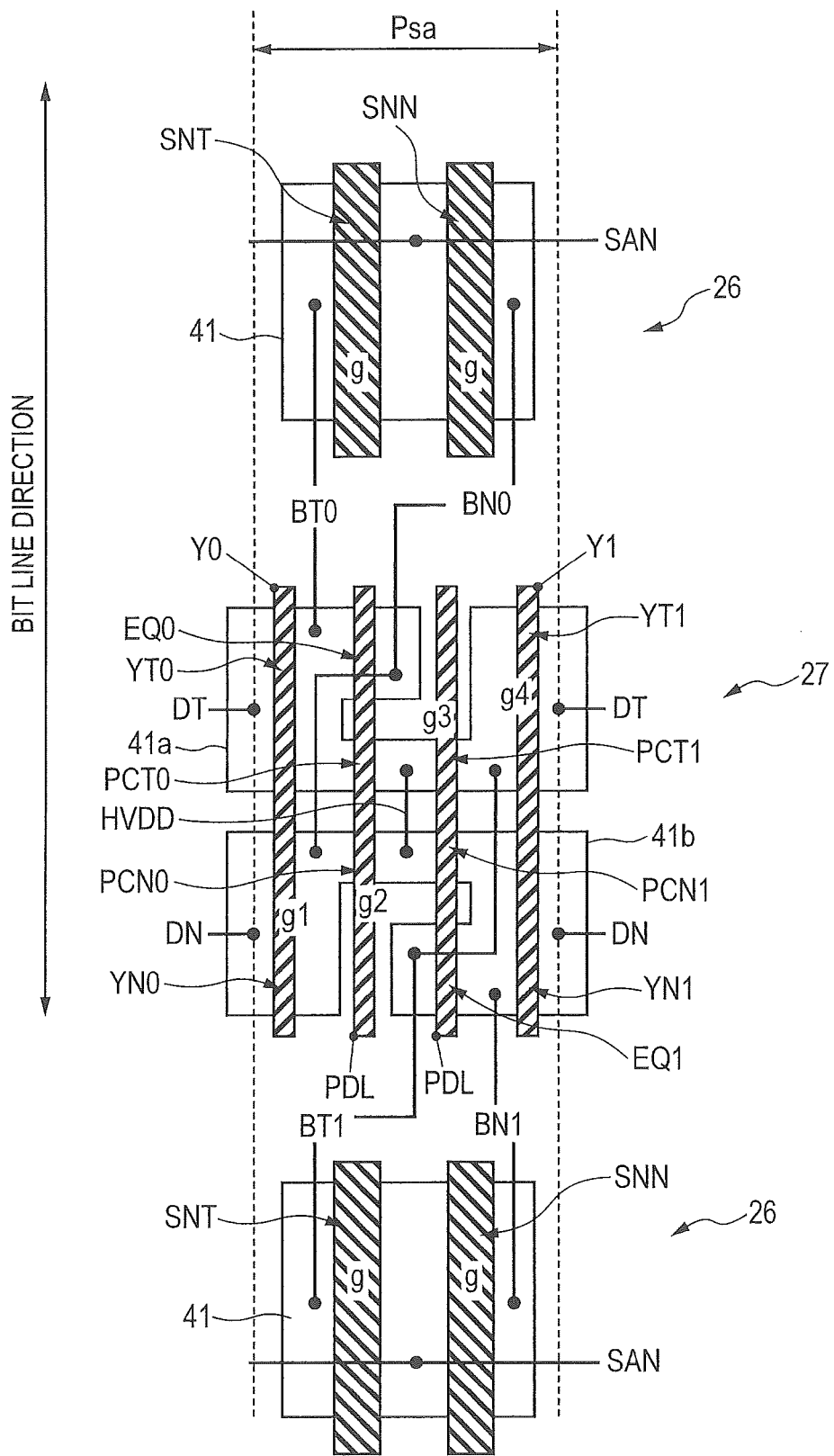
FIG. 35 is a layout view illustrating an example of arrangement of transistors in a YSW/PRE portion according to the embodiment 7.

A layout according to a modification of the Embodiment 7 is to be described with reference to FIG. 35. FIG. 35 is a view illustrating a layout of the modification. FIG. 35 illustrates a YSW/PRE portion 27 in which a precharge portion 22, and a Y switch portion 23 are integrated as illustrated in the Embodiments 4 to 6. In the same manner as in FIG. 33 and FIG. 34, the YSW/PRE portion 27 is laid out in a region of a width one-half of the SA pitch Psa. In FIG. 35, one SA pitch Psa is illustrated.

A NMOS pair 26 is disposed above and below the YSW/PRE portion 27 respectively. That is, the YSW/PRE portion 27 is disposed between two NMOS pairs 26 spaced apart vertically. An upper NMOS pair 26 is a pair amplifier transistor of a bit line pair BT0 and BN0 and a lower NMOS pair 26 is paired amplifying transistors of a bit line pair BT1 and BN1. Since the configuration of the NMOS pair 26 is identical with that in FIG. 9, description therefor is to be omitted.

The YSW/PRE portion 27 includes diffusion layers 41a and 41b disposed in upper and lower two stages. The diffusion layer 41a has a layout rotationally symmetric with respect to the diffusion layer 41b. Further, also the transistor layout is rotational symmetric. Each of the diffusion layers 41a and 41b is formed wider than the SA pitch Psa. Accordingly, the diffusion layers 41a and 41b protrude to adjacent SA pitches Psa.

The YSW/PRE portion 27 includes four gates g1 to g4. Each of the gates g1 to g4 is formed in parallel with the bit line direction. In other words, the gates g1 to g4 are longitudinal gates along the bit line direction. Each of the gates g1 to g4 has a linear shape having the longitudinal direction along the bit line direction. Accordingly, the bit line direction is in parallel with the gate width W. Further, the four gates g1 to g4 are disposed being spaced apart in the lateral direction.

The gate g1 is connected to a column selection signal line Y0. The gate g2 is connected to a precharge signal line PDL. The gate g3 is connected to the precharge signal line PDL. The gate g4 is connected to a column selection signal Y1. Each of the gates g1 to g4 is disposed so as to override the diffusion layer 41a and the diffusion layer 41b. That is, each of the gates g1 to g4 is disposed from the diffusion layer 41 to the diffusion layer 41b.

The gate g1 corresponds to switching transistors YT0 and YN0. The gate g4 corresponds to switching transistors YT1 and YN1. The gate g2 corresponds to precharging transistors PCN0 and PCT0, and an equalizing transistor EQ0. The gate g3 corresponds to precharging transistors PTN1 and PCT1 and an equalizing transistor EQ1.

The diffusion layer 41a corresponds to switching transistors YT0 and YT1, precharging transistors PCT0 and PCT1, and an equalizing transistor EQ0. That is, the switching transistors YT0 and YT1, the precharging transistors PCT0 and PCT1, and the equalizing transistor EQ0 share the integrated diffusion layer 41a. The diffusion layer 41b corresponds to switching transistors YN0 and YN1, precharging transistors PCN0 and PCN1, and an equalizing transistor EQ1. That is, the switching transistors YN0 and YN1, the precharging transistors PCN0 and PCN1, and the equalizing transistor EQ1 share the integrated diffusion layer 41b.

The diffusion layers 41a and 41b are connected on the left of the gate g1 to a common bus line DT. The diffusion layers 41a and 41b of the common bus line DT can be shared to the SA pitch Psa adjacent on the left. In the same manner, the diffusion layers 41a and 41b are connected to a common bus line DN on the right of the gate g4. Then, the diffusion layers 41a and 41b of the common bus line DN can be shared to the SA pitch Psa adjacent on the right side. Thus, the device isolation region can be decreased to attain an efficient layout.

The diffusion layers 41a and 41b are connected to a precharge voltage HVDD between the gate g2 and the gate g3. Then, in the diffusion layer 41a, the precharging transistor PCT0 and the precharging transistor PCN0 share the side of the precharge voltage HVDD. In the same manner, in the diffusion layer 41b, the precharging transistor PCT1 and the precharging transistor PCN1 share the side of the precharge voltage HVDD.

The diffusion layer 41a is connected to a bit line BT0 between the gate g1 and the gate g2. Then, the precharging transistor PCT0 and the equalizing transistor EQ0 are disposed in parallel in view of the gate g2. Three precharging transistors PCT0 and PCN0 and equalizing transistor EQ0 share one longitudinal gate g2. Thus, the three precharging transistors PCT0 and PCN0, and equalizing transistor EQ0 can share the precharge signal line. Increase in the number of contacts can be prevented and increase of the area can be suppressed.

In the same manner, the diffusion layer 41b is connected to a bit line BN1 between the gate g3 and the gate g4. Then, the precharging transistors PCN1 and the equalizing transistor EQ1 are disposed in parallel in view of the gate g3. Accordingly, three precharging transistors PCT1 and PCN1 and equalizing transistor EQ1 share one vertical gate g3. Thus, the three precharging transistors PCT1 and PCN1 and equalizing transistor EQ1 can share a precharge signal line. Increase of the area due to increase in the number of contacts can be suppressed.

The precharging transistor PCT1 and the precharging transistor PCT0 share the diffusion layer 41a on the side of the precharge voltage HVDD. The precharging transistor PCN1 and the precharging transistor PCN0 share the diffusion layer 41b on the side of the precharge voltage HVDD. The equalizing transistor EQ0 and the precharging transistor PCT0 share the diffusion layer 41b on the side of the bit line BT0. The equalizing transistor EQ1 and the precharging transistor PCN1 share the diffusion layer 41b on the side of the bit line BN1. The equalizing transistor EQ0 and the switching transistor YT0 share the diffusion layer 41a on the side of the bit line BT0. The equalizing transistor EQ1 and the switching transistor YN1 share the diffusion layer 41b on the side of the bit line BN1.

Accordingly, increase of the area due to increase of the number of contacts can be suppressed. Four linear gates g1 to g4 are disposed in the SA pitch Psa. Then, two SAs can be realized by arrangement of four gates g1 to g4 for the transistors. Gates g1 and g2 correspond to Y0 and gates g3 and g4 correspond to Y1. Accordingly, one YSW/PRE portion 27 can be realized by the size one-half of the SA pitch Psa. Since the number of contacts can be decreased, the transistors can be disposed being closed to the isolation region of diffusion layer. Thus, the area can be reduced without narrowing the gate width W.

The gate arrangement direction is made uniform by using only the linear shape gate g. Accordingly, this can provide a layout that is easily stabilized against scattering in view of device manufacture and a high yield can be expected. In the configuration, the YSW/PRE portion 27 is disposed repeatedly at a pitch one-half the SA pitch Psa. Thus, the layout can be obtained efficiently.

In the same manner as in the layout of FIG. 33 and FIG. 34, a precharge signal can be shared between the devices arranged vertically. Accordingly, the device isolation distance can be minimized. Thus, the area can be decreased.

In the Embodiment 7, transistors by the number of one-half or more of the total number of transistors included in the precharge portion 22 and the Y switch portion 23 (five transistors in this embodiment including the precharging transistors PCT and PCN, the equalizing transistor EQ, and the switching transistors YT and YN) have gates having the longitudinal direction along the bit line direction. Then, in the direction perpendicular to the bit line direction, the SA pitch Psa of the sense amplifier is defined by the width of the PMOS pair 25 and the NMOS pair 26. The sense amplifiers are disposed repeatedly at the SA pitch Psa in the vertical direction. At least one of the precharge portion 22 and the Y switch portion 23 is disposed repeatedly at a pitch narrower than the SA pitch Psa. For example, the precharge portion 22 and the Y switch portion 23 are disposed repeatedly at a pitch one-half the SA pitch Psa.

Further, in the layouts of FIG. 32 to FIG. 35, the longitudinal direction of the gate g is along the bit line direction. Then, channels of two transistors are disposed continuously in the longitudinal direction of the gate g. That is, the gate width direction of the two switching transistors sharing the gate g is along the longitudinal direction of the gate g. For example, a gate g corresponds to the switching transistors YT0 and YT1 and the channel width direction of the switching transistors YT0 and YT1 is along the longitudinal direction of the gate g. As described above, channels of two or more switching transistors are continuous in the longitudinal direction of the gate of the switching transistor. For example, the gate g extending in the bit line direction corresponds to the switching transistor YT0 and the switching transistor YT1. That is, the switching transistor YT0 and the switching transistor YT1 share the gate g. This can provide an efficient layout.

In Embodiments 1 to 7, when the SA pitch Psa is defined as an integer multiple of the pitch Pcell of the memory cell, at least one of the precharge portion 22 and the Y switch portion 23 is disposed repeatedly at a pitch different from the SA pitch Psa in the vertical direction perpendicular to the bit line direction. Further, since the pitch of the precharge portion 22 and the Y switch portion 23 is different from the SA pitch Psa, the number of repetition of the sense amplifier 12 is different from the number of repetition of the Y switch portion 23 and the precharge portion 22 in the lateral direction. In the embodiment, the number of repetition of the sense amplifiers 12 is one-half the number of repetition of the Y switch portion 23 and the number of repetition of the precharge portion 22. Further, a YSW/PRE portion 27 in which the Y switch portion 23 and the precharge portion 22 are integrated can also be used.

In the Embodiments 1 to 7, connecting interconnects for connecting to the gate g or the diffusion layer 41 can be formed without intersection. Accordingly, the connecting interconnect can be formed only in one interconnection layer.

That is, the number of change of the interconnect layer can be decreased in the connecting interconnect formed on the interconnect layer different from that of the gate g.

In the Embodiments 1 to 3, the precharge portion 22 and the Y switch portion 23 are disposed in isolated diffusion layers 41. Further, in this embodiment, the layout may be adopted only to the precharge portion 22 or the layout may be adopted only to the Y switch portion 23. Apparently, the layout may be adopted to both of the precharge portion 22 and the Y switch portion 23.

In the Embodiments 4 to 7, the diffusion layers 41 are integrated for the precharge portion 22 and the Y switch portion 23, and the precharge portion 22 and the Y switch portion 23 are formed as the YSW/PRE portion 27. When the gate voltage of the column selection signal line Y is at a power source voltage, the gate voltage of the precharging transistors PCT and PCN and the equalizing transistor EQ may be increased to the power source voltage or higher. Layouts of the Embodiments 1 to 7 may be optionally combined and used. Also the modifications of the respective embodiments may be optionally combined and used with the layouts of other embodiments and modifications thereof. Further, for the contents of the Embodiments 1 to 7 that have been described with reference to other embodiments, description has been omitted optionally, but it will be apparent that similar effects can be provided for the layouts identical with those of other embodiments.

The embodiments described above can be partially or entirely described as per the following appendices, with no particular restriction to them.

APPENDIX 1

A semiconductor memory including:
a memory cell array having a plurality of memory cells,
a plurality of bit line pairs which are disposed corresponding to respective columns of the memory cell array, and
sense amplifiers which are disposed in plurality corresponding to the plurality of bit line pairs for amplifying a potential difference between the bit line pair in which
the sense amplifier includes;
precharging transistors each having a diffusion layer and precharging the bit line pair, and
switching transistors each having a diffusion layer formed integrally with the diffusion layer of the precharging transistor for selectively connecting the plurality of the bit line pairs to a common bus line.

APPENDIX 2

A semiconductor memory according to appendix 1 wherein the gate of the switching transistor has a longitudinal direction along a vertical direction perpendicular to the bit line direction.

APPENDIX 3

The semiconductor memory according to the appendix 2, further having an amplifier portion comprising at least two transistors connected to the bit line pair for amplifying the potential difference between the bit line pair in which
the sense amplifier pitch of the sense amplifier is defined by the width of the amplifier portion in the vertical direction,
the sense amplifier is disposed repeatedly at the sense amplifier pitch in the vertical direction and
the gate of the switching transistor extends to an adjacent sense amplifier pitch.

APPENDIX 4

The semiconductor memory according to appendix 3, wherein
the longitudinal direction of the gate of the precharging transistor is along a vertical direction and
the gate of the precharging transistor extends to the adjacent sense amplifier pitch.

APPENDIX 5

The semiconductor memory according to appendix 2, wherein
the precharging transistor includes an equalizing transistor for equalizing the bit line pair and
a diffusion layer connected with a bit line in the equalizing transistor and a diffusion layer connected with a bit line in the switching transistor are shared.

APPENDIX 6

The semiconductor memory according to appendix 2, wherein
the precharging transistor include an equalizing transistor for equalizing the bit line pair and a fixed transistor fixed to a precharge potential, and
a diffusion layer connected with the bit line in the equalizing transistor and a diffusion layer connected with a bit line in the fixed transistor are shared.

APPENDIX 7

The semiconductor memory according to appendix 3, wherein
the diffusion layer extends to the adjacent sense amplifier pitch.

APPENDIX 8

The semiconductor memory according to appendix 7, wherein
the diffusion layers are formed integrally in the two sense amplifiers adjacent in the vertical direction.

APPENDIX 9

The semiconductor memory according to appendix 8, wherein
the common bus line is connected to the diffusion layer being shared by the two sense amplifiers adjacent in the vertical direction.

APPENDIX 10

The semiconductor memory according to appendix 2, wherein
a plurality of the sense amplifiers share the common bus line,
a column is selected by selectively turning on the switching transistors of the plurality of the sense amplifiers and connecting one of the plurality of bit line pairs to the common bus line,
column addresses of columns situated on both sides of a column at the boundary of adjacent I/O are identical, and the gate of switching transistor is formed overriding the boundary of the adjacent I/O.

APPENDIX 11

The semiconductor memory according to appendix 1, wherein
the longitudinal direction of the gate of the switching transistor is along a bit line direction.

APPENDIX 12

The semiconductor memory according to appendix 11, wherein
the precharging transistor includes an equalizing transistor for equalizing the bit line pair and
the diffusion layer is shared for the bit line side of the equalizing transistor and the bit line side of the switching transistor.

APPENDIX 13

The semiconductor memory according to appendix 11, wherein
the precharging transistor includes an equalizing transistor for equalizing the bit line pair and a fixed transistor for fixing to a precharge potential, and
the diffusion layer is shared for the bit line side of the equalizing transistor and the bit line side of the fixed transistor.

APPENDIX 14

The semiconductor memory according to appendix 1, wherein
the gate voltage of the precharging transistor is at or higher than the gate voltage of the switching transistor.

APPENDIX 15

A semiconductor memory including:
a memory cell array having a plurality of memory cells,
a plurality of bit line pairs which are disposed corresponding to respective columns of the memory cell array, and
a plurality of sense amplifiers which are disposed corresponding to the plurality of bit line pairs respectively, and each comprising an amplifier portion for amplifying a potential difference between the bit line pair, a switch portion for switching the connection of the bit line pair and a data bus line, and a precharge portion for precharging the bit line pair, in which
the plurality of sense amplifiers are arranged in a vertical direction perpendicular to the extending direction of the bit line, and
the number of repetition of a layout pattern of the amplifier portion of the plurality of the sense amplifiers arranged in the vertical direction is different from the number of repetitions of the layout pattern of the switch portion or the precharge portion of the plurality of sense amplifiers arranged in the vertical direction.

APPENDIX 16

The semiconductor memory according to appendix 15, wherein
the longitudinal direction of the gate of the switching transistor constituting the switch portion is along the vertical direction and extends to an adjacent sense amplifier pitch to the sense amplifier pitch defined by the width of the amplifier portion.

APPENDIX 17

The semiconductor memory according to appendix 16, wherein
the longitudinal direction of the gate of the precharging transistor constituting the precharge portion is along the vertical direction and
the gate of the precharging transistor extends to the adjacent sense amplifier pitch.

APPENDIX 18

The semiconductor memory according to appendix 15, wherein
the precharging transistor constituting the precharge portion and the switching transistor constituting the switch portion share the diffusion layer in common.

APPENDIX 19

A semiconductor memory including:
a memory cell array having a plurality of memory cells,
a plurality of bit line pairs which are disposed corresponding to respective columns of the memory cell array,
amplifying transistors which are disposed in plurality corresponding to the plurality of bit line pair for amplifying a potential difference between the bit line pair, and
switching transistors selectively connecting the plurality of bit line pairs to a common bus line in which
the channel width direction of two or more of the switching transistors sharing the gate is along the longitudinal direction of the gate.

APPENDIX 20

The semiconductor memory according to appendix 19, wherein
the longitudinal direction of the gate is along a vertical direction perpendicular to the bit line direction and
the switching transistor and the switching transistor of adjacent I/O share the gate at the boundary of adjacent I/O.

APPENDIX 21

The semiconductor memory according to any one of appendices 16 to 18, wherein
at least one of the precharge portion and the switch portion is disposed repeatedly at a pitch wider than the sense amplifier pitch defined by the width of the amplifier portion.

APPENDIX 22

A semiconductor memory including:
a memory cell array having a plurality of memory cells,
a plurality of bit line pairs which are disposed corresponding to respective columns of the memory cell array, and
sense amplifiers which are disposed in plurality corresponding to the plurality of bit line pairs for amplifying a potential difference between the bit line pair in which
the sense amplifier includes:
an amplifier portion having paired amplifying transistors connected to the bit line pair, a precharge portion having one or more precharging transistors for precharging the bit line pair and a switch portion having one or more switching transistors for selectively connecting a plurality of the bit line pairs to a common bus line, in which each of transistors by the number of one-half or more of the total number of the transistors contained in the precharge portion and the switch portion has a gate having a longitudinal direction along with the bit line direction, the sense amplifier pitch of the sense amplifier is defined by the width of the paired amplifying transistors in the vertical direction perpendicular to the bit line direction, the amplifier portion is disposed repeatedly at a sense amplifier pitch in the vertical direction, and at least one of the precharge portion and the switch portion is disposed repeatedly at a pitch different from the sense amplifier pitch.

APPENDIX 23

A semiconductor memory according to appendix 22, wherein at least one of the precharge portion and the switch portion is disposed repeatedly at a pitch narrower than the sense amplifier pitch.

APPENDIX 24

A semiconductor memory including:

a memory cell array having a plurality of memory cells, a plurality of bit line pairs which are disposed corresponding to respective columns of the memory cell array, and sense amplifiers which are disposed in plurality corresponding to the plurality of bit line pairs for amplifying a potential difference between the bit line pair, in which the sense amplifier includes;

an amplifier portion having paired amplifying transistors connected to the bit line pair, a precharge portion having one or more precharging transistors for precharging the bit line pair, and a switch portion having one or more switching transistors for selectively connecting the plurality of the bit line pairs to a common bus line, in which the sense amplifier pitch of the sense amplifier which is an integer multiple of the memory cell pitch in the vertical direction perpendicular to the bit line direction is defined by the width of the paired amplifying transistor, the amplifier portion is disposed repeatedly at the sense amplifier pitch in the vertical direction, and at least one of the precharge portion and the switch portion is disposed repeatedly at a pitch different from the sense amplifier pitch in the vertical direction.

APPENDIX 25

A semiconductor memory including:

a memory cell array having a plurality of memory cells, a plurality of bit line pairs which are disposed corresponding to respective columns of the memory cell array and sense amplifiers which are disposed in plurality corresponding to the plurality of bit line pairs for amplifying a potential difference between the bit line pair in which the sense amplifier includes:

an amplifier portion having paired amplifying transistors connected to the bit line pair, a precharge portion having one or more precharging transistors for precharging the bit line pair and a switch portion having one or more switching transistors for connecting a plurality of the bit line pairs selectively to a common bus line, in which the sense amplifier pitch of the sense amplifier is defined in the vertical direction perpendicular to the bit line direction by the width of the paired amplifying transistors, the amplifier portion is disposed repeatedly at the sense amplifier pitch in the vertical direction, the precharge portion and switch portion are disposed repeatedly in the vertical direction, and the number of repetition of at least one of precharge portion and the switch portion is different from the number of repetition of the amplifier portion.

APPENDIX 26

The semiconductor memory according to any one of appendices 19 to 23, wherein the precharging transistor and the switching transistor share a diffusion layer in common.

APPENDIX 27

The semiconductor memory according to any one of appendices 18 to 23, wherein the diffusion layer extends to an adjacent sense amplifier pitch.

APPENDIX 28

The semiconductor memory according to appendix 27, wherein the diffusion layer is formed integrally in two sense amplifiers adjacent in the vertical direction perpendicular to the bit line direction.

APPENDIX 29

The semiconductor memory according to appendix 28, wherein a common bus line is connected to the diffusion layer being common with shared in the two sense amplifiers adjacent in the vertical direction.

APPENDIX 30

The semiconductor memory according to any one of appendices 19 to 29, wherein the gate of the switching transistor has a longitudinal direction along the vertical direction perpendicular to the bit line direction, and the gate of the switching transistor extends to the adjacent sense amplifier pitch.

APPENDIX 31

The semiconductor memory according to any one of appendices 19 to 30, wherein the gate of the precharging transistor has a longitudinal direction along the vertical direction perpendicular to the bit line direction and the gate of the precharging transistor extends to an adjacent sense amplifier pitch.

APPENDIX 32

The semiconductor memory according to any one of appendices 15 to 31, wherein the precharging transistor includes an equalizing transistor for equalizing the bit line pair and the bit line side of the equalizing transistor and the bit line side of the switching transistor share a diffusion layer in common.

APPENDIX 33

The semiconductor memory according to any one of appendices 15 to 32, wherein the recharging transistor includes an equalizing transistor for equalizing the bit line pair and a fixed transistor fixed to a precharge potential, and the bit line side of the equalizing transistor and the bit line side of the fixed transistor share a diffusion layer.

APPENDIX 34

The semiconductor memory according to any one of appendices 15 to 33, wherein the precharge portion is disposed repeatedly at a pitch about twice or about one-half the sense amplifier pitch.

APPENDIX 35

The semiconductor memory according to any one of appendices 15 to 34, wherein the switch portion is disposed repeatedly at a pitch about twice or about one-half the sense amplifier pitch.

APPENDIX 36

The semiconductor memory according to any one of appendices 1 to 35, wherein a plurality of sense amplifiers share a common bus line, a column is selected by selectively turning on the switching transistor of a plurality of sense amplifiers and connecting one of a plurality of bit line pairs to the common bus line, column addresses of columns situated on both sides of a column at a boundary of the adjacent I/O are identical, and the gate of the switching transistor is formed overriding the boundary of the adjacent I/O.

APPENDIX 37

The semiconductor memory according to any one of appendices 1 to 36, wherein the gate voltage of the precharging transistor at or higher than a gate voltage of the switching transistor.

While the invention made by the present inventors has been described specifically with reference to preferred embodiments, it will be apparent that the present invention is not restricted to the embodiments described above and various modifications are possible within a range not departing the gist thereof.

What is claimed is:

1. A semiconductor memory comprising:
a memory cell array having a plurality of memory cells;
a plurality of bit line pairs which are disposed corresponding to respective columns of the memory cell array; and
sense amplifiers which are disposed in plurality corresponding to the plurality of bit line pairs for amplifying a potential difference between the bit line pair,
wherein the sense amplifier includes:
precharging transistors each having a diffusion layer and precharging the bit line pair; and
switching transistors each having a diffusion layer formed integrally with the diffusion layer of the precharging transistor for selectively connecting the plurality of the bit line pairs to a common bus line.

2. A semiconductor memory according to claim 1, wherein the gate of the switching transistor has a longitudinal direction along a vertical direction perpendicular to the bit line direction.

3. The semiconductor memory according to the claim 2, further comprising:
an amplifier portion including at least two transistors connected to the bit line pair for amplifying the potential difference between the bit line pair,
wherein the sense amplifier pitch of the sense amplifier is defined by the width of the amplifier portion in the vertical direction,
wherein the sense amplifier is disposed repeatedly at the sense amplifier pitch in the vertical direction, and
wherein the gate of the switching transistor extends to an adjacent sense amplifier pitch.

4. The semiconductor memory according to claim 3,
wherein the longitudinal direction of the gate of the precharging transistor is along a vertical direction, and
wherein the gate of the precharging transistor extends to the adjacent sense amplifier pitch.

5. The semiconductor memory according to claim 3, wherein
the diffusion layer extends to the adjacent sense amplifier pitch.

6. The semiconductor memory according to claim 5, wherein
the diffusion layers are formed integrally in the two sense amplifiers adjacent in the vertical direction.

7. The semiconductor memory according to claim 6, wherein
the common bus line is connected to the diffusion layer being shared by the two sense amplifiers adjacent in the vertical direction.

8. The semiconductor memory according to claim 2,
wherein the precharging transistor includes an equalizing transistor for equalizing the bit line pair, and
wherein a diffusion layer connected with a bit line in the equalizing transistor and a diffusion layer connected with a bit line in the switching transistor are shared.

9. The semiconductor memory according to claim 2,
wherein the precharging transistor includes an equalizing transistor for equalizing the bit line pair and a fixed transistor fixed to a precharge potential, and
wherein a diffusion layer connected with the bit line in the equalizing transistor and a diffusion layer connected with a bit line in the fixed transistor are shared.

10. The semiconductor memory according to claim 2,
wherein a plurality of the sense amplifiers share the common bus line in common,
wherein a column is selected by selectively turning on the switching transistors of a plurality of the sense amplifiers and connecting one of the plurality of bit line pairs to the common bus line,
wherein column addresses of columns situated on both sides of a column at the boundary of adjacent I/O are identical, and
wherein the gate of switching transistor is formed overriding the boundary of the adjacent I/O.

11. The semiconductor memory according to claim 1, wherein
the longitudinal direction of the gate of the switching transistor is along a bit line direction.

12. The semiconductor memory according to claim 11,
wherein the precharging transistor includes an equalizing transistor for equalizing the bit line pair, and
wherein the diffusion layer is shared for the bit line side of the equalizing transistor and the bit line side of the switching transistor.

13. The semiconductor memory according to claim 11,
wherein the precharging transistor includes an equalizing transistor for equalizing the bit line pair and a fixed transistor fixed to a precharge potential, and
wherein the diffusion layer is shared for the bit line side of the equalizing transistor and the bit line side of the fixed transistor.

14. The semiconductor memory according to claim 1, wherein
the gate voltage of the precharging transistor is at or higher than the gate voltage of the switching transistor.

15. A semiconductor memory comprising:
a memory cell array having a plurality of memory cells;
a plurality of bit line pairs which are disposed corresponding to respective columns of the memory cell array;
amplifying transistors which are disposed in plurality corresponding to the plurality of bit line pair for amplifying a potential difference between the bit line pair; and
switching transistors selectively connecting the plurality of bit line pairs to a common bus line,
wherein a channel width direction of two or more of the switching transistors sharing the gate is along a longitudinal direction of the gate.

16. The semiconductor memory according to claim 15,
wherein the longitudinal direction of the gate is along a vertical direction perpendicular to the bit line direction, and
wherein the switching transistor and the switching transistor of adjacent I/O share the gate at the boundary of adjacent I/O.

* * * * *